(12) United States Patent
Olodort et al.

(10) Patent No.: US 6,563,434 B1
(45) Date of Patent: May 13, 2003

(54) SYSTEM AND METHOD FOR DETECTING KEY ACTUATION IN A KEYBOARD

(75) Inventors: Robert Olodort, Santa Monica, CA (US); John Tang, San Carlos, CA (US); Randy Turchik, Fremont, CA (US)

(73) Assignee: Think Outside, Inc., Carlsbad, CA (US)

( * ) Notice: Subject to any disclaimer, the term of this patent is extended or adjusted under 35 U.S.C. 154(b) by 0 days.

(21) Appl. No.: 09/191,067

(22) Filed: Nov. 12, 1998

Related U.S. Application Data

(60) Provisional application No. 60/065,181, filed on Nov. 12, 1997.

(51) Int. Cl.[7] .............................................. H03K 17/94
(52) U.S. Cl. ........................ 341/22; 345/168; 400/472
(58) Field of Search .............................. 341/22, 23, 26; 345/168; 400/472

(56) References Cited

U.S. PATENT DOCUMENTS

| | | | |
|---|---|---|---|
| 3,499,515 A | 3/1970 | Mikrut | 197/98 |
| 3,574,335 A | 4/1971 | Ricke | 235/145 |
| 3,576,569 A | 4/1971 | Watson | 340/166 |
| 3,693,123 A | 9/1972 | Pedersen | 335/206 |
| 3,703,040 A | 11/1972 | Hill | 35/5 |
| 3,893,559 A | 7/1975 | Hishida et al. | 197/17 |
| 3,940,758 A | 2/1976 | Margolin | 340/337 |
| 4,066,850 A | 1/1978 | Heys, Jr. | 200/5 |
| 4,092,527 A | 5/1978 | Luecke | 364/709 |
| 4,336,530 A | 6/1982 | Koike et al. | 340/365 |
| 4,366,463 A | 12/1982 | Barker | 338/69 |
| 4,368,364 A | 1/1983 | Harbers, Jr. | 200/6 |
| 4,517,660 A | 5/1985 | Fushimoto et al. | 364/708 |
| 4,560,844 A | 12/1985 | Takamura et al. | 200/5 |
| 4,633,227 A | 12/1986 | Menn | 340/365 |
| 4,638,151 A | 1/1987 | Suwa | 235/145 |
| 4,661,005 A | 4/1987 | Lahr | 400/489 |
| RE32,419 E | 5/1987 | Rooney | 200/5 |
| 4,735,520 A | 4/1988 | Suzuki et al. | 400/488 |
| 4,818,828 A | 4/1989 | Curley et al. | 200/5 |

(List continued on next page.)

OTHER PUBLICATIONS

WO 99/31800, Jun. 24, 1999, PCT, Published Patent Application.
GB 2323331A, Sep. 23, 1998, Great Britain, Published Patent Application.
IBM Technical Disclosure Bulletin, "Compact Computer Keyboard", vol. 27, No. 10A, Mar. 1985, 3 pages. #5640–5642.
IBM Technical Disclosure Bulleting, "Briefcase–Portable Textwriter with 100–Key Full–Size Keyboard," vol. 27, No. 4A, Sep. 1984, 3 pages. #2002–2004.
IBM Technical Disclosure Bulletin, "Keyboard," vol. 27, No. 4B, Sep. 1984, 1 page.

*Primary Examiner*—Timothy Edwards, Jr.
(74) *Attorney, Agent, or Firm*—Blakely, Sokoloff, Taylor & Zafman LLP

(57) ABSTRACT

A system and method for detecting key actuation in a keyboard assembly, which in one embodiment, is used as a conductor to electrically communicate with an information appliance. The rows in the keyboard assembly are electrically isolated from one another, and each row contains keys bridging a two-wire bus. Each key has a switch that is closed during key actuation, a diode to polarize the key, and a resistor to provide a resistive load when the switch is closed and the diode is biased with the current flow. Alternatively, each key has a switch that is closed during key actuation, a timer with an output that goes high after a predetermined time period, and a resistor that provides an identifying load when the switch is closed and the output of the timer is high. Other features of the invention include a linear matrix coupled to a row of keys to allow the row to be scanned by sections and individual keys, and a flexible circuit that provides the electrical pathways for the linear matrix.

30 Claims, 44 Drawing Sheets

U.S. PATENT DOCUMENTS

| | | | | |
|---|---|---|---|---|
| 4,839,474 A | * | 6/1989 | Hayes-Pankhurst et al. | 200/513 |
| 4,885,891 A | | 12/1989 | Lynch | 52/646 |
| 4,914,999 A | | 4/1990 | Masubuchi et al. | 84/423 |
| 4,939,514 A | | 7/1990 | Miyazaki | 341/22 |
| 4,942,700 A | | 7/1990 | Hoberman | 52/81 |
| 4,996,522 A | | 2/1991 | Sunano | 340/700 |
| 5,024,031 A | | 6/1991 | Hoberman | 52/81 |
| 5,044,798 A | | 9/1991 | Roylance et al. | 400/472 |
| 5,057,836 A | * | 10/1991 | Inaba | 341/22 |
| 5,122,786 A | | 6/1992 | Rader | 340/711 |
| 5,137,384 A | | 8/1992 | Spencer et al. | 400/489 |
| 5,141,343 A | | 8/1992 | Roylance et al. | 400/472 |
| 5,163,765 A | | 11/1992 | Levy | 400/492 |
| 5,164,723 A | | 11/1992 | Nebenzahl | 341/22 |
| 5,167,100 A | | 12/1992 | Krishnapillai | 52/109 |
| 5,187,644 A | | 2/1993 | Crisan | 361/393 |
| 5,198,991 A | | 3/1993 | Pollitt | 364/708 |
| 5,210,846 A | | 5/1993 | Lee | 395/425 |
| 5,212,473 A | | 5/1993 | Louis | 340/711 |
| 5,227,615 A | | 7/1993 | Oogita | 235/440 |
| 5,252,971 A | | 10/1993 | Franz et al. | 341/26 |
| 5,267,127 A | | 11/1993 | Pollitt | 361/680 |
| 5,287,245 A | | 2/1994 | Lucente et al. | 361/680 |
| 5,329,079 A | | 7/1994 | English et al. | 200/5 |
| 5,341,154 A | | 8/1994 | Bird | 345/167 |
| 5,383,138 A | | 1/1995 | Motoyama et al. | 364/708.1 |
| 5,394,959 A | | 3/1995 | Cullity et al. | 187/244 |
| 5,398,326 A | | 3/1995 | Lee | 395/425 |
| 5,398,585 A | | 3/1995 | Starr | 84/646 |
| 5,422,447 A | | 6/1995 | Spence | 200/5 |
| 5,424,728 A | | 6/1995 | Goldstein | 341/22 |
| 5,454,652 A | | 10/1995 | Huellemeier et al. | 400/489 |
| 5,457,453 A | | 10/1995 | Chiu et al. | 341/22 |
| 5,476,332 A | | 12/1995 | Cleveland, Jr. | 480/486 |
| 5,481,074 A | | 1/1996 | English | 200/5 |
| 5,502,460 A | | 3/1996 | Bowen | 345/168 |
| 5,519,569 A | | 5/1996 | Sellers | 361/680 |
| 5,532,904 A | | 7/1996 | Sellers | 361/680 |
| 5,543,787 A | | 8/1996 | Karidis et al. | 341/20 |
| 5,543,790 A | | 8/1996 | Goldstein | 341/22 |
| 5,557,057 A | | 9/1996 | Starr | 84/617 |
| 5,574,481 A | | 11/1996 | Lee | 345/168 |
| 5,575,576 A | | 11/1996 | Roysden, Jr. | 400/472 |
| 5,587,875 A | | 12/1996 | Sellers | 361/680 |
| 5,588,759 A | | 12/1996 | Cloud | 400/472 |
| 5,590,020 A | | 12/1996 | Sellers | 361/680 |
| 5,591,927 A | | 1/1997 | Kawamura et al. | 84/171 |
| 5,596,480 A | | 1/1997 | Manser et al. | 361/680 |
| 5,602,715 A | | 2/1997 | Lempicki et al. | 361/680 |
| 5,612,691 A | | 3/1997 | Murmann et al. | 341/22 |
| 5,635,928 A | | 6/1997 | Takagi et al. | 341/22 |
| 5,644,338 A | | 7/1997 | Bowen | 345/168 |
| 5,646,817 A | | 7/1997 | Manser et al. | 361/680 |
| 5,648,771 A | | 7/1997 | Halgren et al. | 341/22 |
| 5,653,543 A | | 8/1997 | Abe | 400/489 |
| 5,654,872 A | | 8/1997 | Sellers | 361/680 |
| 5,659,307 A | | 8/1997 | Karidis et al. | 341/22 |
| 5,677,826 A | | 10/1997 | Sellers | 361/680 |
| 5,687,058 A | | 11/1997 | Roylance | 361/680 |
| 5,703,578 A | | 12/1997 | Allison | 341/22 |
| 5,706,167 A | | 1/1998 | Lee | 361/680 |
| 5,712,760 A | | 1/1998 | Coulon et al. | 361/680 |
| 5,733,056 A | | 3/1998 | Meagher | 400/472 |
| 5,748,114 A | * | 5/1998 | Koehn | 341/22 |
| 5,774,384 A | | 6/1998 | Okaya et al. | 364/708.1 |
| 5,788,386 A | | 8/1998 | Hayashi et al. | 400/489 |
| 5,800,085 A | | 9/1998 | Lee | 400/489 |
| 5,841,635 A | | 11/1998 | Sadler et al. | 361/749 |
| 6,331,850 B1 | * | 12/2001 | Olodort et al. | 341/22 |

* cited by examiner

SYSTEM AND METHOD FOR DETECTING KEY ACTUATION IN A KEYBOARD

This application claims the benefit of U.S. provisional application Ser. No. 60/065,181, fled Nov. 12, 1997.

BACKGROUND OF THE INVENTION

1. Field of the Invention

The invention relates generally to systems and methods for detecting key actuation in keyboard assemblies for information devices, and more particularly to systems and methods for detecting key actuation in keyboards for such devices.

2. Background Information

Small portable computers or "palmtops" can be conveniently carried in a purse or coat pocket. Recent advances in shrinking the size of electronic components will soon allow these devices to perform all the functions of today's desktop computers. Additionally, a whole new category of "information appliances" has begun. These include portable wireless telephone/computers which can be used to access the Internet to send and receive e-mail and to interact on the World Wide Web.

Powerful and versatile as these devices are becoming, their use is greatly limited by non-existent or inadequate keyboards. Palmtops which rely on handwriting recognition have proven to be awkward, slow and error prone. Miniature keyboards commensurate with the size of small appliances are likewise frustrating, especially if the user needs to write something consisting of a few sentences or more. Voice recognition suffers from frequent errors and creates a lack of privacy when other people are near the speaker whose voice is being recognized. Further, voice recognition may not be used in all circumstances (e.g. the process of taking notes of a lecturer's lecture in an otherwise quiet auditorium may not be possible with voice recognition input systems but it is usually possible with a keyboard).

Keyboards for desktop and high quality laptop computers allow the user to comfortably, privately, quietly, and quickly "touch-type." They have a number of desirable features in common. Most keyboards have a standard "QWERTY" layout which requires no learning on the part of the user (once the user has become familiar with this layout). The keys, which usually number 84 for a laptop computer, have full-sized tops whose center-to-center spacing is about 19 mm for both the horizontal and vertical axes. The length of the keyboard (the distance from the left edge of the left-most key to the right edge of the right-most key) is about 11 inches. Any reduction in this spacing has proven to slow down and frustrate the touch-typist. Additionally, the keys of these keyboards have sufficient "travel," the distance the key moves when it is pressed, and tactile feedback, an over-center buckling action, that signals the user that the key has been pressed sufficiently.

Efforts have been made to provide keyboards that contain these features, yet collapse to a reduced size. Some designs only slightly reduce the size of "notebook" computers when folded. These are much larger than palmtop computers. IBM's "ThinkPad 701C" notebook computer folds in a single operation to reduce the keyboard case length (measured from the edges of its case) from 11.5 inches to 9.7 inches. Also see U.S. Pat. No. 5,543,787 which describes a foldable keyboard. U.S. Pat. No. 5,519,569 describes a keyboard which folds in multiple steps from a length of 10–11 inches to 6.125 inches. U.S. Pat. No. 5,654,872 describes a keyboard with keys that collapse when the lid is closed to allow a thinner notebook computer.

Other designs of keyboards include those where the keyboard is hinged at the center of its length and folds about a vertical axis. U.S. Pat. No. 5,457,453 describes a keyboard that folds to greater than half its length. U.S. Pat. No. 5,574,481 describes a keyboard that folds in half and appears to have a non-standard layout of keys (the keys on the center fold axis have edges which lie in a straight line). U.S. Pat. No. 5,653,543 describes a keyboard that folds in half. U.S. Pat. No. 5,502,460 describes a keyboard with two vertical hinges that folds to greater than half its unfolded length.

U.S. Pat. Nos. 5,044,798 and 5,141,343 describe keyboards whose keys have user-selectable variable spacing. These designs have non-standard layouts (e.g., the "Enter" key is rotated ninety degrees) and no self-containing housing. Their frame is made of telescoping sections that create a good deal of friction and could easily bind.

Keyboards electrically communicate information to information appliances. Most keyboards have printed circuit boards or membranes located underneath their keys. When a key is pressed it shorts the circuits in a particular column or row. The matrix of columns and rows that make up a keyboard is continually scanned by a controller to determine which keys have been pressed. Such an arrangement is described, for example, in U.S. Pat. No. 5,070,330. The electronic configuration of most keyboards thus necessitates a matrix of conductors that limits the collapsing of the keyboard to a certain size.

SUMMARY OF THE INVENTION

The present invention provides, in one example of the invention, a system and method for detecting key actuation in a keyboard assembly. In one embodiment, the keyboard assembly is a collapsible keyboard which includes a support element and a plurality of keys. The support element can be extended to provide a structure having a first footprint and contracted to a structure having a second footprint, where the second footprint takes less surface area than the first footprint. The plurality of keys are coupled to the support element. Each of these keys includes a key top, which is designed to be pressed by a user, and a key base which is coupled to the key top. The key top and the key base rotate, in one example of the invention, on a pivot point which couples the key base to the support element when the support element is extended and contracted.

In one exemplary embodiment, the invention provides detection of key actuation for a keyboard assembly that is capable of collapsing into its own protective housing. The housing consists of two symmetrical hollow box-shaped members, opened on one side. When closed, it forms a dust-proof enclosure surrounding a keyboard mechanism. When the keyboard assembly is in its collapsed position or state, it measures about 4.0–4.7 inches vertically (depending on the inclusion and height of "function" keys), 3.25 inches horizontally, and 1.25 inches deep. In the collapsed state, the keyboard assembly can be carried in a purse or coat pocket along with a palmtop computer or other information appliance, such as a cellular phone. Its small size allows it to be conveniently stowed inside an appliance, such as a desktop telephone or television. When used with desktop computers or other information appliances, the collapsed state may be used to better utilize desk space when the computer is not in operation.

Expanding the keyboard from a collapsed state to a keyboard having conventionally spaced keys is done in a single step in one example of the invention. The user simply pulls the two halves of the protective housing apart. The housing remains attached, so it cannot be misplaced, and so the unit can be enclosed and protected in an instant. The housing may also include a cursor control device or a pointing device such as a touch-sensitive trackpad or joystick-like device such as IBM's TrackPoint (found on IBM's ThinkPad laptop computers). This cursor control device is, in one exemplary embodiment, selectively positionable on either the left or the right sides of the keyboard.

In one embodiment of the invention, key actuation detection is provided for a keyboard assembly having keys coupled to and supported by a support element which is a series of rows of multiple scissors-like, diagonally or X-shaped hinged linkages connected to the assembly housing. The linkages are selectively shaped such that any keyboard layout may be adopted, including the standard 'QWERTY' layout with its staggered columns and various width keys. The linkages also provide a. wide ratio of contraction, yet due to their diagonal shape when expanded, provide a strong and rigid structure. The hinged linkages create very little friction and do not require lubrication, so the keyboard assembly can be repeatedly opened and closed smoothly and easily. The keys are pivotally attached to the linkages, and by means of swing arms, pivot from a near vertical position, when the keyboard assembly is collapsed, to a horizontal position, when the keyboard assembly is expanded. To provide for a more compact profile when the assembly is collapsed, the keys are compressed to a closed and nesting position.

In one exemplary embodiment of the invention, the mechanical structure of the keyboard assembly is used as a conductor to electrically communicate with an information appliance. The rows are electrically insulated from one another, and each row contains keys bridging a two-wire bus. The rows are sequentially scanned by a controller. In another embodiment, each key has its own transponder circuit which identifies the particular key. When a key is pressed and the controller scans the row the key is in, the key's transponder circuit indicates the identity of the key.

In another embodiment of the invention, the keys in each row of a keyboard assembly are arranged in two polarity groups by a diode coupled to each key. Each key in a polarity group has a different resistive load provided by a coupled resistor. Polarizing the keys allows the highest and lowest resistor values to define a reasonable range. Each key includes a key switch which is normally open and is closed when the key is pressed. When the switch is closed and the diode is biased with the current flow, the resistor will determine the resistive load of the pressed key. The keys in each row are coupled in parallel between two conductors.

In another embodiment of the invention, a keyboard assembly has rows of keys in which the keys in each row bridge two buses. Each key has a timer coupled to a switch and an electrical identifier, such as a resistor. The output of each timer goes high after a particular time period. When the switch is closed and the output of the corresponding timer is high, the electrical identifier provides an identifying load. A signal is sampled at different times to determine if the signal is changed by the identifying load. If so, a pressed key will be identified.

In yet another embodiment of the invention, a linear electrical matrix is coupled to a row of keys. The row is electrically separated into sections, each of which has its own section pathway for signals. Each key in each section is coupled to a key pathway, which is shared by corresponding keys in each section. Each row has its own set of section and key pathways, making the row appear electrically as if it were arranged in a matrix and allowing the rows to be electrically isolated from one another. In one embodiment, all sections are scanned concurrently to detect any responses from the keys. If a response signal is detected, the sections are scanned individually to identify the key that provided the response signal.

In still another embodiment of the invention, a two layer flexible circuit passes through each key assembly in a row of keys and provides the electrical pathways for a linear electrical matrix. The flexible circuit has an upper layer with a contact region disposed over the contact region of a lower layer. Conductive traces on each layer act as section and key pathways to allow signals to travel along the row of the keys. The flexible circuit is guided down between keys of a keyboard assembly, allowing the keyboard assembly to be collapsed more easily.

In one example of a method according to the invention, a row of keys is electrically separated into different sections. The different sections are then scanned sequentially to detect a key actuation signal that corresponds to a pressed key. A scan code corresponding to the key actuation signal is sent to a host computer.

Additional features and benefits of the invention will become apparent from the detailed description, figures, and claims set forth below.

BRIEF DESCRIPTION OF THE DRAWINGS

The present invention is illustrated by way of example and not by way of limitation in the figures of the following drawings in which like reference numerals refer to similar elements.

DETAILED DESCRIPTION

The invention relates to detecting key actuation in a keyboard assembly. Specific details of an embodiment of the keyboard assembly are described below. Numerous specific details including keyboard layouts, specific structural arrangements and relationships, etc. are presented in order to provide a thorough understanding of the invention. It is to be appreciated that these specific details need not be specifically employed to practice the invention and that there are other details that are not presented so as not to unnecessarily obscure the description of the invention that may be substituted or included that fall within the scope of the claimed invention.

Figure 1:
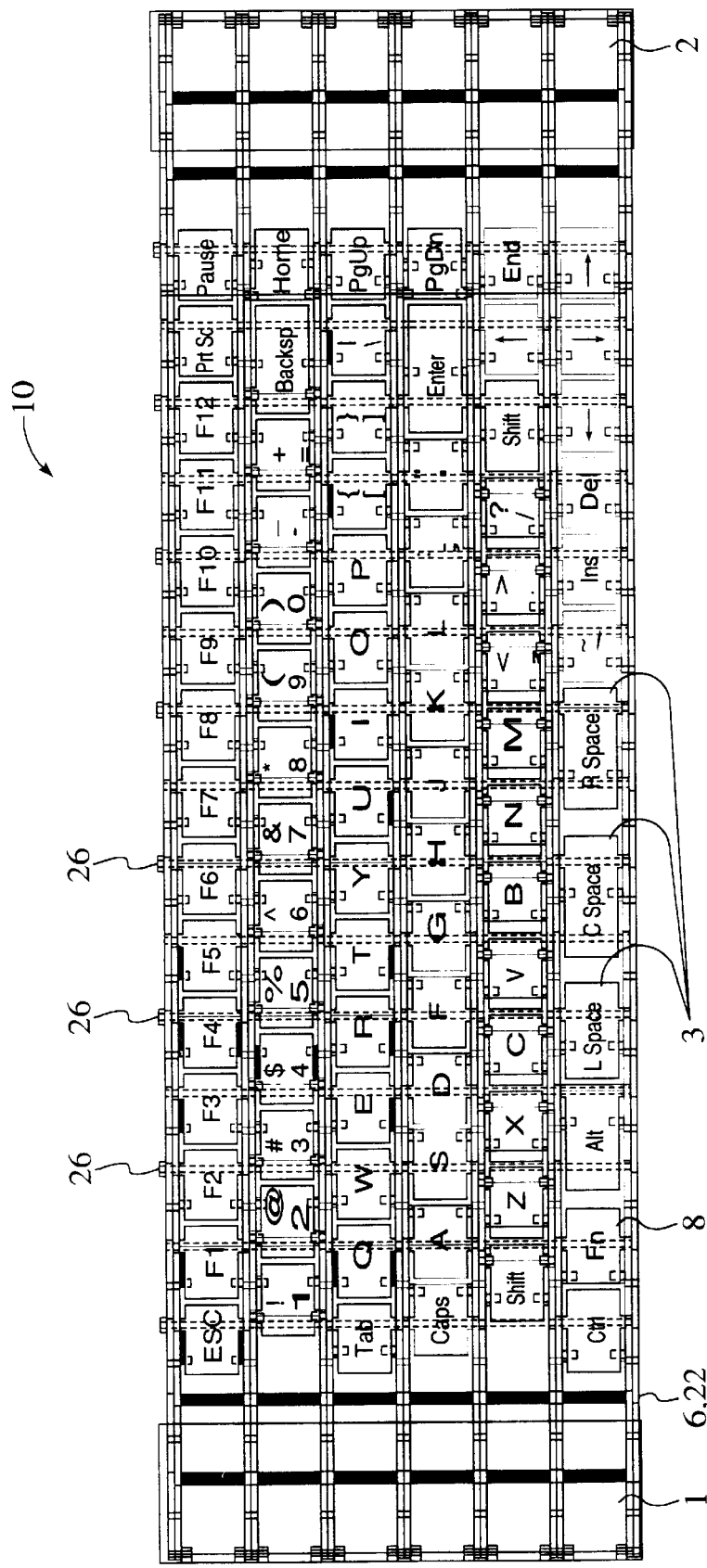
FIG. 1 is a planar top view of an embodiment of the keyboard assembly in its expanded position or state in accordance with the invention.

FIG. 1 shows a planar top view of an embodiment of the keyboard assembly of the invention. For convention, the rows of keys are numbered I through VI, with Row I being closest to the user or the front of the keyboard assembly. Row I includes the "Ctrl" key and row VI includes the "Pause" key. The "front" side of a key is closest to a user situated closest to Row I, while the "back" side of the key is farthest from the user. A vertical distance is measured from the front of the keyboard assembly, closest to the user, to the back of the keyboard assembly, farthest from the user. A horizontal distance is measured from the left (or one side) of the keyboard assembly to the right (or other side) of the assembly.

Figure 2:
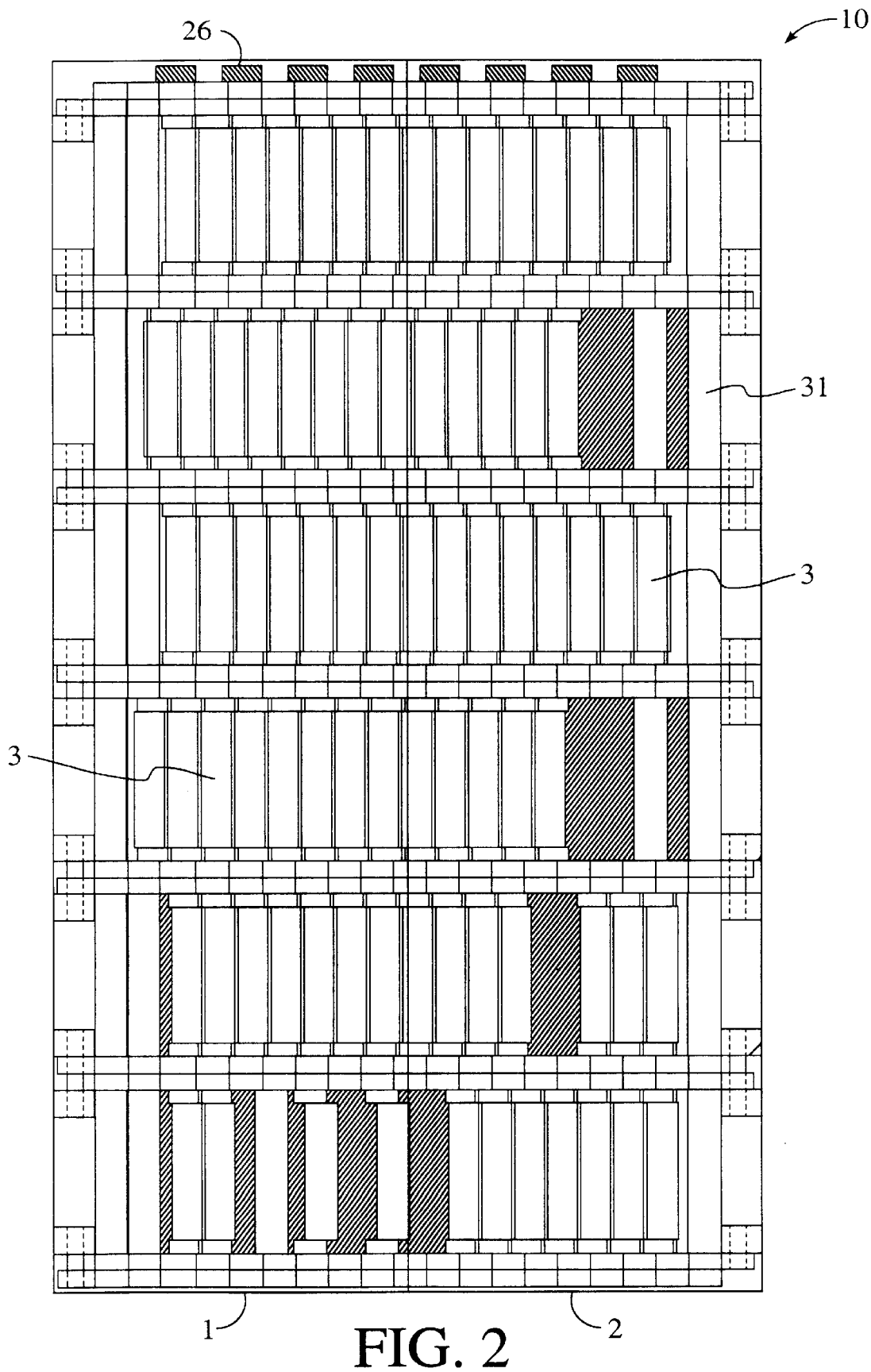
FIG. 2 is a planar top view of an embodiment of the keyboard assembly in its collapsed position or state in accordance with the invention.
Figure 3:
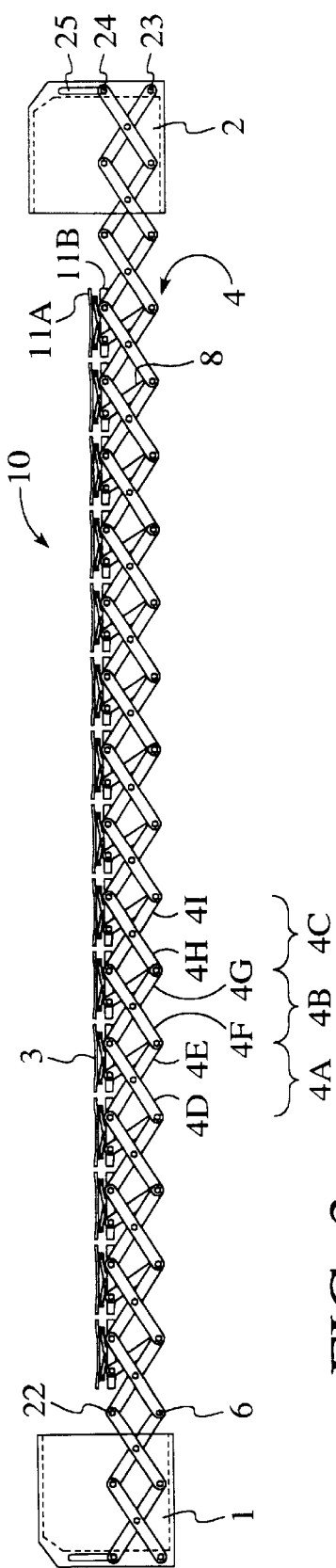
FIG. 3 is a planar front view of an embodiment of the keyboard assembly in its fully expanded position in accordance with the invention.
Figure 4:
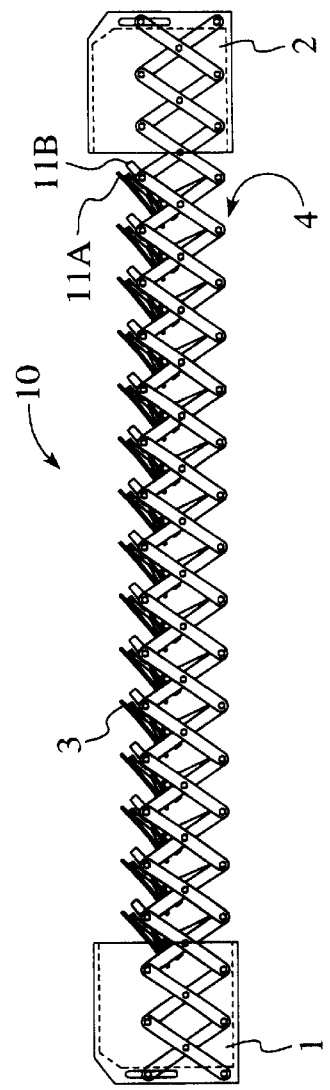
FIG. 4 is a planar front view of an embodiment of the keyboard assembly in a semi-collapsed position in accordance with the invention.
Figure 5:
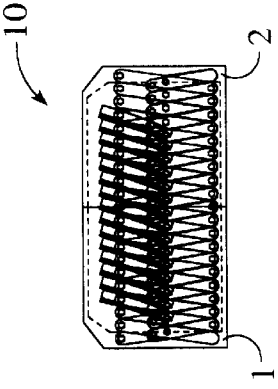
FIG. 5 is a planar front view of an embodiment of the keyboard assembly in its fully collapsed position in accordance with the invention.

FIG. 2 shows a planar top view of keyboard assembly 10 of FIG. 1 in its collapsed state. For illustration purposes, in FIG. 2, the top portion of each of protective housing sides 1 and 2 is transparent so as to reveal the collapsed state of keys 3. FIGS. 3–5 illustrate a planar front view of an embodiment of keyboard assembly 10 and show the collapsible nature of keyboard assembly 10.

FIGS. 1 and 3 show a top and a front view, respectively, of an embodiment of keyboard assembly 10 in its expanded position. In FIG. 1, it can be seen that the layout of keys 3 of the keyboard assembly 10 is the same as the standard keyboard. In this embodiment, spacing between keys 3 is full pitch (about 19 mm) in both horizontal and vertical directions. It is to be appreciated that the invention is not limited to the keyboard layout presented and that other layouts may be substituted without departing from the scope of the invention. For example, the keyboard may be a numeric keypad or a set of keys providing preprogrammed functions. As can be seen from FIG. 3, a row of interconnected scissors linkages 4 is coupled at each of both ends of the row to a housing. The row of linkages 4 supports a row of keys. Each key includes a key top 11a and a key base 11b. For each key, the key top 11a is coupled to the corresponding key base 11b. Typically, the coupling is by some mechanism which imparts a spring action to the key top relative to the key base such that the key top resists being pressed toward the key base when the key top is pressed during typing. Pressing the key top toward the key base usually causes an electrical connection to be changed; usually this occurs by a switch on the key base being closed when the key top is pressed far enough toward the key base, although other implementations may not require a switch.

As shown in FIG. 3, the row of scissors linkages 4 includes a plurality of scissors linkages which are connected in series. Three such scissors linkages 4a, 4b, and 4c are shown in FIG. 3 and are connected from left to right respectively. Each scissors linkage includes two legs which are coupled together at a pivot point by a pin or rivet. Each scissors linkage is coupled to the next scissors linkage in the row by a pivot point on one leg and a pivot point on another leg. Further details regarding the scissors linkages of one embodiment of the invention are described below.

When not in use, keyboard assembly 10 may be kept in its collapsed position or state by a protective housing composed of sides 1 and 2. FIGS. 2 and 5 illustrate planar top and front views, respectively, of keyboard assembly 10 in its collapsed position with protective housing sides 1 and 2 covering collapsed keys 3. To open the keyboard for operation, the user holds left and right sides 1 and 2, respectively, and pulls linearly sides 1 and 2 apart. FIG. 4 shows a front view of keyboard assembly 10 in a partially expanded or semi-collapsed position or state. The user continues to pull apart sides 1 and 2 until the keyboard assembly stops expanding (FIGS. 1 and 3).

The keyboard assembly stops expanding, in one embodiment, when the two end legs on each side of a row of scissors linkages are restricted from closing down upon each other. This can be seen from FIG. 3 which shows that a row of scissors linkages 4 is coupled on each side of the row to a pivot point within the respective housing. Specifically, the housing 2 on the right side of the keyboard assembly is coupled to the row of scissors linkage at pivot points 24 and 23. This pivot point 23 includes an opening in a leg of the last scissors linkage on the right side of the row, and a pin or rivet which extends through the opening and which is attached to the inner wall of the housing 2. Pivot point 24 includes an opening in the other leg of the last scissors linkage on the right side of the row and a pin or rivet which extends through the opening and which pin or rivet also rides in a channel 25 formed in the inner wall of the housing 2. The channel 25 allows the pin at pivot point 24 to ride up and down the channel as the keyboard assembly is collapsed and extended respectively. Note from FIG. 4 how the pivot point 24 has moved to half-way along the channel 25 when the keyboard is semi-collapsed. The bottom end of the channel 25 defines the stopping point for the extension of the keyboard assembly. A similar arrangement exists at the last scissors linkage on the left side of this row of scissors linkages as shown in FIGS. 3, 4 and 5. A keyboard on/off switch at the end of the channel 25 may be activated by a pivot point 24 when that pivot point reaches the end of the channel at the end of the keyboard's expansion. In this way, the end of the keyboard's expansion may be automatically sensed and power to the keyboard may be automatically supplied at this point. Each row of scissors linkages is typically coupled in a similar fashion to the inside of housings 1 and 2.

In one embodiment, the full extension of sides 1 and 2 turns on the keyboard's power, via a limit switch, for example. In another embodiment, the full extension of sides 1 and 2 tilts the keyboard by raising the rear side. Once fully expanded, the assembly 10 can communicate directly with a computer or other host device via an electric or electronic link. Examples of contemplated linkages include, but are not limited to, an infrared or radio frequency link, or a cable.

When not in operation, keyboard assembly 10 may be placed in its collapsed position (FIGS. 2 and 5) by pushing protective housing sides 1 and 2 together until the sides cover keys 3. A latch may determine the end point and the side portions may lock, for example, via a key lock switch, to provide a measure of security. To provide the most compact folded size while allowing one-step expanding and collapsing, in one embodiment, keys 3 are pivotally linked to each other by a row of scissors-like X-shaped linkages 4. FIGS. 3–5 show the collapsible and expandable nature of linkages 4.

Figure 6:
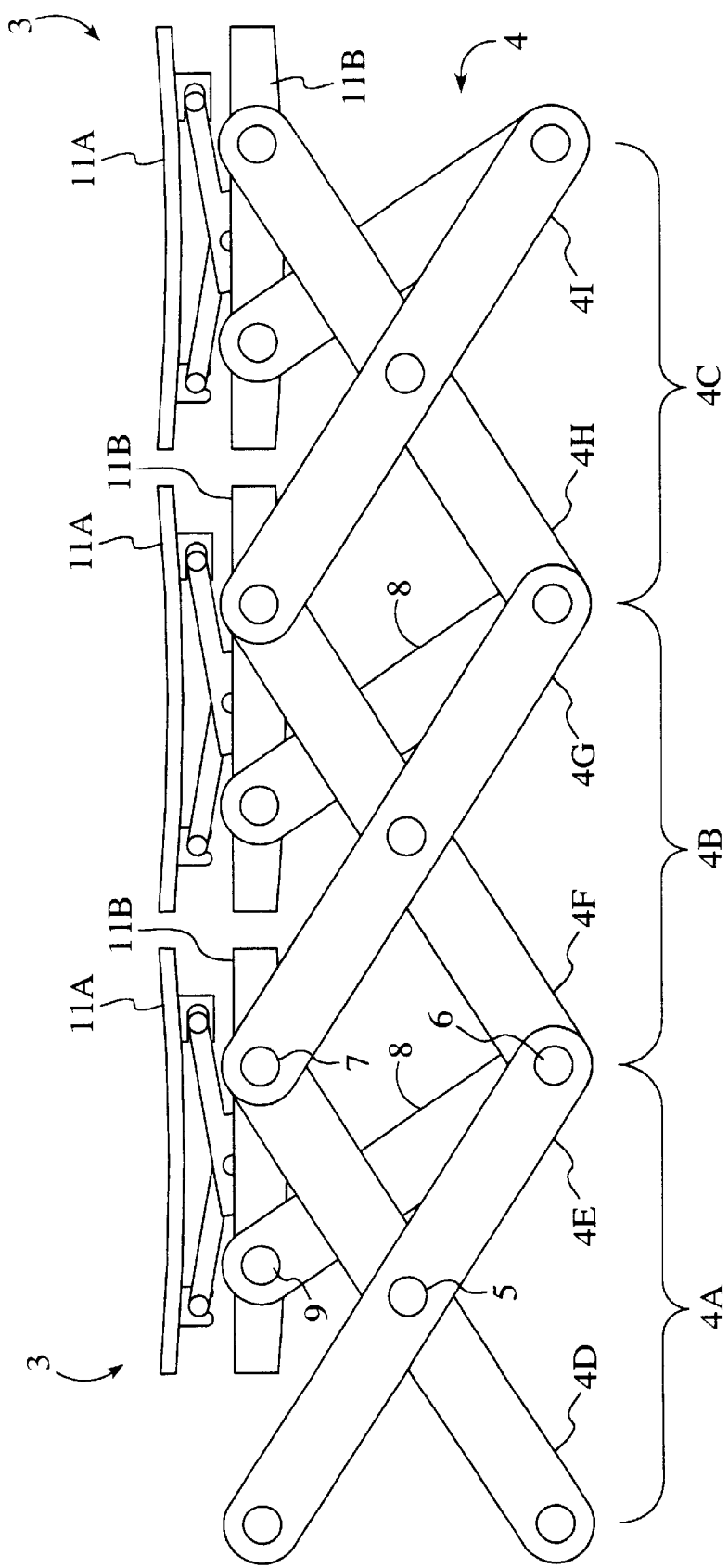
FIG. 6 is a planar front view of three keys in Row I of an embodiment of the keyboard assembly in their expanded position in accordance with the invention.

FIG. 6 shows a magnified view of three keys 3 of keyboard assembly 10 coupled to a row of scissors or X-shaped units or linkages 4. As shown in FIG. 6, each scissors linkage is composed of two legs pivotally joined at hub 5, for example, by flanged pins or rivets 30. Each scissors or X-shaped linkage is pivotally joined to a horizontally adjacent scissors linkage at lower and upper hubs 6 and 7, respectively.

As shown in FIG. 6, three scissors linkages 4a, 4b, and 4c are interconnected in series along a row. Three keys are supported by this row. Each key 3 is supported by and coupled to two adjoining scissors linkages. Scissors linkage 4a is comprised of legs 4d and 4e which are pivotally coupled at hub 5 (which is also referred to as a scissors pivot point) formed by overlapping openings in legs 4d and 4e. The scissors linkage 4a also includes an arm 8 which is rotationally coupled to hub 6 (which is also referred to as a coupling pivot point) at one end of arm 8 and is rotationally coupled to hub 9 on the key base 11b of the left-most key of FIG. 6. Hub 6 is formed by overlapping openings in arm 8, leg 4e and leg 4f. Hub 9 is formed by overlapping openings in arm 8 and key base 11b. Each of these hubs is secured by a pin in one embodiment. Leg 4d of scissors linkage 4a is rotationally coupled to leg 4g at coupling pivot point 7; coupling pivot point 7 is also rotationally coupled to the key base 11b of this left-most key. Coupling pivot point 7 is formed by overlapping openings in leg 4d, leg 4g and key base 11. Coupling pivot point 7 is secured by a pin in one embodiment of the invention. Leg 4e of scissors linkage 4a is rotationally coupled to leg 4f at the coupling pivot point 6. Legs 4f and 4g form the scissors linkage 4b and are also rotationally coupled together by a scissors pivot point 5. Scissors linkage 4b includes an arm 8 which is rotationally coupled at coupling pivot point 6 to leg 4g and to leg 4h of scissors linkage 4c. The arm 8 of scissors linkage 4b is rotationally coupled to a key base 11b of the middle key of FIG. 6, and this key base is rotationally coupled to leg 4f of scissors linkage 4b and to leg 4i of scissors linkage 4c. The leg 4h and the leg 4i form scissors linkage 4c which is rotationally coupled to the key base 11b of the right-most key of FIG. 6. The legs 4h and 4i are pivotally coupled at the scissors pivot point 5. The key base 11b of this right-most key is coupled to an arm 8 which extends from a coupling pivot point with leg 4i and is coupled to leg 4h at a coupling pivot point on this key base 11b.

Figure 7:
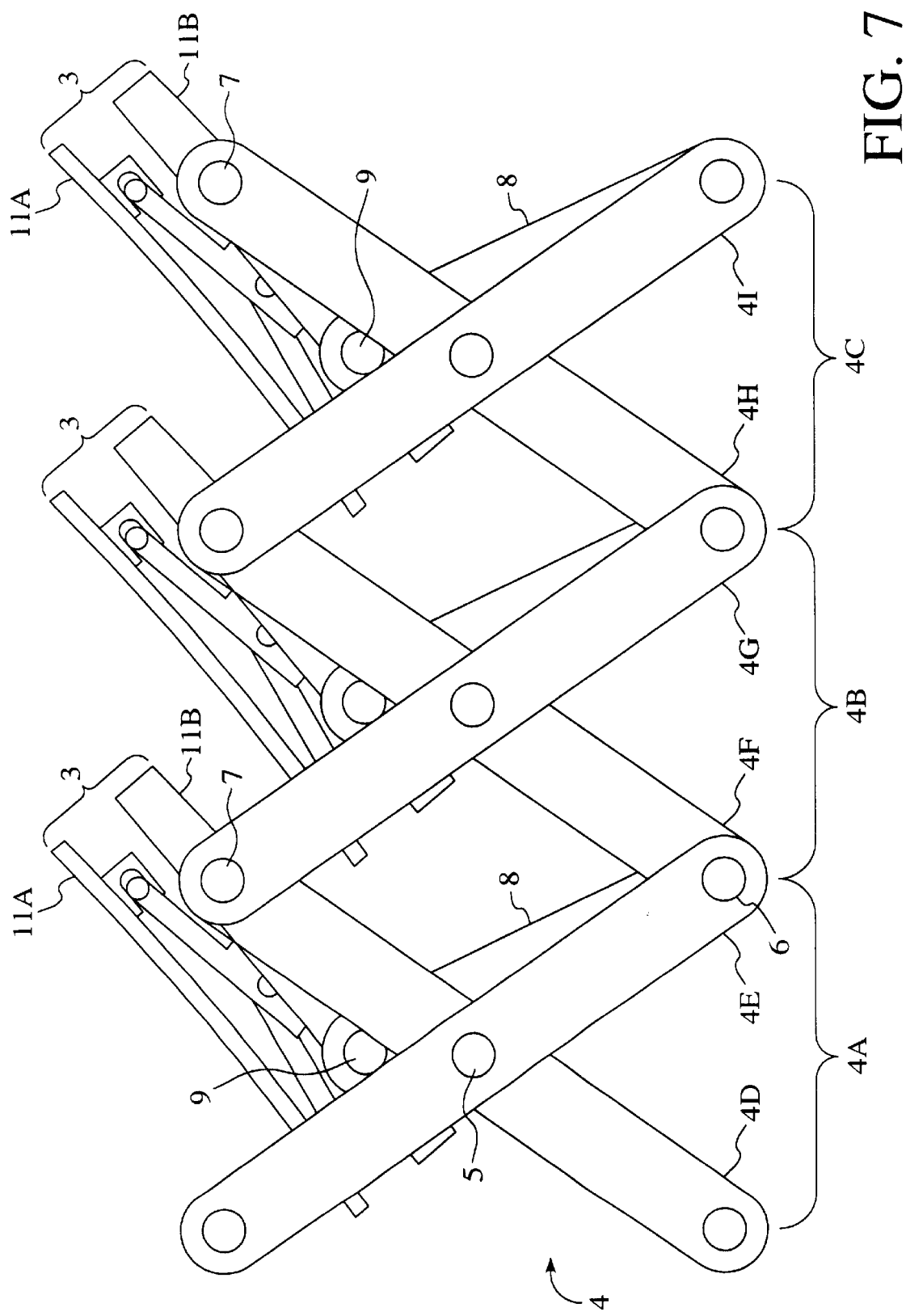
FIG. 7 is a planar front view of the three keys illustrated in FIG. 6 in a semi-collapsed position.
Figure 8:
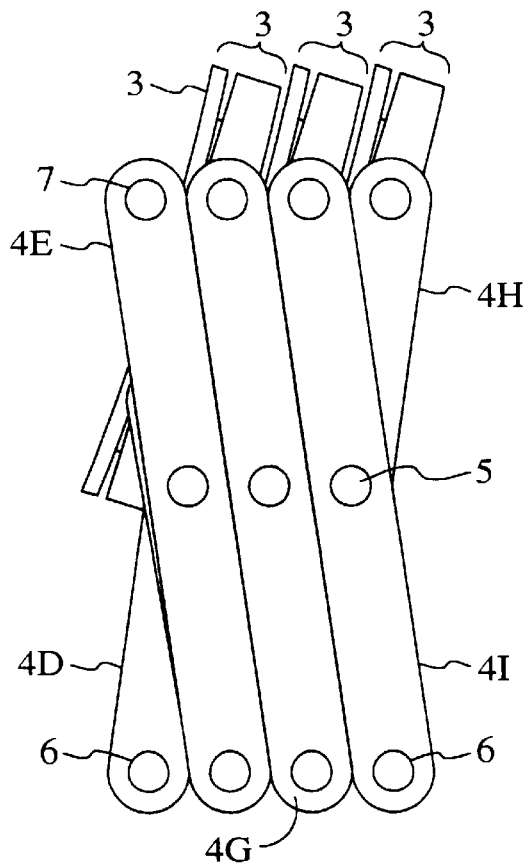
FIG. 8 is a planar front view of three keys illustrated in FIG. 6 in their fully collapsed position.
Figure 9:
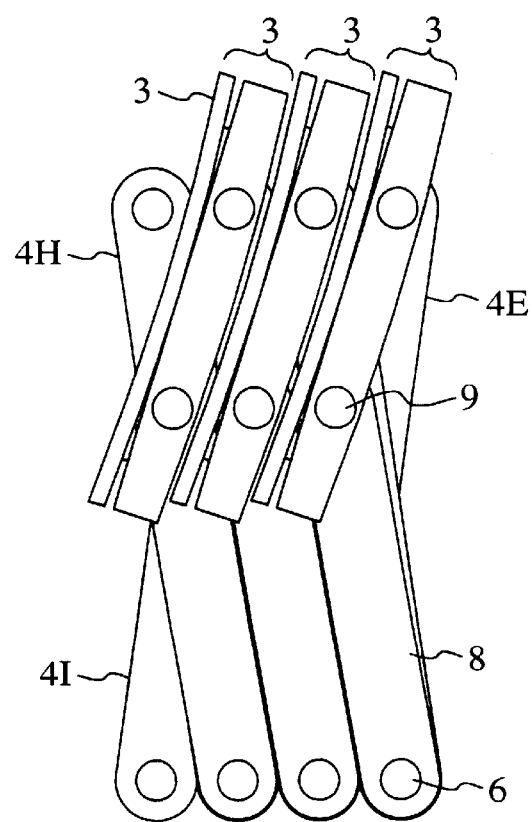
FIG. 9 is a planar rear view of three keys in one row illustrated in FIG. 6 in their fully collapsed position.

FIGS. 7–9 illustrate the pivoting of a row of linkages 4 with respect to the three keys 3 of FIG. 6. Keys 3 rotate from a horizontal position (FIG. 6) when keyboard assembly 10 is fully expanded, to approximately a 45° angle when keyboard assembly 10 is partially collapsed (FIG. 7), to a nearly vertical position (FIGS. 8–9) when keyboard assembly 10 is fully collapsed. FIG. 9 is a rear view of the collapsed portion of keyboard assembly 10 of FIG. 8. Arms 8 pivotally connect linkage hubs 6 to hubs 9 of keys 3. When expanded, arms 8 and the row of scissors linkages 4 provide a strong, rigid truss, and the angles assumed by arms 8 and the row of scissors linkages 4 are such that keys are prevented from rotating even if they are pressed hard by the user.

As keyboard assembly 10 is collapsed (FIG. 7), hubs 6 and 7, respectively, increase in distance from each other. This causes arm 8 to rotate key 3 via hub 9 from its horizontal position toward a vertical position (in this case in a counterclockwise direction). Effectively, arm 8 pulls down the key 3 in a counterclockwise direction. When keyboard assembly 10 is fully collapsed (FIGS. 8–9), the row of linkages 4, arms 8, and keys 3 are, respectively, substantially parallel and, in one embodiment, in contact with one another. While FIG. 9 shows that there is some space between a key top of one key and a key base on the adjacent key, there may in certain embodiments be little or no space between a key top on one key and a key base on an adjacent key.

In the embodiment described, bottom hubs 6, which pivotally join the X-linkages 4 and arms 8 at their base, are approximately horizontally equally spaced. When keyboard assembly 10 is fully collapsed, hubs 6 are in close horizontal proximity to one another. This can be seen from FIG. 5.

Figure 10:
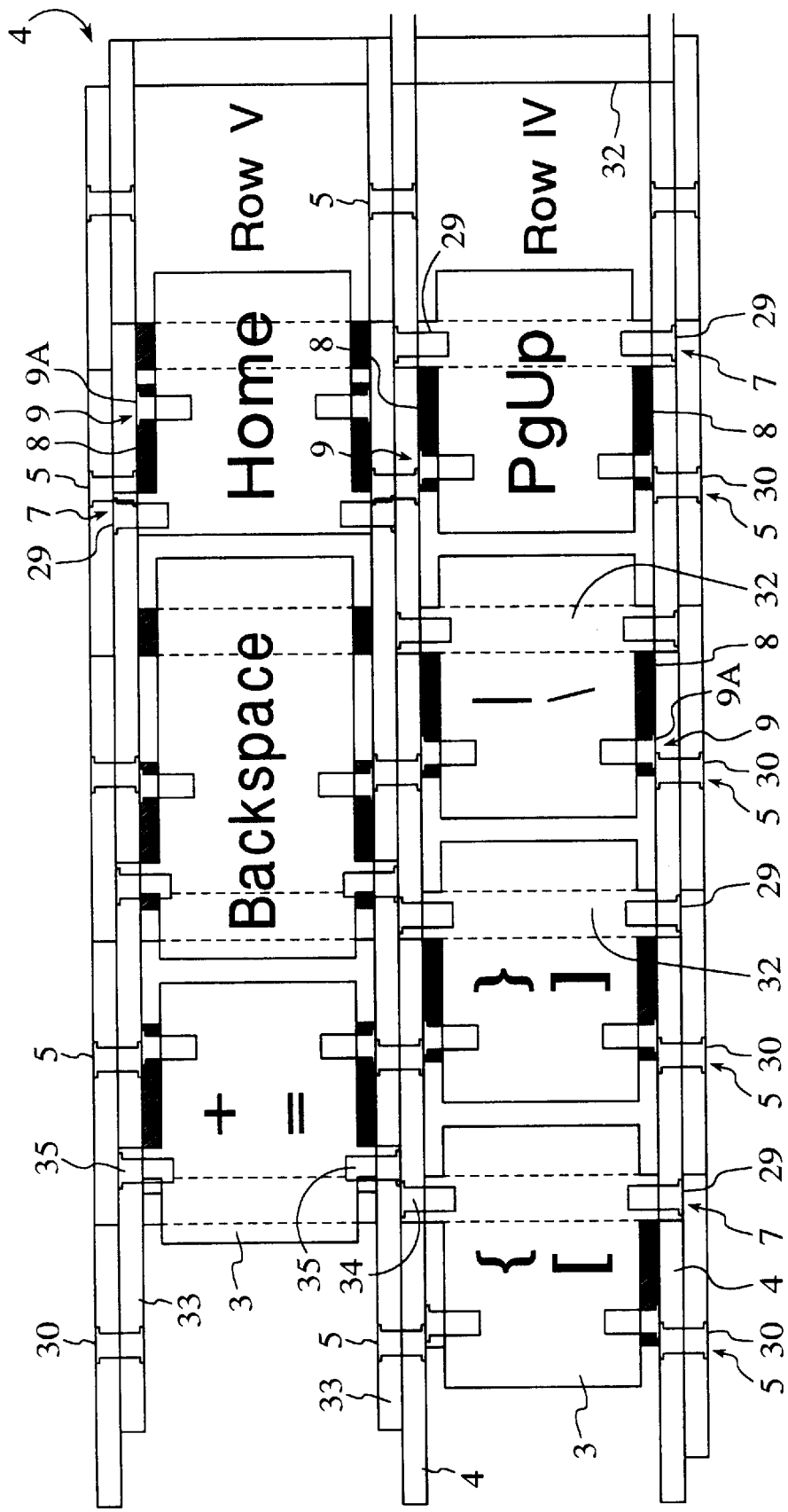
FIG. 10 is a planar top view of seven keys in two rows of an embodiment of the keyboard assembly in accordance with the invention.

In one embodiment, each row of keys 3 of keyboard assembly 10 is pivotally joined to its adjacent row to provide a strong and stable structure when keyboard assembly 10 is in an expanded position. FIG. 10 shows a planar top view of a portion of keyboard assembly 10. FIG. 10 shows a portion of keys 3 from Row IV pivotally coupled to keys 3 of Row V. Three rows of scissors linkages 4 hold these seven keys. Flanged pins 29 extend through linkage hubs 7 on each row of scissors linkages and fasten to keys 3 to pivotally secure the top portion of keyboard assembly 10. Each of these pins 29 also pivotally secure at a hub 7 one leg from one scissors linkage to a leg from an adjacent scissors linkage as shown in FIG. 6. Each row of scissors linkages 4 of FIG. 10 fastens, through these pins 29, to one side of each key along a row of keys through the corresponding hub 7. The other side of each key along this row is secured to an adjacent row of scissors linkages 4 through the mating of another set of pins 29 in the corresponding hubs 7 on this other side of each key. Flanged rods 31 (shown in FIG. 13) pass through bottom hubs 6 on each of the three rows of scissors linkages and spacing sleeves 32 to pivotally secure the bottom portion of keyboard assembly 10. Each pivot point at the connection between an arm 8 and a key base 11b at a hub 9 is secured by a flanged pin 9a which extends through the opening in the arm 8 and into an opening in the key base 11b. As noted above, flanged pins or rivets 30 are used to secure each scissors pivot point 5.

Figure 11:
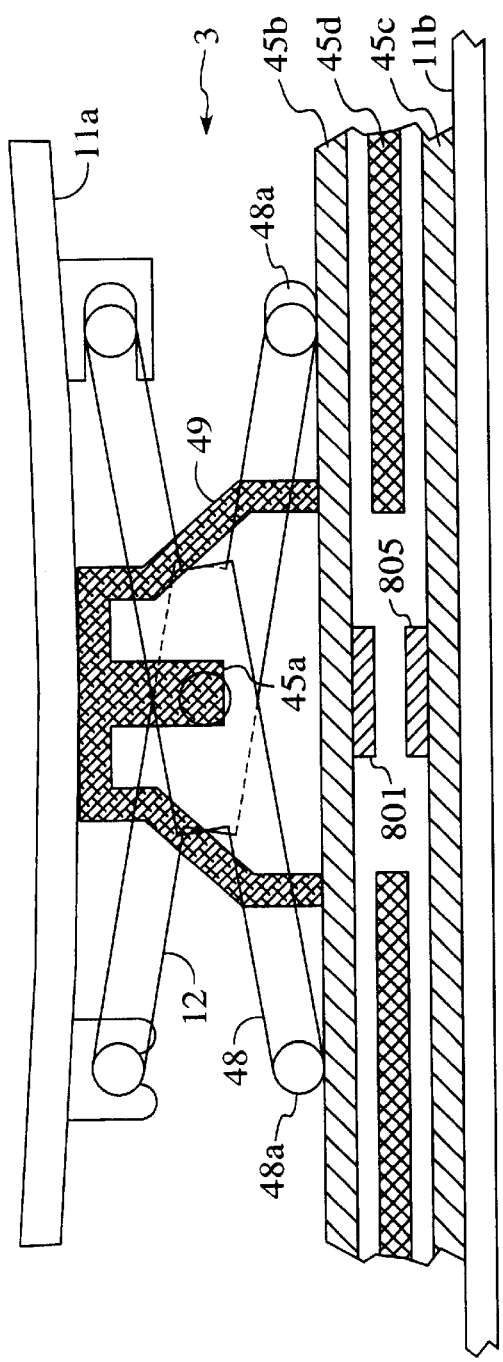
FIG. 11 is an embodiment of a key mechanism for a key in its open position in accordance with the invention.
Figure 12:
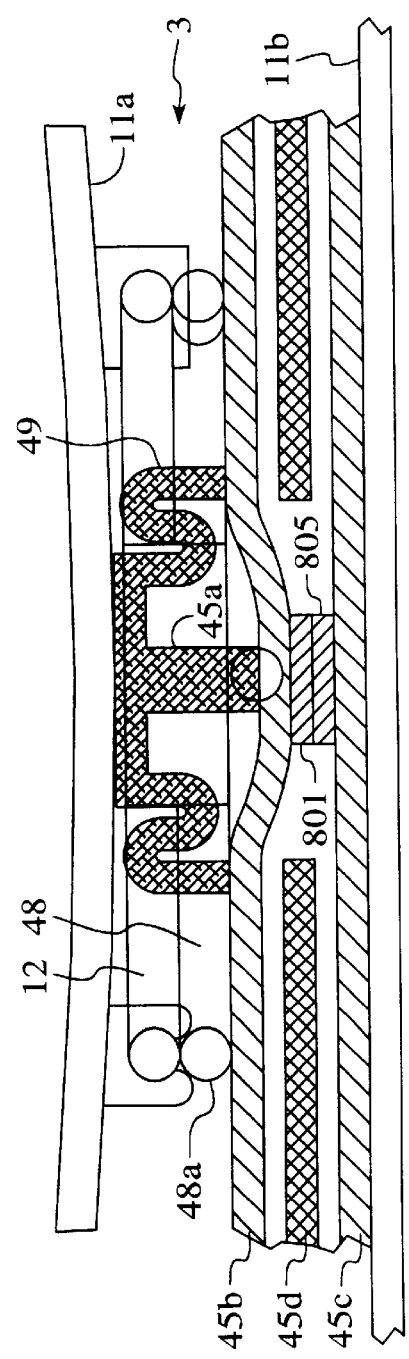
FIG. 12 is an embodiment of the key mechanism of the key in FIG. 11 in its closed position in accordance with the invention.

FIGS. 11 and 12 show a planar front view of an embodiment of a key 3 of keyboard assembly 10. In FIGS. 11 and 12, key 3 is composed of key base 11b that is coupled to key top 11a by a conventional linkage having butterfly elements 12 and 48. This linkage allows key 3 to be compressed to a very thin dimension (FIG. 12), yet have a large amount of travel (the distance between its open and closed position). When keyboard assembly 10 is fully collapsed, adjacent keys 3 exert pressure on each other causing them to be maintained in their closed position. It will be appreciated that there are numerous alternative types of linkages which may be used to link between each key top and key base.

Coupled to the base of key top 11a of each key 3 is a spring 49 that has the shape of a bowl or truncated cone and is made, for example, of an elastomer or elastomer-like material. To type, a user presses on the key top and compresses the spring 49 as the key top is pushed toward the key base 11b. When the compression of spring 49 exceeds a predetermined amount, spring 49 buckles to give tactile feedback to the user. FIG. 12 shows one example of the buckling of spring 49. The elastomeric nature of spring 49 also allows it to remain in a compressed position (when keyboard assembly 10 is collapsed) without fatigue.

Figure 30A:
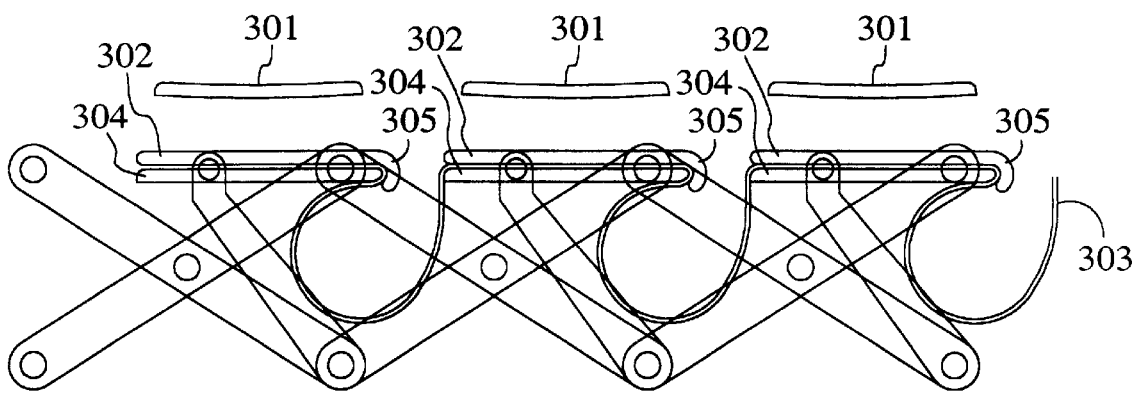
FIG. 30A is a planar front view of a portion of an embodiment of a keyboard assembly in an expanded position in accordance with the invention.
Figure 30B:
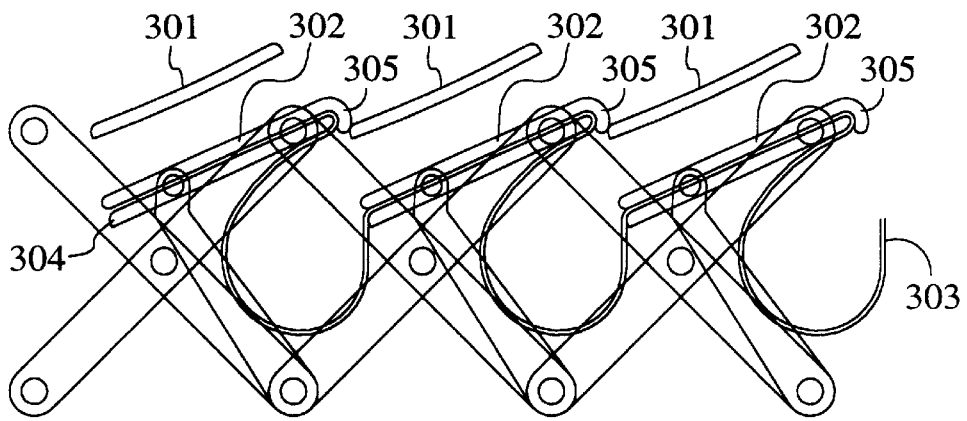
FIG. 30B is a planar front view of the keyboard portion shown in FIG. 30A in a partially collapsed position in accordance with the invention.
Figure 30C:
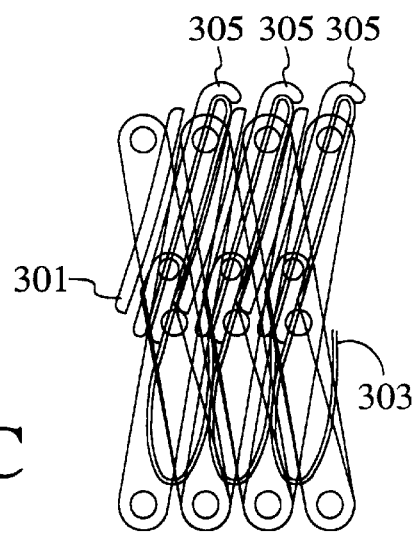
FIG. 30C is a planar front view of the keyboard portion shown in FIG. 30A in a fully collapsed position in accordance with the invention.
Figure 46:
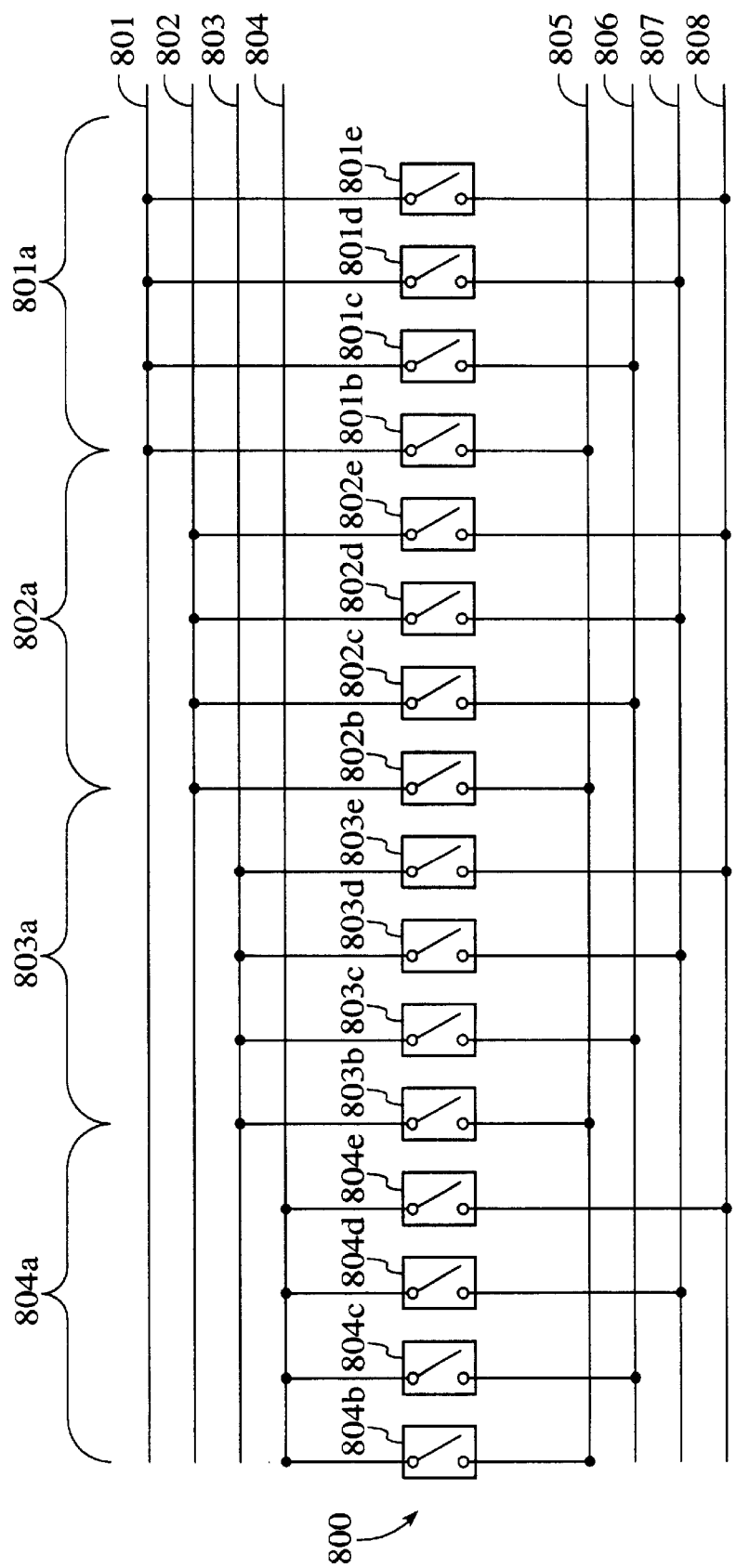
FIG. 46 is a schematic circuit diagram of a linear electrical matrix coupled to a row of keys of a keyboard assembly in accordance with the invention.

FIGS. 11 and 12 show an example of a key assembly with a flexible conductor assembly disposed on a key base. In this particular example, a flexible conductor assembly for each row of keys is weaved through key bases of the keys along the row; FIGS. 30A–30C show how this flexible conductor assembly allows the key assemblies to rotate between an expanded and a contracted state. A flexible conductor assembly will typically include a plurality of flexible conductors disposed on or in a flexible film. The flexible conductor assembly may include one or two or three or more layers of flexible conductors. The flexible conductor assembly bends as the keys of a row are collapsed and bends as the keys are expanded. Each row of keys has its own flexible conductor assembly which in one case is a set of 8 conductors in two layers of conductors running along each row. One layer of conductors may represent "column lines" and another layer of conductors may represent "row lines." FIG. 46 shows an example of "row lines" 801–804, each of which defines a separate section of a mechanical row of keys and column lines 805–808, each of which is a "column" conductor that is coupled to a particular key switch. The rows are electrically insulated from each other. FIGS. 11 and 12 show an example of a three-layer flexible conductor assembly in which the row conductor 801 is disposed above (and separated from) a column conductor 805 when the key top 11a is not pressed down against key base 11b. This three-layer flexible conductor assembly includes two layers of conductive material and one layer of insulating material. When the key top 11a is pressed down against key base 11b, the standoff 45a depresses the flexible film 45b and the row conductor 801 toward the column conductor 805, which causes the column conductor 805 on the flexible film 45c to electrically contact the row conductor 801 as shown in FIG. 12, thereby closing the switch at this key between these two conductors. It is assumed that in this case the electrical matrix of FIG. 46 is being used with the embodiment of FIGS. 11 and 12. The flexible films 45b and 45c are separated from each other by an insulating layer 45d which includes an opening allowing exposed conductive regions of row conductor 801 and column conductor 805 to make electrical contact. While FIGS. 11 and 12 show 2 layers of conductors in the flexible conductor assembly, it will be appreciated that alternative embodiments may use any number of layers of conductors. FIGS. 11 and 12 show that the key top 11a and key base 11b are formed from different structures which are joined together. It will be appreciated that, in an alternative embodiment, the key base and key top may be made from a collapsible unitary structure.

As can be seen in FIG. 1, the standard key layout of computer keyboards has columns of keys which are mostly staggered, rather than in straight columns. Additionally, some keys, for example, the "Backspace" and "Enter" keys (FIGS. 1C and 5) are considerably wider than, for example, a letter key.

Figure 13:
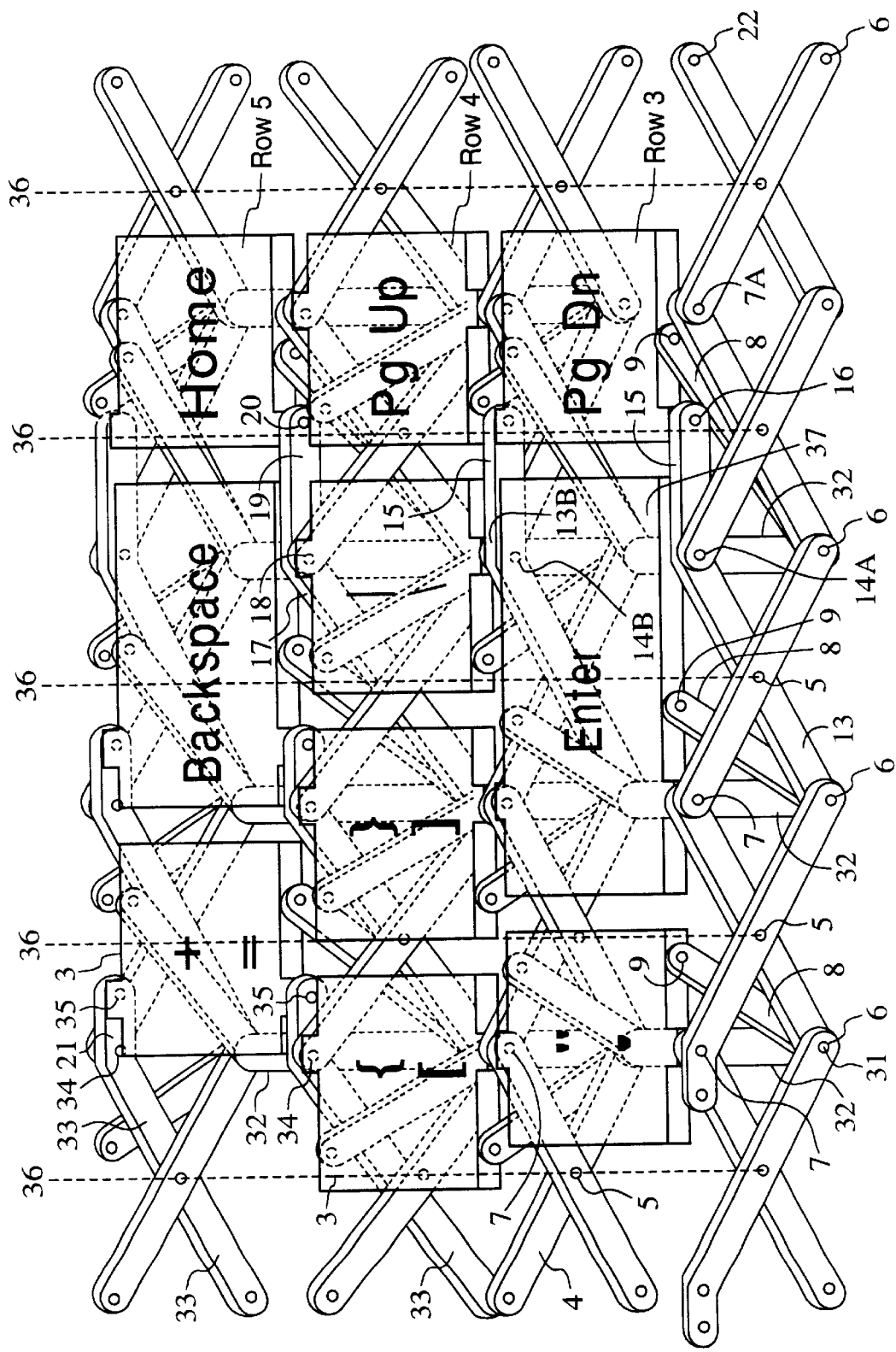
FIG. 13 is a top perspective view of ten keys in three rows of an embodiment of the keyboard assembly in their expanded position in accordance with the invention.

In order to allow the keyboard assembly of the invention to be collapsed to a minimum length and thickness, the particular embodiment depicted in the figures utilizes various configurations of linkage shapes, arm lengths, and hub locations on the keys. Additionally, the assembly is configured so that keys rotate in different directions in different rows. FIG. 13 illustrates a perspective top view of a portion of keyboard assembly 10 of the invention. Note that there are three different key top sizes. FIG. 13 shows a portion of three rows of keys 3 (Rows III, IV, and V) and illustrates the support mechanism of such keys in part by ghost lines to indicate the construction of the mechanism beneath the keys. Keys 3 are shown in an expanded (opened) position. In FIG. 13, hubs 6 lie in vertical columns and are equally spaced in all rows. Keys 3 in Row III are pivotally supported by the configuration of a series of X-linkages 4, arms 8, and key hub locations shown in detail in FIGS. 14 and 15. As Row III collapses, keys 3 rotate in a clockwise direction. The keys in Row IV are pivotally supported by the configuration shown in FIGS. 6–9. As Row IV collapses, keys 3 in row IV rotate in a counter-clockwise direction. This allows, in one embodiment, a full-sized laptop keyboard (about 11 inches long excluding its frame) to fold to 3.25 inches in length, including its housing.

Figure 14:
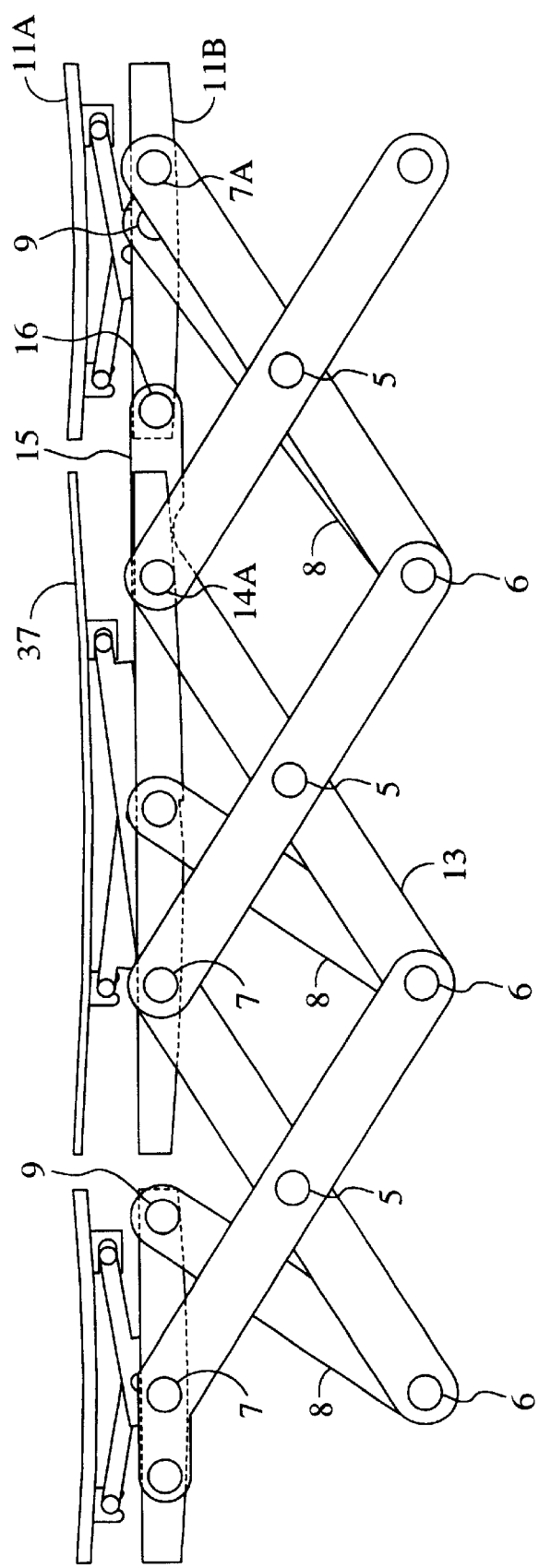
FIG. 14 is a planar front view of three keys in Row III of an embodiment of a keyboard assembly in their fully expanded position in accordance with the invention.
Figure 15:
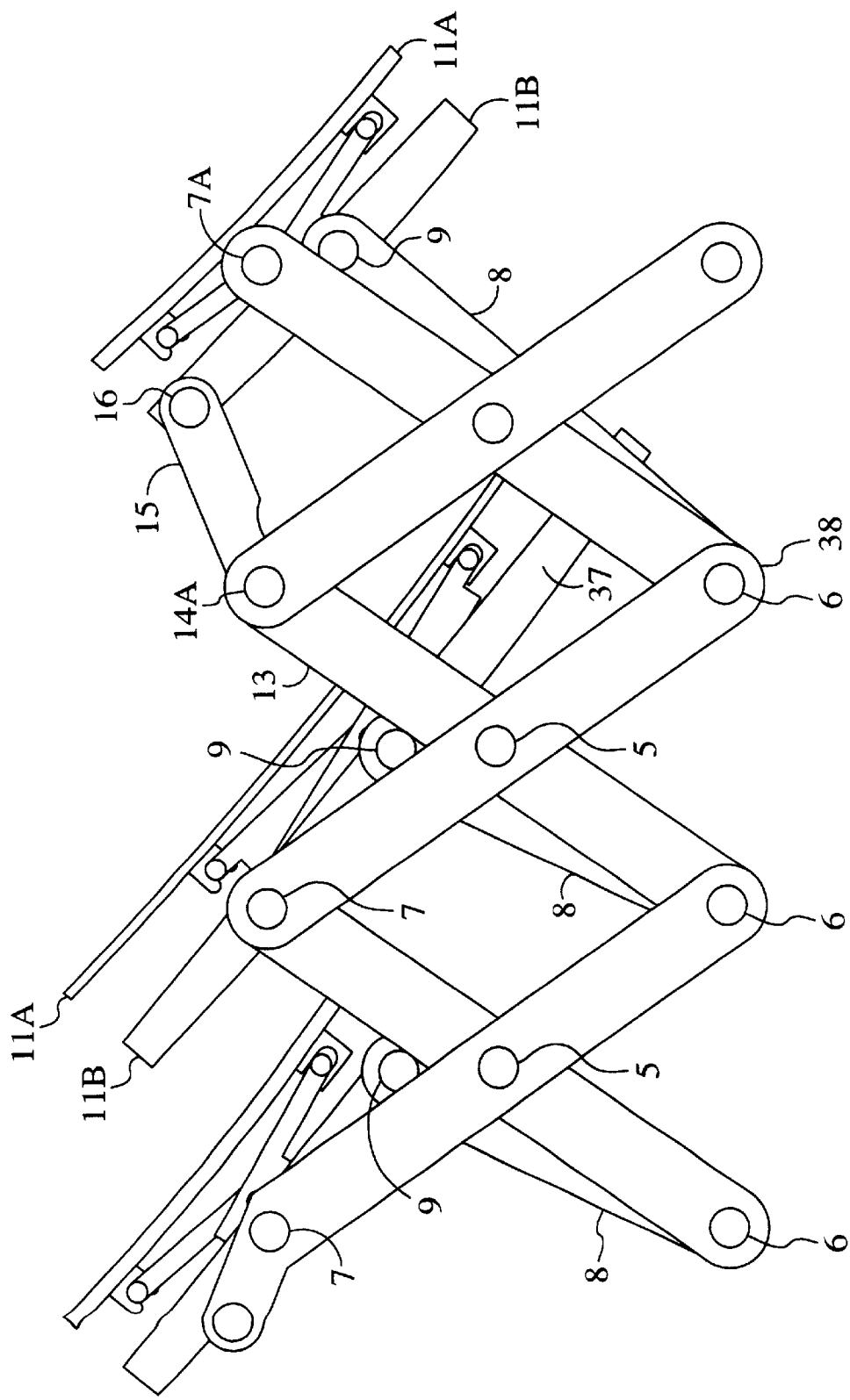
FIG. 15 is a planar front view of the three keys in Row III of FIG. 14 in a semi-collapsed position.
Figure 16:
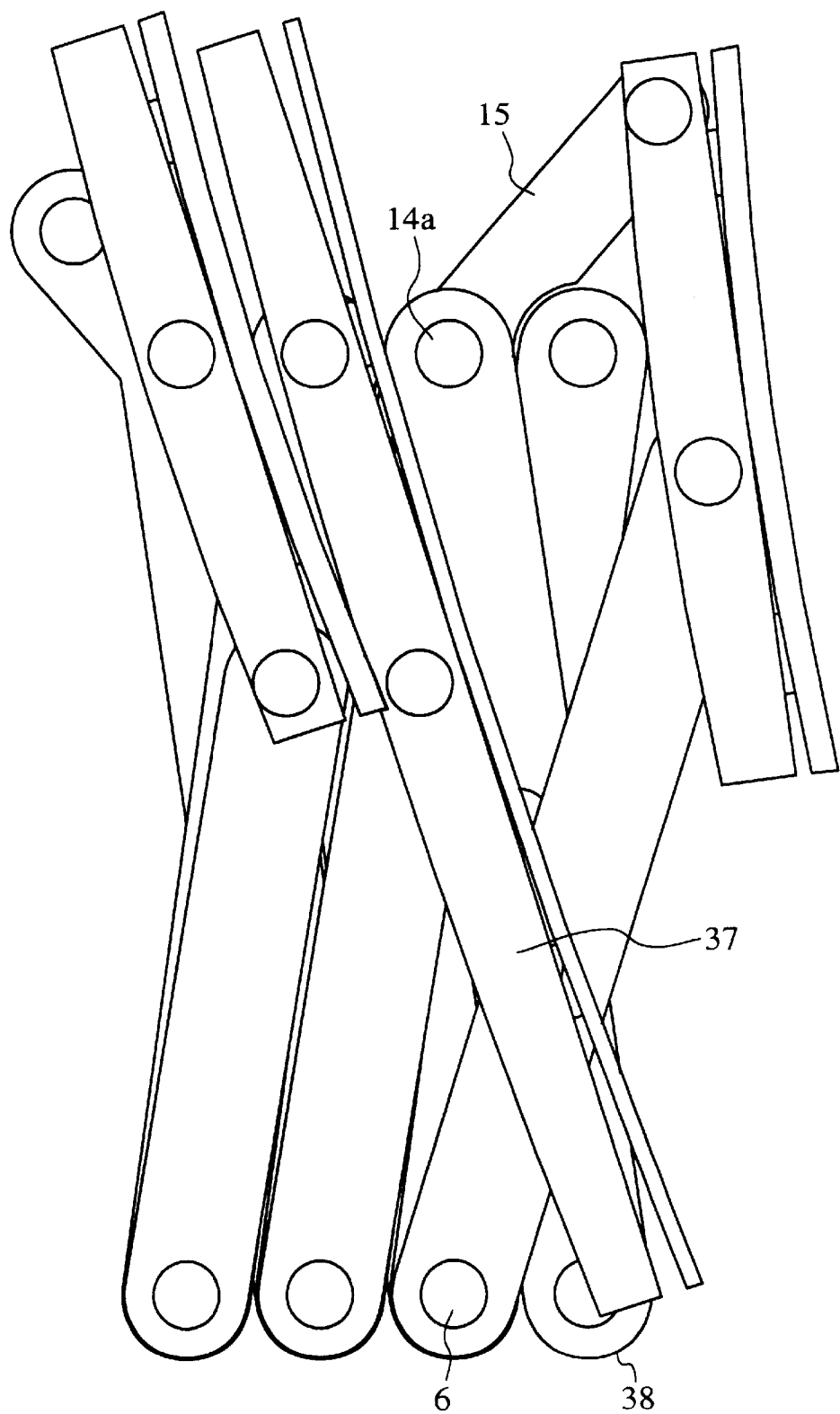
FIG. 16 is a planar front view of the three keys in Row III of FIG. 14 in their fully collapsed position.

Row III contains the wide "Enter" key 37 which spans two bottom hubs 6. FIGS. 14–16 illustrate a planar front view of the rotation of the keys of Row III shown in FIG. 13. To allow the keyboard assembly to fold to a minimum length and thickness, linkage 13b, located between Rows III and IV, pivotally supports the front side of the "|\" key in Row IV at hub 14b, and has an angled extension 15 to pivotally support the back side of the "Pg Dn" key in Row III at hub 16. Similarly, linkage 17, located between Row IV and Row V, pivotally supports the back side of the "|\" key at hub 18, and has an angled extension 19, to pivotally support the front side of the "Home" key in Row V at hub 20. Linkage 13 shown in FIG. 13 includes a hub 14a which couples the linkage 13 to an adjacent leg on the scissors linkage to the right of the "Enter" key. The extension 15 of linkage 13 pivotally supports the front of the "Pg Dn" key at hub 16. This is also shown in FIG. 15. The hub 7a is not coupled to the "Pg Dn" key but is coupled to the adjacent scissors linkage to the right of the "Pg Dn" key.

FIGS. 14–16 show the wide "Enter" key 37 with normal width keys on either side of the "Enter" key. No key in row 3 is attached at hub 14a which allows "Enter" key 37 to rotate unobstructed, but the "|\" key is attached to hub 14b. FIG. 16 illustrates that when keyboard assembly 10 is in its collapsed position, the vertical distance between hubs 6 and 14 is sufficient to accommodate "Enter" key 37 without the key extending below the bottom 38 of the series of linkages 4. FIG. 16 also illustrates that the wide keys and linkage extensions do not add to the horizontal length of the folded keyboard assembly. The other wide keys of keyboard assembly 10 and their associated linkages and hubs are designed similarly, such that the folded depth of the keyboard is kept to a minimum.

Figure 17:
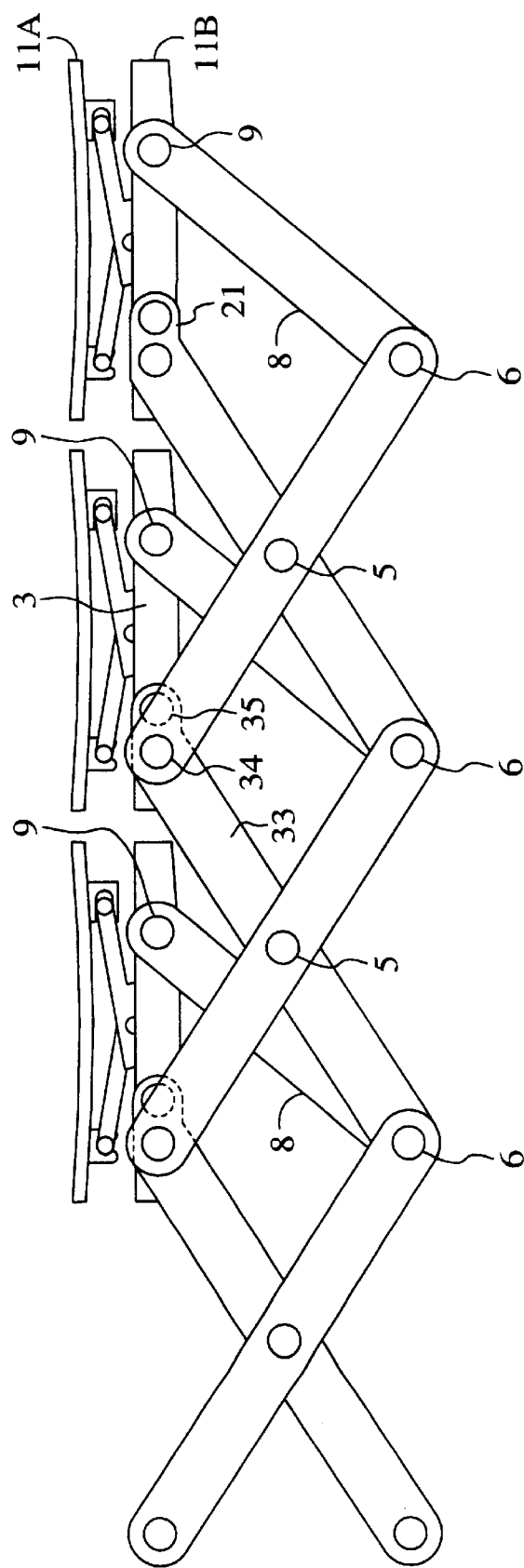
FIG. 17 is a planar front view of three keys in Row V of an embodiment of a keyboard assembly in their expanded position in accordance with the invention.
Figure 18:
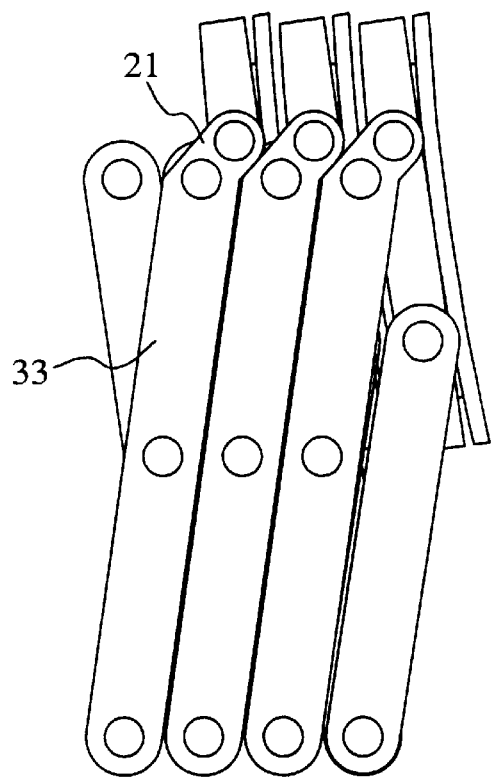
FIG. 18 is a planar front view of the three keys in Row V of FIG. 17 in their collapsed position.
Figure 19:
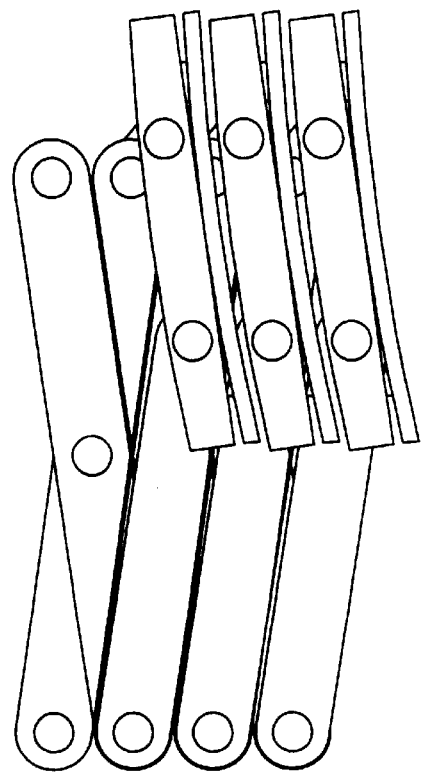
FIG. 19 is a planar rear view of the three keys of FIG. 17 in their collapsed position.

In addition to accommodating keys of different widths, the linkage design of the invention allows keys on one row to be horizontally displaced with respect to keys on an adjacent row (e.g. staggered key columns), thereby conforming to standard keyboard layouts, such as for example a "QWERTY" layout even though the rows are pivotally joined to each other. For example, keys 3 in Row IV are pivotally supported on the front side by hubs 7 of linkages 4 (FIGS. 6, 10, and 13). However, linkages 33 located between Row IV and Row V have angled extensions 21. This is illustrated in FIG. 13 and in a front view portion of Row V shown in FIG. 17 in an expanded position and FIGS. 18–19 in a collapsed position. As shown in FIGS. 13 and 17–19, there are two hubs 34 and 35 on extensions 21, which lie on a horizontal axis when the keyboard is expanded (FIGS. 13 and 17). In FIG. 13, linkage 33 pivotally supports the "{[" key of Row IV at hub 34. The same linkage 33 pivotally supports the "+=" key 3 of Row V at adjacent hub 35. In this manner, the keys in Row V are displaced horizontally with respect to the keys in Row IV. When fully collapsed, extensions 21 "nest" allowing the linkages to be compressed to their most compact position. This is illustrated in front and rear views by FIGS. 18 and 19, respectively.

As shown in FIG. 13, hubs 34 lie along the same vertical axis as hubs 7 which lie along the same vertical axis as rod 31. The X-shaped linkages 4 and 33, respectively, and their respective extensions have centers of intersections 5 which lie on a common vertical axis 36 for all rows, even though the keys of different rows are horizontally staggered and are of different widths. This arrangement allows all rows to expand and collapse together.

While the keys in adjacent rows are horizontally staggered, the left and right terminations of the linkages in all rows lie in approximately vertical lines. Linkages supporting the left-most keys of each row (FIGS. 1 and 3) are aligned horizontally at their bottom hubs 6 and their top hubs 22. Similarly, linkages supporting the right-most column of keys (FIGS. 1, 3, and 13) are aligned horizontally at their bottom hubs 6 and their top hubs 22. This allows a compact arrangement for a housing composed of protective housing sides 1 and 2.

The left and right-most linkages of the embodiment of the keyboard assembly of the invention are pivotally joined to the housing side portions 1 and 2, respectively, by bottom pivot pins 23 at bottom hubs 6 and slidably joined to the housing side portions 1 and 2, respectively, by top pins 24, which slide in slots 25 of housing side portions 1 and 2, respectively (see FIGS. 3, 4, and 5). Two sets of scissors or X-shaped linkages (without associated keys), located on the left- and right-most sides of keyboard assembly 10, allow the unit to be expanded so that housing side portions 1 and 2, respectively, are clear of keys 3. In this manner, keyboard assembly 10 can be opened and closed in a one-step operation and does not need to be removed from its protective housing. In one embodiment of the invention, the surface of one of housing sides 1 and 2 may include a cursor control device such as a small trackball, a touch-sensitive trackpad, a joystick, a pressure-sensitive pointing device (e.g. IBM's TrackPoint III which is used on IBM's ThinkPad laptop computers), or other cursor control (e.g. pointing) devices. In addition, small buttons may be included on the surface of the housing; these small buttons may perform the same functions as the buttons (or button) on a mouse which is often used with a computer. In another embodiment, the cursor control device is selectively positionable on either one of housing sides 1 and 2.

Figure 20:
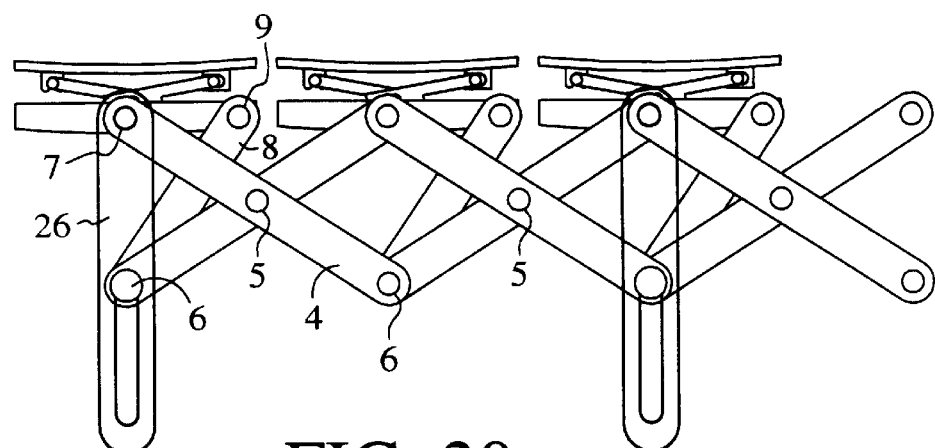
FIG. 20 is a planar rear view of an embodiment of the invention including tilt fingers with three keys in their fully expanded position in accordance with the invention.
Figure 21:
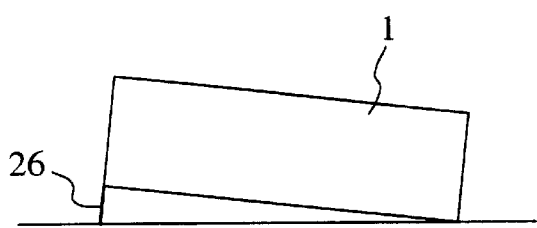
FIG. 21 is a planar side view of an embodiment of the keyboard assembly of the invention in its expanded position having tilt fingers raising the back side of the assembly in accordance with the invention.
Figure 23:
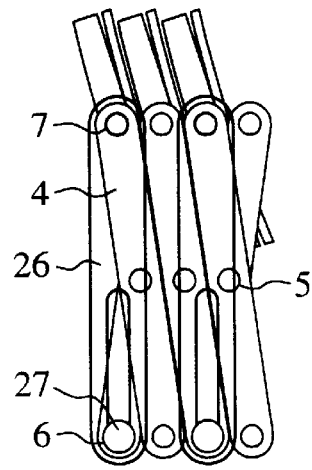
FIG. 23 is a planar rear view of the three keys of FIG. 20 in their fully collapsed position.
Figure 22:
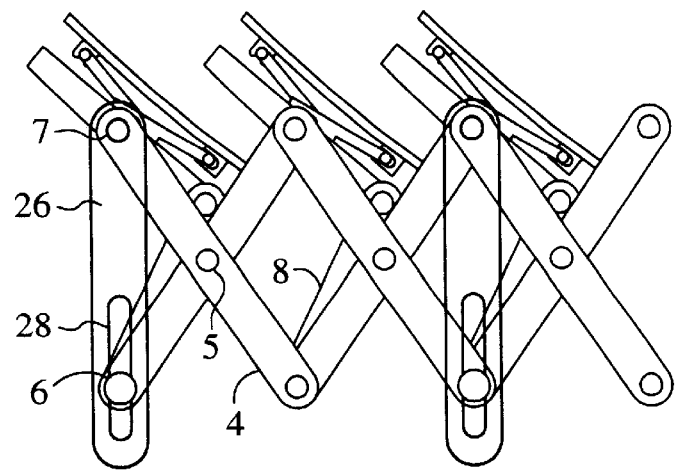
FIG. 22 is a planar rear view of the three keys of FIG. 20 in a semi-collapsed position.

FIGS. 20–23 illustrate an additional feature of one aspect of an embodiment of a keyboard assembly of the invention. FIGS. 20, 22, and 23 show front view portions of three keys in a row of keyboard assembly 10. FIG. 21 shows a vertical side view portion of keyboard assembly 10. Each of FIGS. 20–23 illustrate an embodiment of a tilting device that raises the rear of keyboard assembly 10 for a comfortable angle similar to that of desktop keyboards. FIG. 20 shows tilt fingers 26 extended when keyboard assembly 10 is in its fully expanded position and FIG. 23 shows tilt fingers 26 retracted when keyboard assembly 10 is closed. In FIG. 21, keyboard assembly 10 rests on a flat surface at the bottom tips of fingers 26 and the front edge of left housing 1 and right housing 2. Thus, the rear of keyboard assembly 10 is elevated to provide a comfortable angle for typing as shown in FIGS. 20 and 21. Each finger 26 is pivotally attached to the linkages 4 at hub 7 by a pin at this hub at the back side of keyboard assembly 10. Flanged pin 27 passes through hub 6. FIG. 22 shows the keyboard in a partially collapsed state. As keyboard assembly 10 is collapsed (FIG. 22), pin 27 slides in slot 28, until collapse is completed (FIG. 23).

Figure 24A:
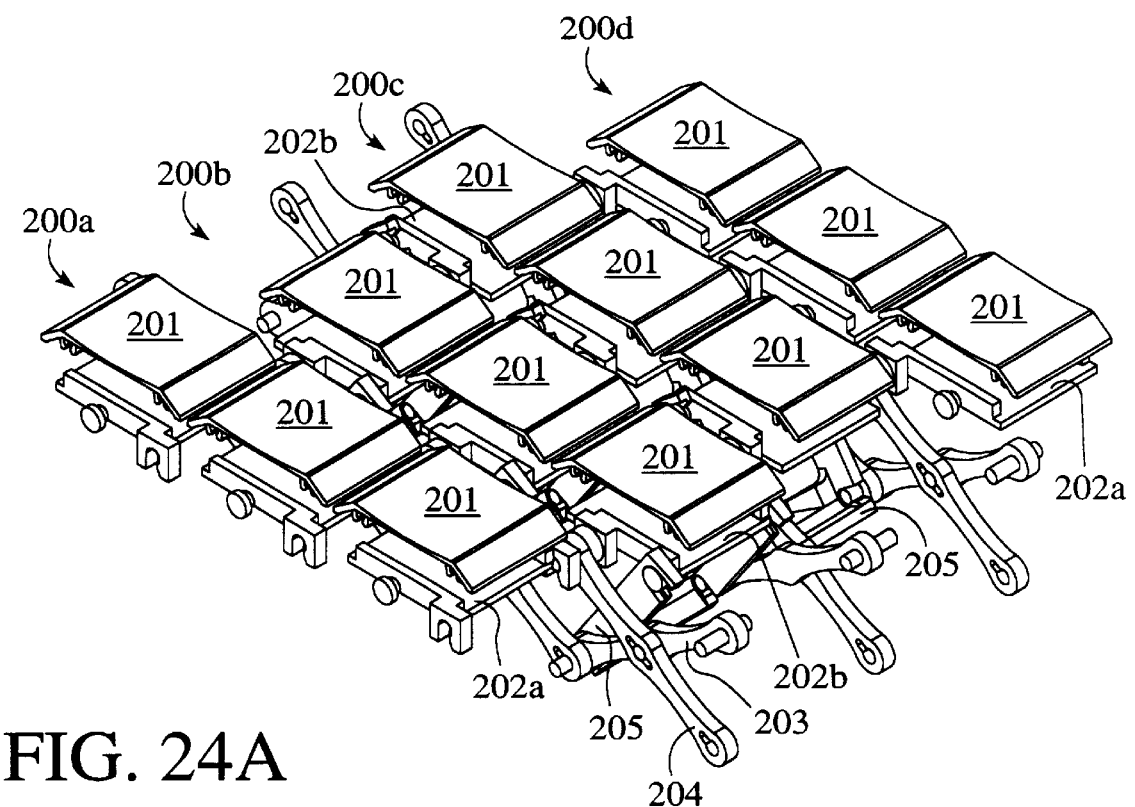
FIG. 24A is a top perspective view of a portion of an embodiment of a keyboard assembly in an expanded or open position in accordance with the invention.

FIG. 24A shows a portion of one embodiment of a collapsible keyboard in an expanded position. Each row of keys 200a–200d has keys that are formed by a key top coupled to a key base. Rows 200a and 200d have keys formed by a key top 201 coupled to a key base 202a. Rows 200b and 200c have keys formed by key top 201 coupled to a key base 202b. In one embodiment, the key tops are supported by the key bases through conventional butterfly linkages (not shown) which allow the key tops to be pressed down. An interconnected series of male struts 203 rotatably coupled to female struts 204 in an X pattern connects adjacent rows. For example, key base 202a in row 200a is rotatably coupled to key base 202b in row 200b by female strut 204 and a male strut in an adjacent X pattern. Actuators 205 to facilitate key rotation are shown rotatably coupled to male struts 203, to a female strut in an adjacent X pattern, and to key bases 202b in rows 200b and 200c. Actuators 205 operate in a similar manner as arms 8, as described with reference to FIGS. 7–9. In one embodiment, male struts 203, female struts 204, actuators 205, and key bases 202a and 202b snap together for easier assembly. Although the same key top 201 is shown for each key, it is appreciated that key tops of different sizes can be used. The male and female struts, actuator, and key bases are discussed in more detail below.

Figure 24B:
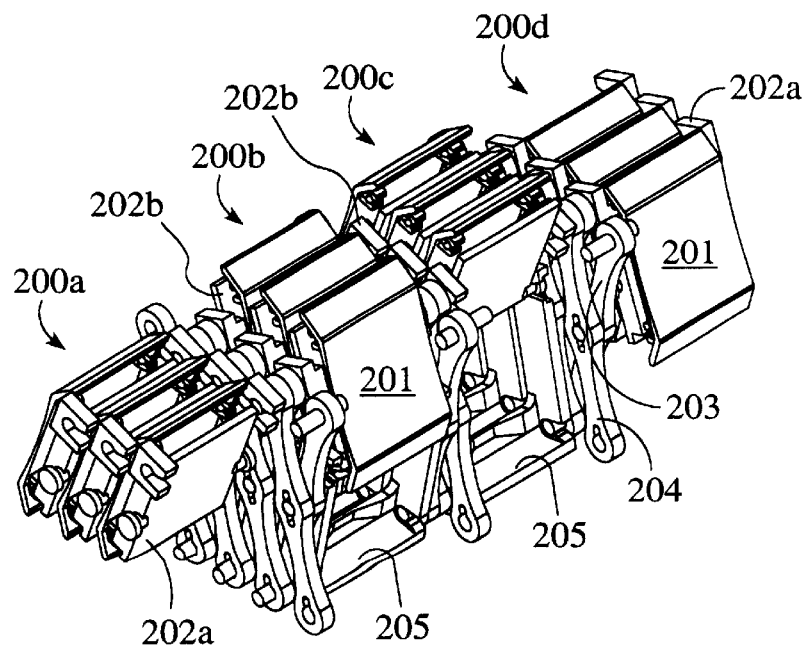
FIG. 24B is a top perspective view of the keyboard portion shown in FIG. 24A in a collapsed or closed position in accordance with the invention.

FIG. 24B shows the keyboard portion of FIG. 24A in a collapsed position. The keys in rows 200a and 200c have rotated counter-clockwise, while the keys in rows 200b and 200d have rotated clockwise. Male struts 203 remain substantially parallel with one another, as do female struts 204, but the space between adjacent male struts 203 and between adjacent female struts 204 is decreased to give the collapsed position a thin profile.

Figure 25A:
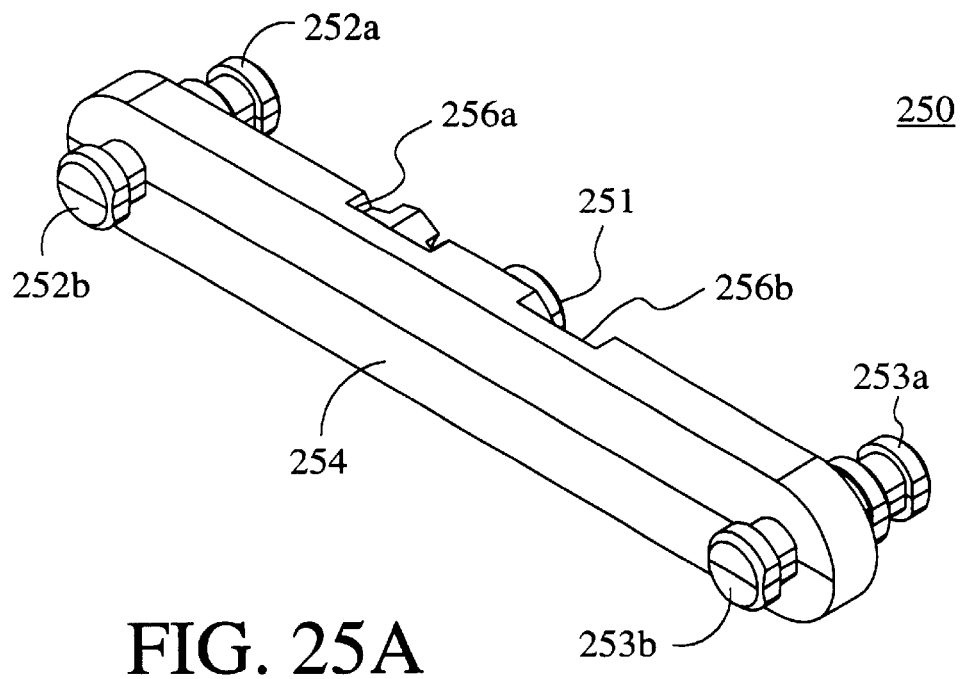
FIGS. 25A and 25B are two perspective views of a male strut used in a keyboard assembly in accordance with the invention.
Figure 25B:
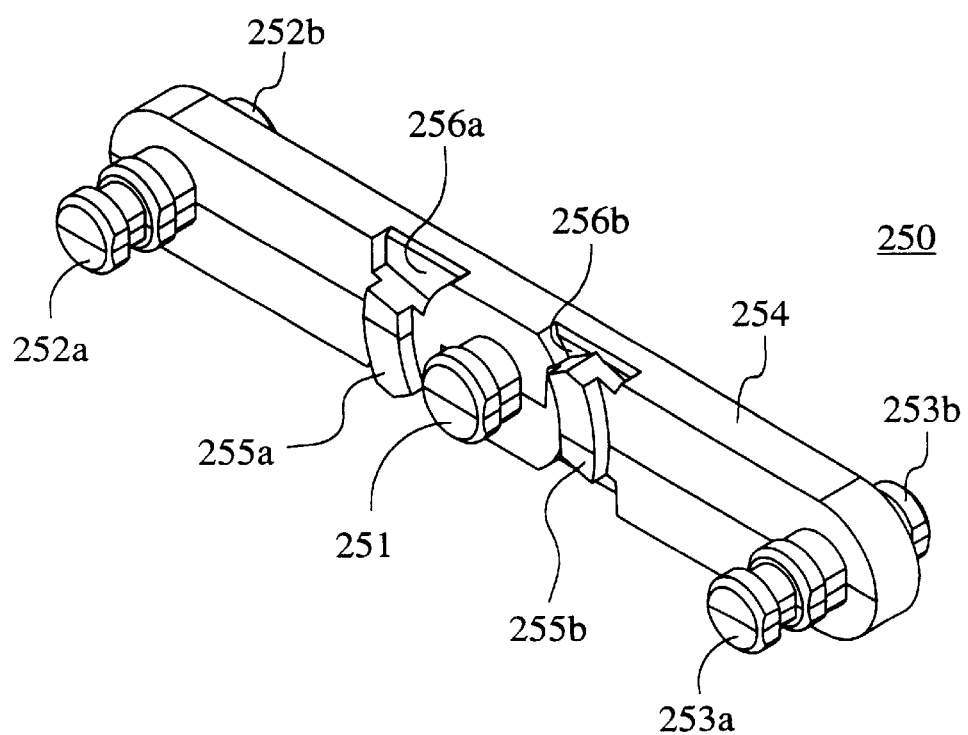

FIGS. 25A and 25B show two different views of a male strut or leg 250. The male strut 250 may be used as the male strut of FIGS. 24A and 24B. Main body 254 has protrusions 252a, 252b and 253a, 253b extending orthogonally from both ends of main body 254. Protrusions 252a and 253a are longer than protrusions 252b and 253b, respectively. A protrusion 251 extends orthogonally from approximately the middle of one side of main body 254. In one embodiment, protrusions 251, 252a, 252b, 253a, 253b are ridged to provide the snap-together feature mentioned above. The flange or ridge at the end of these protrusions has a diameter which is slightly larger than the corresponding through hole in the female strut which is designed to engage the protrusion. Once a protrusion is snapped into its corresponding hole, the ridge retains the male and female struts. Extension stops 255a and 255b extend from grooves 256a and 256b, respectively, around protrusion 251. Extension stops 255a and 255b limit keyboard expansion by stopping the rotation of a coupled female strut. In another embodiment, male strut 250 is symmetric about an axis perpendicular to the length of male strut 250, where the axis passes through the center of male strut 250.

Figure 26A:
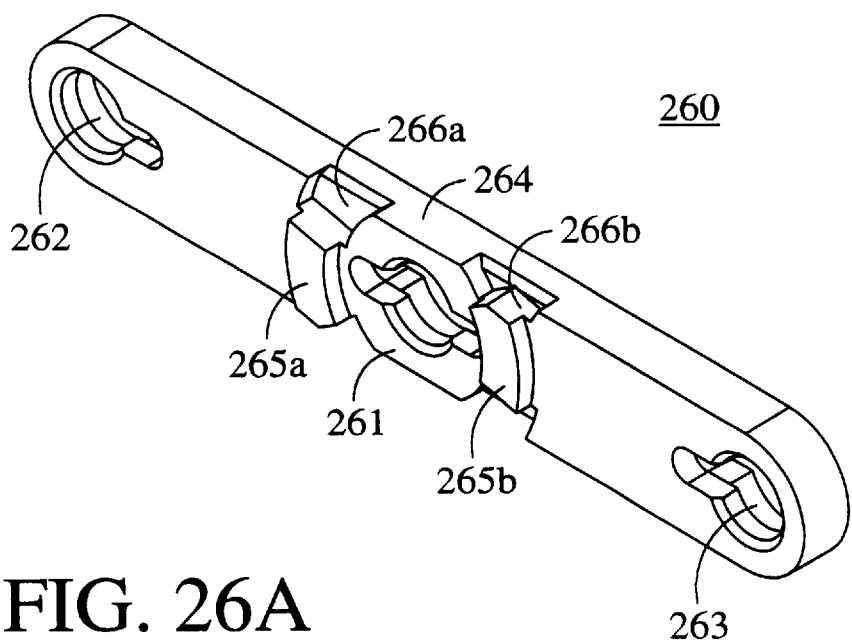
FIGS. 26A and 26B are two perspective views of a female strut used in a keyboard assembly in accordance with the invention.
Figure 26B:
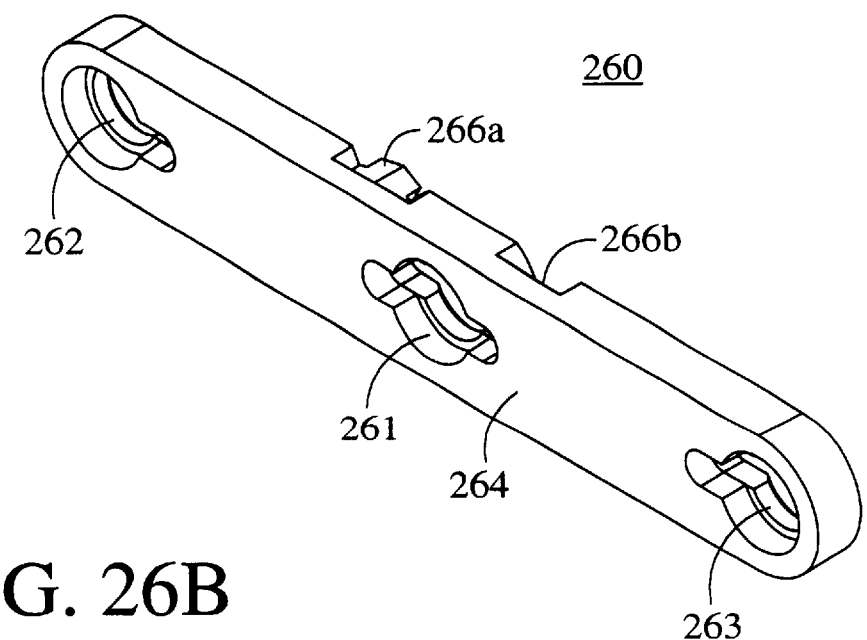

FIGS. 26A and 26B show two different views of a female strut or leg 260 that, in one embodiment, is coupled to male strut 250. The female strut 260 may be used as the female strut of FIGS. 24A and 24B. Main body 264 has end through holes 262 and 263 for mating with the protrusions of male struts in neighboring male-female X linkages when an interconnected series of X linkages is formed. A middle through hole 261 accepts protrusion 251 when male strut 250 and female strut 260 are coupled together to form an X linkage. Male strut 250 and female strut 260 are thus complementary. Extension stops 265a and 265b extending from grooves 266a and 266b, respectively, around middle through hole 261 impinge upon extension stops 255b and 255a of male strut 250 as keyboard expansion occurs. In one embodiment, female strut 260 is symmetric about an axis perpendicular to the length of female strut 260, where the axis passes through the center of female strut 260.

Figure 27A:
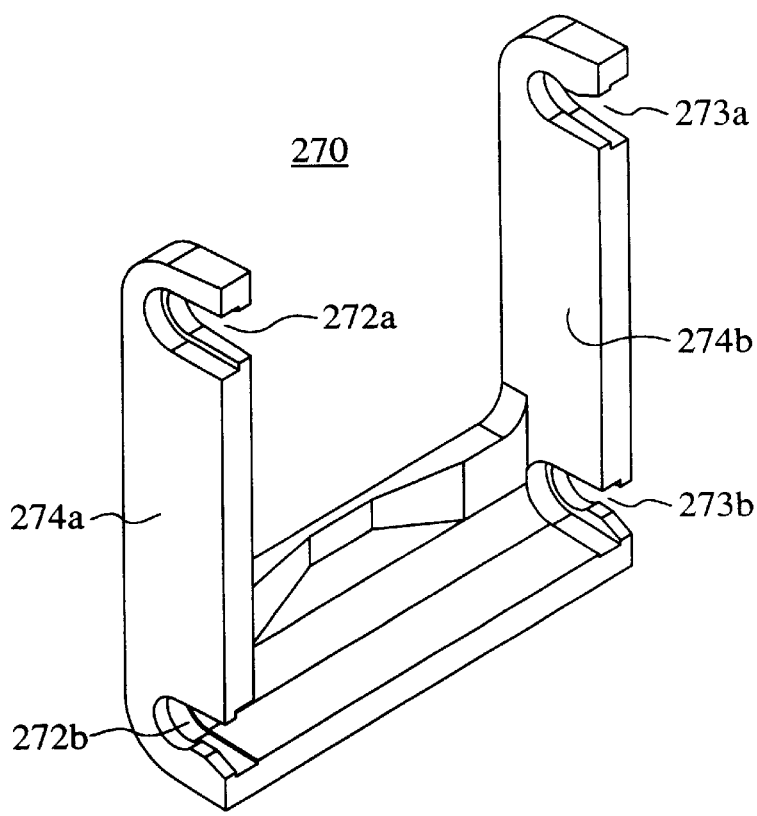
FIGS. 27A and 27B are two perspective views of an actuator used in a keyboard assembly in accordance with the invention.
Figure 27B:
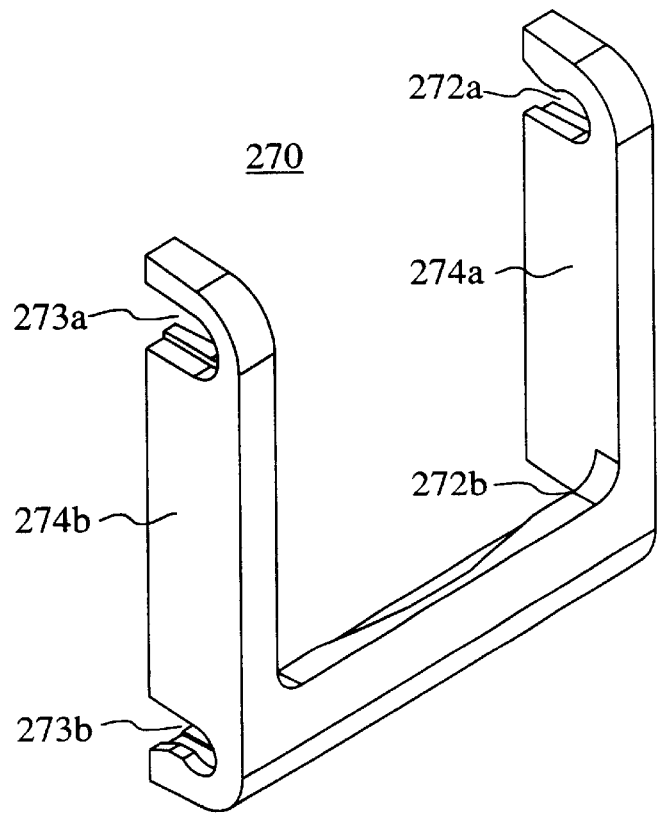

FIGS. 27A and 27B show two different views of an actuator 270. Actuator 270 has arms 274a and 274b. Arm 274a has grooves 272a and 272b. Arm 274b has grooves 273a and 273b. Grooves 272a and 273a mate with protrusions on a key base, and grooves 272b and 273b mate with one of protrusions 252b and 253b on male struts 250 in adjacent rows, depending on the orientation of male struts 250.

Figure 28A:
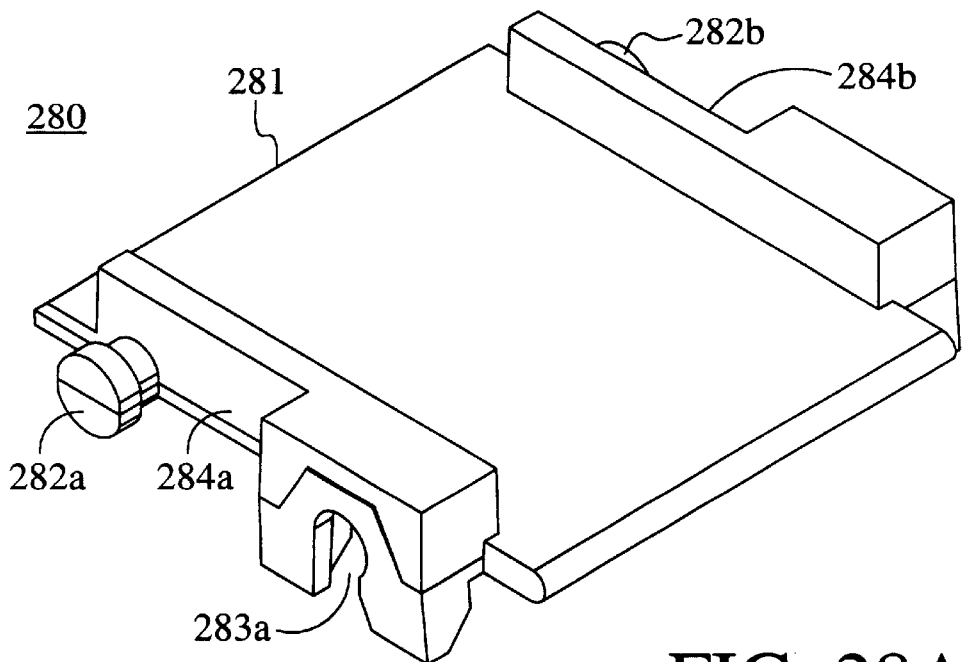
FIGS. 28A and 28B are two perspective views of a key base used in a keyboard assembly in accordance with the invention.
Figure 28B:
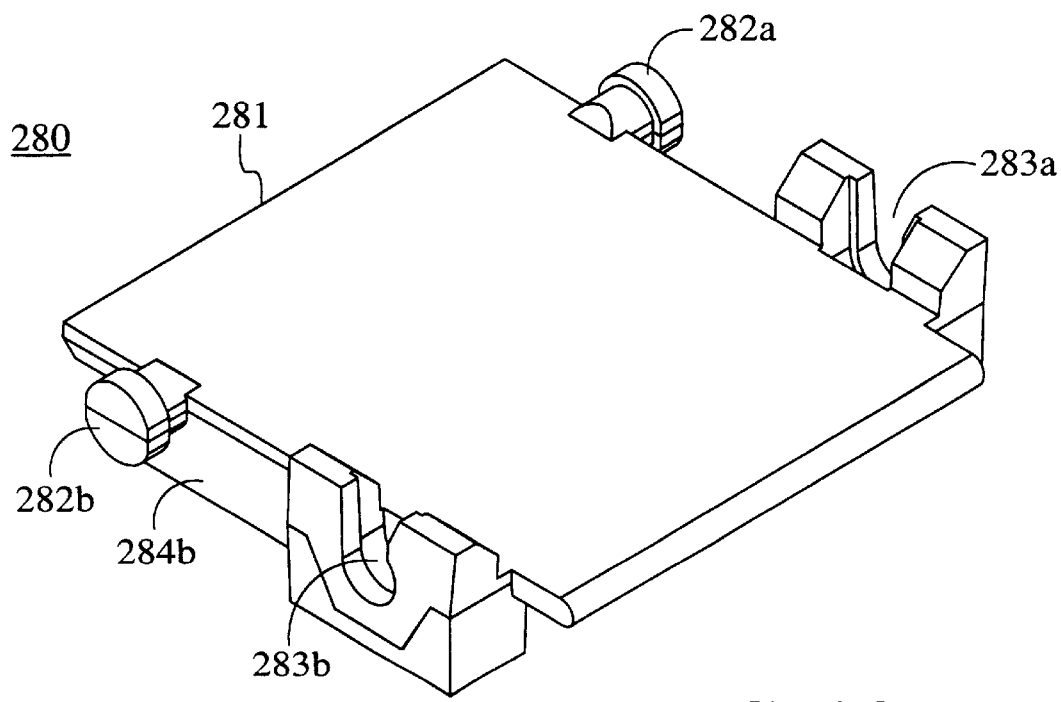

FIGS. 28A and 28B show top and bottom views, respectively, of a key base 280. Flanges 284a and 284b extend out, above and below from opposite sides of base member 281. Protrusion 282a extends out from one end of flange 284a, and groove 283a reaches partially through flange 284a. Similarly, protrusion 282b extends out from one end of flange 284b, and groove 283b reaches partially through flange 284b. Protrusions 282a and 282b mate with grooves 273a and 272a, respectively, of actuator 270. In one embodiment, protrusions 282a and 282b are ridged to provide a snap-together assembly with actuator 270. Grooves 283a and 283b accept one of protrusions 252b and 253b of male strut 250, depending on the orientation of male strut 250. In one embodiment, key base 280 is coupled to key top 201 to form the keys in rows 200b and 200c. FIGS. 11 and 12 show one example of a way to couple a key top to a key base using a conventional butterfly linkage.

Figure 29A:
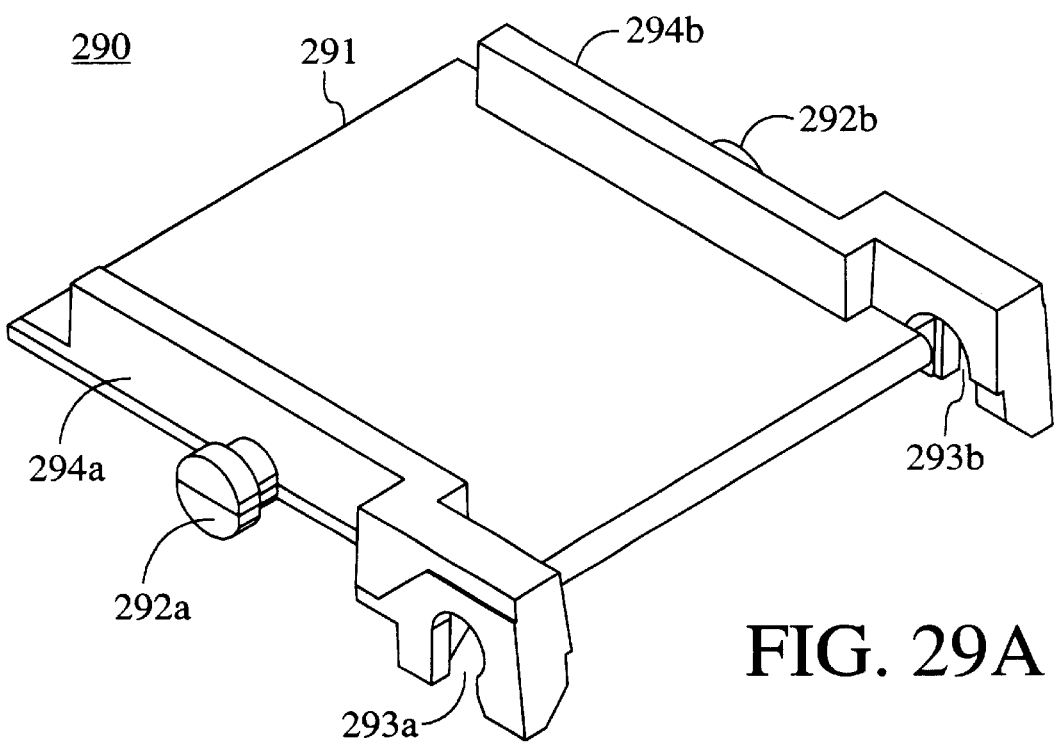
FIGS. 29A and 29B are two perspective views of another key base used in a keyboard assembly in accordance with the invention.
Figure 29B:
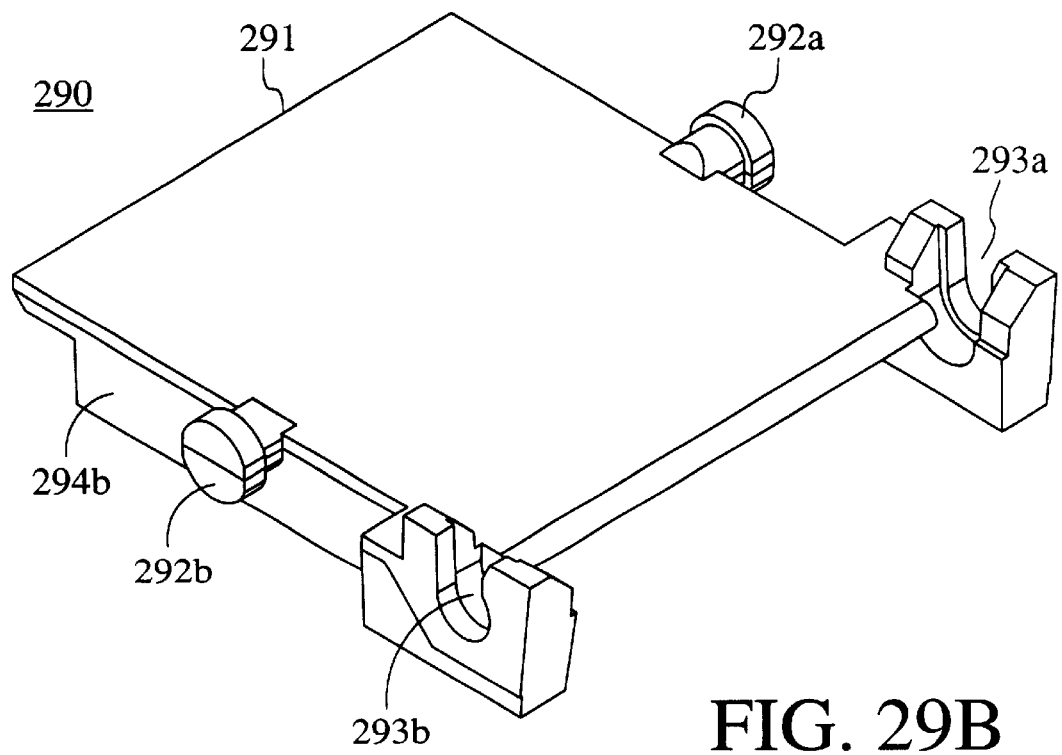

FIGS. 29A and 29B show top and bottom views, respectively, of a key base 290. Key base 290 differs from key base 280 primarily in the position of the protrusion 292a and protrusion 292b; these different positions allow for different pivot points for the different keys and allow a collapsible keyboard to have different size keys and still collapse. Flanges 294a and 294b extend out, above and below from opposite sides of base member 291. Protrusion 292a extends out from approximately the middle of flange 294a, and groove 293a reaches partially through flange 294a. Similarly protrusion 292b extends out from approximately the middle of flange 294b, and groove 293b reaches partially through flange 294b. Protrusions 292a and 292b mate with through holes in a female strut or in some cases a groove in an actuator. Grooves 293a and 293b accept one of protrusions 252a and 253a of male strut 250, depending on the orientation of male strut 250. It should be noted that either of protrusions 252a and 253a of male strut 250 is long enough to mate with both an end through hole 262, 263 of female strut 260 and a groove 293a, 293b. In one embodiment, key base 290 is coupled to key top 201 to form the keys in rows 200a and 200d.

FIGS. 30A–30C show a side view of a portion of a row of keys in one embodiment of a collapsible keyboard as the keyboard is collapsed. A key clip 302 is disposed between a key top 301 and a key base 304. Although it is not shown for purposes of clarity, in one embodiment, a butterfly linkage couples key top 301 to key clip 302. Key clip 302 holds a flex circuit 303 (e.g. a flexible bus of conductors) flat against key base 304 by snapping onto key base 304 with flex circuit 303 in between. A hook 305 at one end of key clip 302 guides flex circuit 303 down between adjacent keys, thereby allowing the keyboard to collapse more easily to a compact, closed position. The clip 302 relieves stress in the portions of the flexible circuit 303 which bend by keeping one portion fixed (around the edge of the key base) and another portion loose (with a wide angle for bending).

Figure 31A:
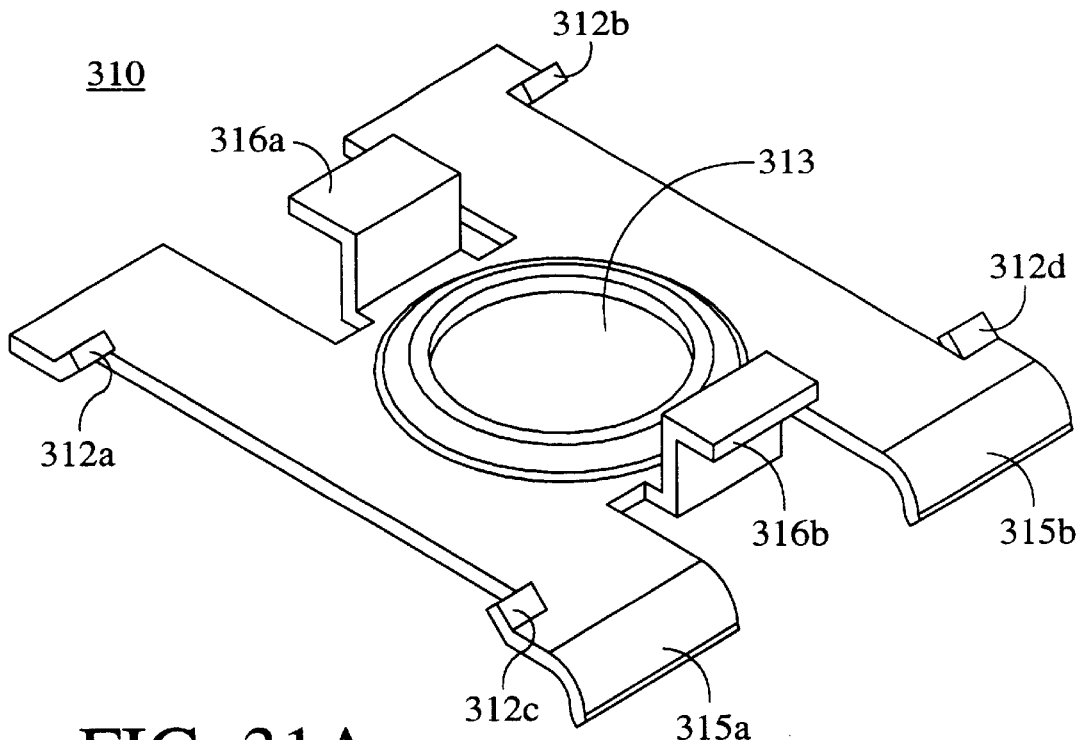
FIGS. 31A and 31B are two perspective views of a key clip used in a keyboard assembly in accordance with the invention.
Figure 31B:
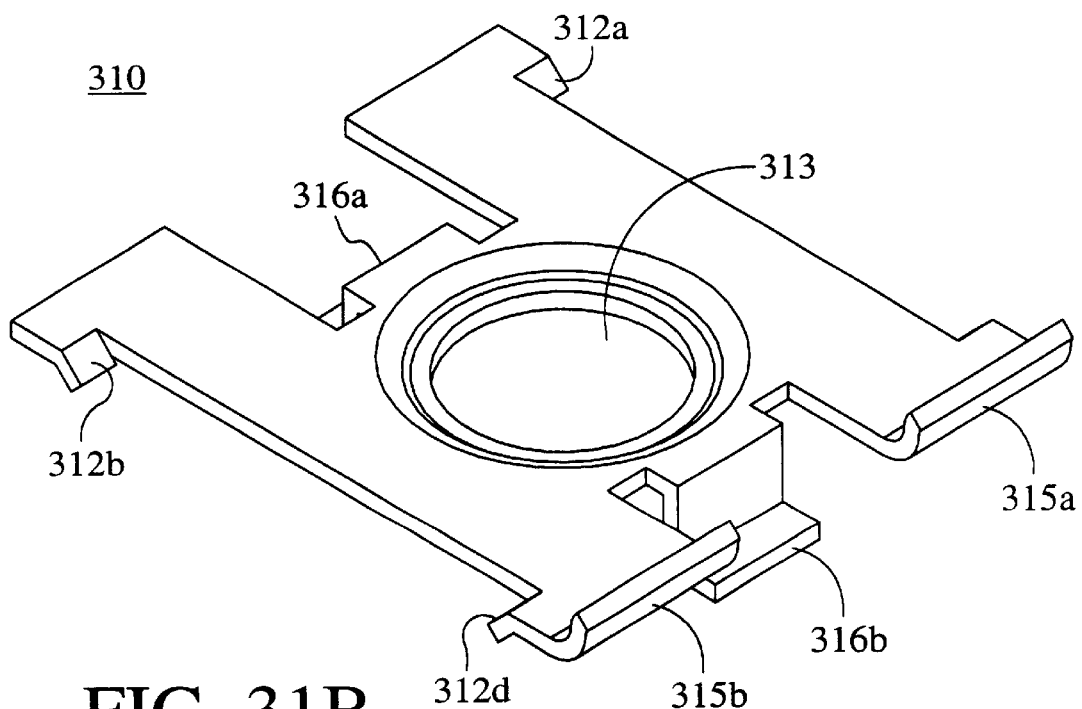

FIGS. 31A and 31B show top and bottom views, respectively, of a key clip 310. Tabs 312a–312d snap key clip 310 onto a key base (not shown) as key clip 310 is pressed against the key base. In one exemplary embodiment, a flex circuit is laid on top of the key base before the key clip is snapped into place onto the key base. Once key clip 310 is snapped onto the key base, a flex circuit (not shown) located between key clip 310 and the key base is held flat against the key base. Guide arms 315a and 315b are curved downward to force the flex circuit down between adjacent keys. In one embodiment, each guide arm 315a and 315b guides separate layers of a flex circuit. Opening 313 allows contact to be made with the flex circuit. Hooks 316a and 316b secure a butterfly linkage (not shown) that is coupled to and supports a key top.

Figure 32:
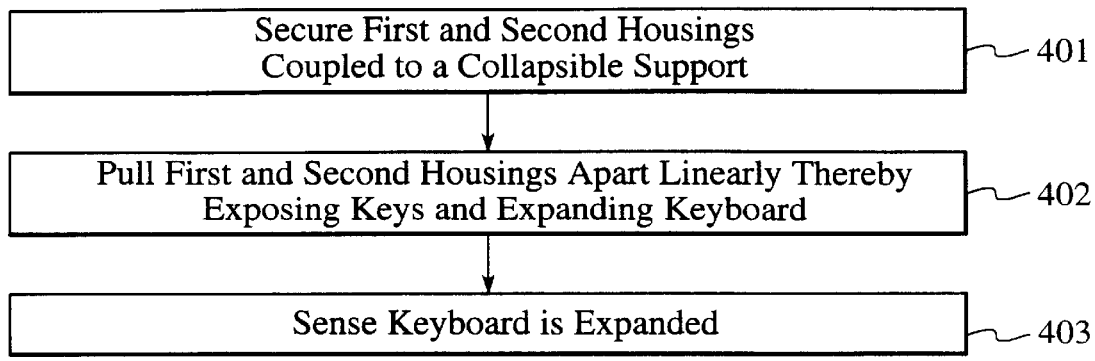
FIG. 32 is a flowchart of a method performed in accordance with the invention.

FIG. 32 shows an example of a method of using a collapsible keyboard in accordance with the teachings of the present invention. In step 401, a first housing and a second housing are secured by a user's hands. Both housings are coupled to a collapsible support that supports a number of keys. In step 402, the housings are pulled apart linearly such that the keys are exposed and the keyboard is expanded. In step 403, the expansion of the keyboard is sensed (e.g. by a limit switch).

Figure 33:
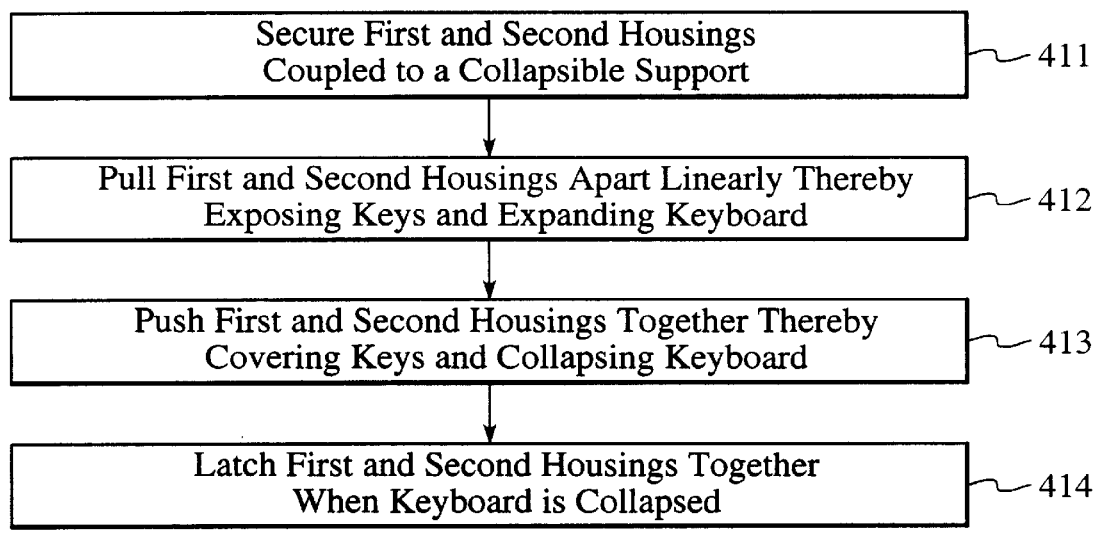
FIG. 33 is a flowchart of another method performed in accordance with the invention.

FIG. 33 shows another example of a method of using a collapsible keyboard in accordance with the teachings of the present invention. In step 411, a first housing and a second housing are secured by a user's hands. Both housings are coupled to a collapsible support that supports a number of keys. In step 412, the housings are pulled apart linearly such that the keys are exposed and the keyboard is expanded. In step 413, the housings are pushed together such that substantially all of the keys are covered and the keyboard is collapsed. In step 414, the housings are latched together when the keyboard is collapsed.

Figure 34:
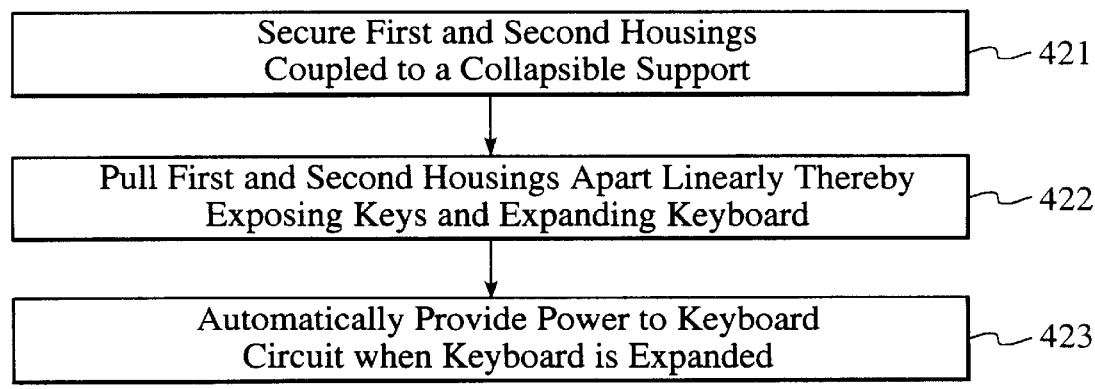
FIG. 34 is a flowchart of yet another method performed in accordance with the invention.

FIG. 34 shows yet another example of a method of using a collapsible keyboard in accordance with the teachings of the present invention. In step 421, a first housing and a second housing are secured, where both housings are coupled to a collapsible support that supports a number of keys. In step 422, the housings are pulled apart linearly such that the keys are exposed and the keyboard is expanded. In step 423, power is automatically provided to a keyboard circuit when the keyboard is expanded.

Keyboard assemblies such as keyboard assembly 10, which is described above, normally require some associated electrical circuitry to detect the actuation (e.g. pressing) of the various keys and the generation of appropriate signals which indicate the identity of the actuated key. Typically, each key has an associated electrical switch which produces an electrical change of state (e.g. electrically open to electrically closed) when the associated key top is depressed.

Figure 35:
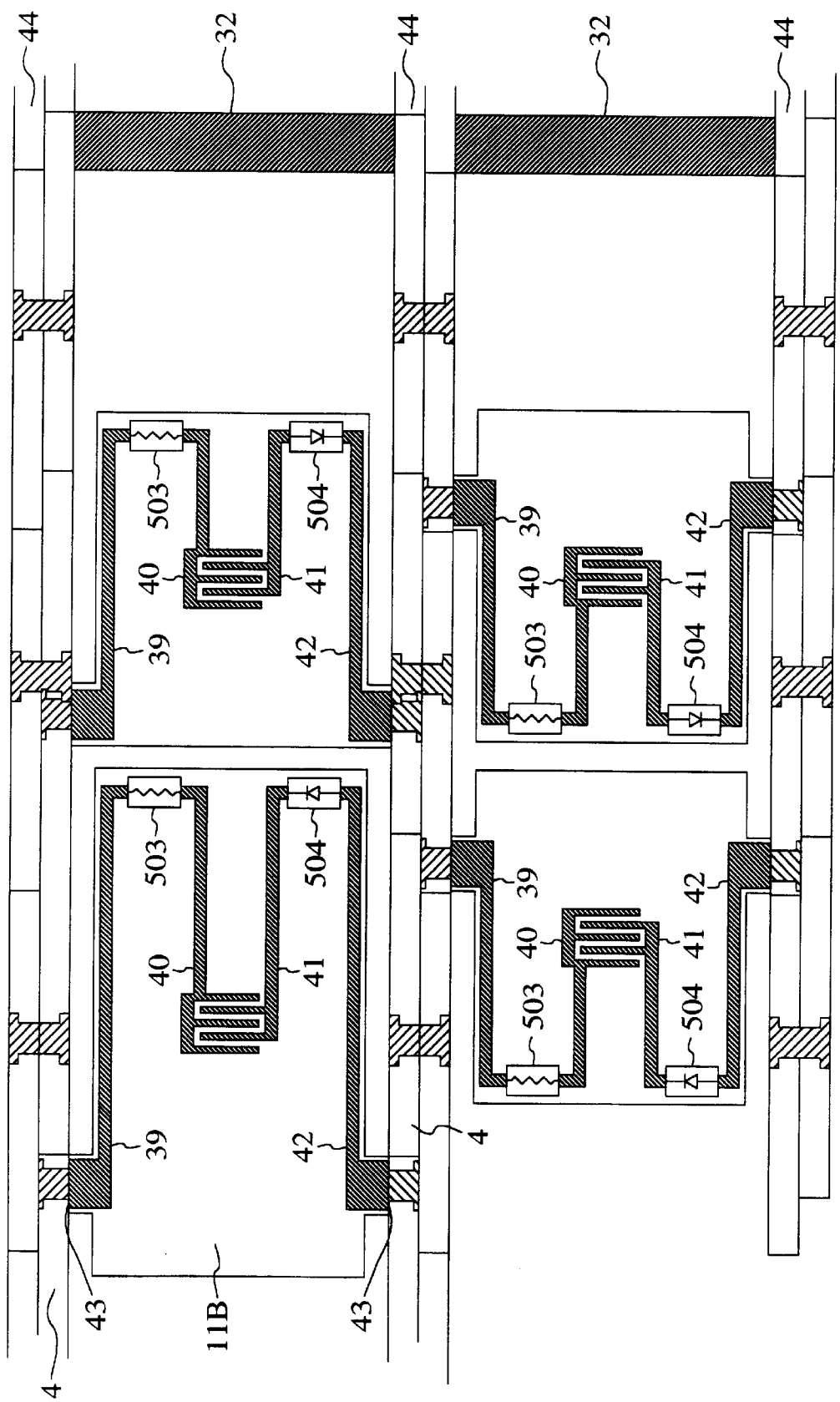
FIG. 35 is a top view of an embodiment of the electrical layout of four keys of the keyboard assembly in accordance with the invention.

In one embodiment of the keyboard assembly of the invention, each key base 11b includes electrical elements 39, 40, 41, and 42 and resistor 503 and diode 504 as shown in FIG. 35. FIG. 35 illustrates an electrical configuration of four keys of keyboard assembly 10. Conductive paths (e.g. conductive strips) or electrodes 39 and 42 bend at right angles over the face of key shoulders 43 on each key base 11b and electrically contact row linkages 4. On each key base 11b, electrode 39 is coupled to one terminal of resistor 503, and electrode 40 is coupled to the other terminal of resistor 503. On each key base 11b, electrode 40 is disposed physically near, but electrically isolated from, electrode 41. Electrodes 40 and 41 are electrically coupled (e.g. "shorted") when the key top is pressed toward the key base; typically, when the key top is pressed, an electrode coupled to the key top shorts electrodes 40 and 41, thereby closing the switch between electrodes 40 and 41. Electrode 41 on each key base 11b is coupled to one terminal of diode 504, and the other terminal of diode 504 is coupled to electrode 42. Linkages 4 are made of a conductive material such as, for example, steel, aluminum, or plastic which is conductive or which includes an electrically conductive material. Each row of linkages 4 acts as a single wire electrical bus 44. Each bus 44 is connected to a keyboard controller (not shown in FIG. 24) which could be located in one side of the keyboard assembly housing. A cursor control device (such as a trackpad) and battery could be located in this same side of the housing or the other housing side. In another embodiment, a data transfer port is electrically connected to each bus 44 through the keyboard controller or any other appropriate interface for communicating with a computer system. The data transfer port may be a universal serial bus (USB) port or a "Firewire" port such as a port which substantially complies with IEEE Standard 1394.

In yet another embodiment, key bases 11b and row spacing sleeves 32 (see FIGS. 13 and 35) are made of a non-conductive material, such as, for example, plastic. Other materials (e.g. rod 31) in the keyboard assembly 10 which may serve as an electrical path from one row of linkages 4 to another row of linkages 4 is also made from non-conductive materials so that these rows remain electrically isolated. Hence, each row is electrically isolated from its adjacent row, although they share a common framework of conductive linkages.

Figure 36:
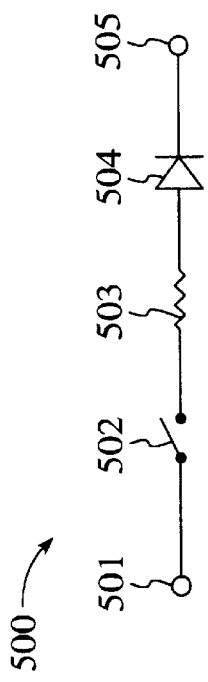
FIG. 36 is a schematic circuit diagram of an embodiment of a key encoder for a key assembly for a keyboard assembly in accordance with the invention.

FIG. 36 shows a schematic diagram of one example of a typical key encoder circuit 500 for a key. In the embodiment described herein, each key assembly, having a key top 11a and a key base 11b, contains a key encoder circuit consisting of a key switch 502, a resistor 503, a diode 504, and two terminals 501 and 505. In one embodiment, key switch 502 (formed by electrodes 40, 41 and conductive face 45) is normally open and is closed when key top 11a is pressed downward toward key base 11b. Diode 504 determines the polarity of the key circuit. Resistor 503 determines the resistive load of the particular key 3 when switch 502 is closed and diode 504 is biased with the current flow. Terminal 501 is coupled to one bus 44 and terminal 502 is coupled to another bus 44.

Figure 37:
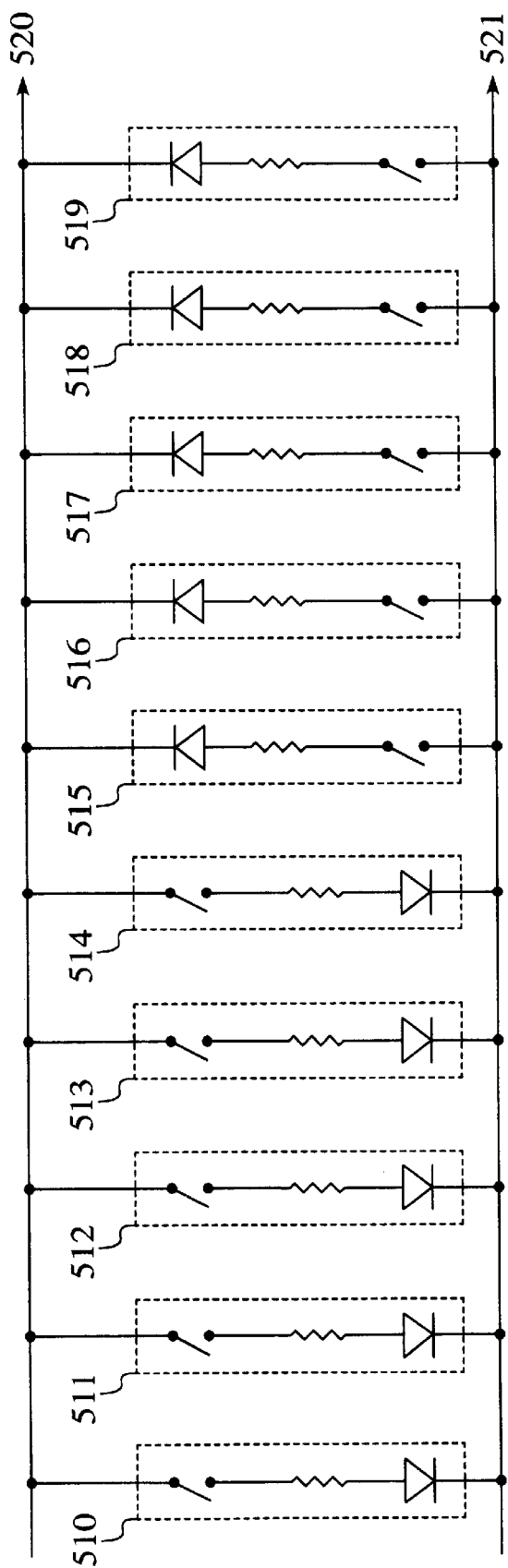
FIG. 37 is a schematic electrical block diagram of a typical row of keys of a keyboard assembly in accordance with an embodiment of the invention.

FIG. 37 illustrates a row of 10 keys. Although FIG. 37 shows 10 keys in the row, it is to be appreciated that the number of keys can be more or less than this amount. In this embodiment, each key assembly has one terminal connected to bus 520 (which may be a row of scissors linkages) and the other terminal connected to bus 521 (which may be an adjacent row of scissors linkages). Keys in the row are arranged in two polarity groups with half of the keys, e.g., 510, 511, 512, 513, and 514, in one polarity and the remaining keys, 515, 516, 517, 518, and 519, in the opposite polarity. Each key in a polarity group has a different resistive load and the resistor values differ exponentially from key to key. The keys are polarized by the diodes to allow the row of keys to be divided into two sections to keep the ratio of the highest and lowest resistor values within a reasonable range, particularly when there are a large number of keys coupled between adjacent busses 44.

Figure 38:
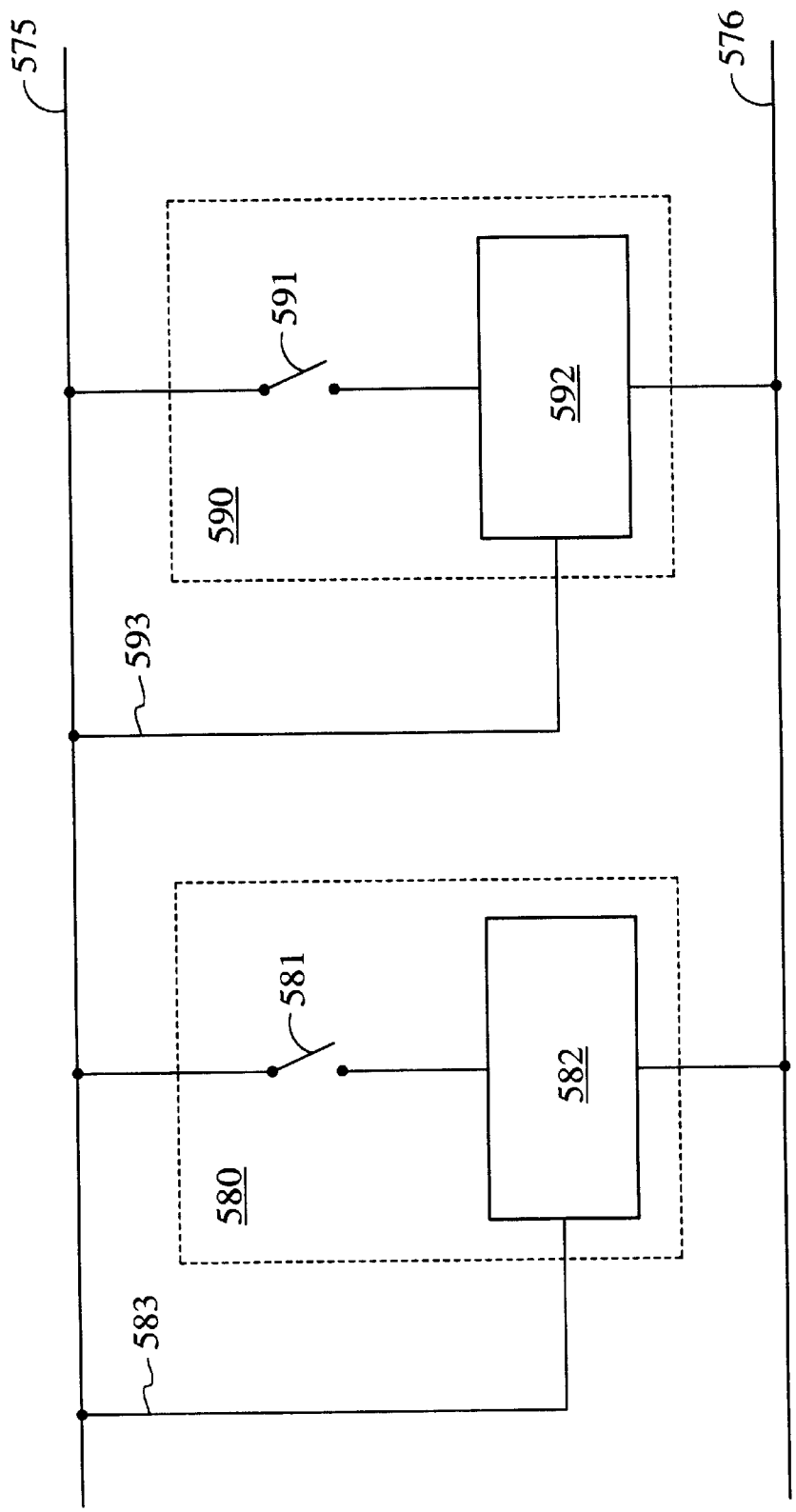
FIG. 38 is a schematic electrical block diagram of a partial row of keys of a keyboard assembly in accordance with the invention.

FIG. 38 shows a schematic block diagram of a partial row of keys of a keyboard assembly in accordance with the invention. Key assemblies 580 and 590 are coupled in parallel between conductive pathways or buses 575 and 576. Key assembly 580 includes a switch 581 coupled to a transponder 582, which receives power via wire 583. Key assembly 590 includes a switch 591 coupled to a transponder 592, which receives power via wire 593. Each transponder 582 and 592 is identified by a unique address. In one embodiment, a keyboard controller sends addresses down the row of keys through bus 575. For each key that is pressed, thereby closing the associated switch, the transponder coupled to that switch recognizes its address and responds through bus 576. In one embodiment, transponders 582 and 592 are ASIC (Application Specific Integrated Circuit) transponders. In one example, each transponder may transmit a unique, identifiable signal which is decoded by a keyboard interface which is coupled to buses 575 and 576.

Figure 39:
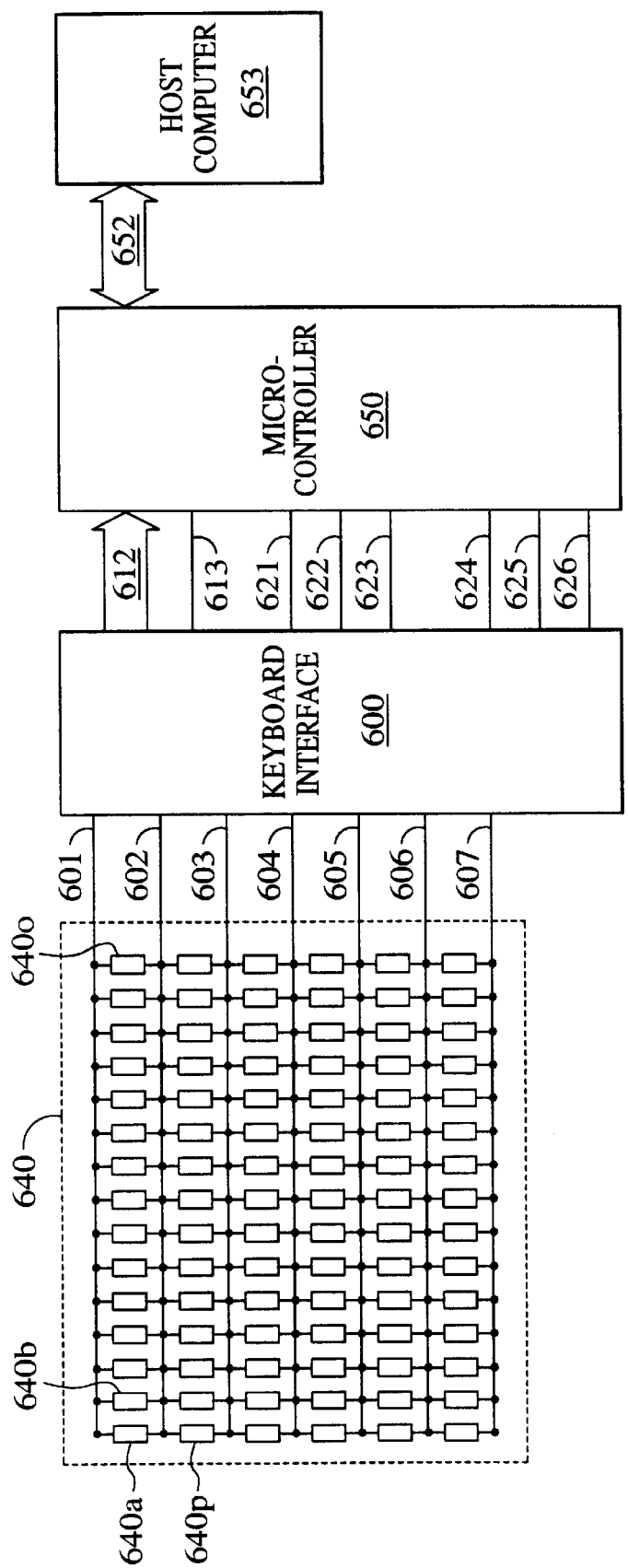
FIG. 39 is a schematic block diagram of a keyboard array coupled to a host computer through a keyboard interface and a microcontroller in accordance with an embodiment of the invention.

FIG. 39 shows a keyboard assembly consisting of an array of keys 640, a keyboard interface 600, and a microcontroller 650. In this example, array of keys 640 is 6 rows of 15 keys. Each key in each row is connected in parallel on a two-wire bus with adjacent rows of keys sharing a common bus. For example, the top row of keys (keys 640a, 640b, . . . 640o) are coupled in parallel on a two-wire bus formed by conductors 601 and 602. Conductor 601 may be a row of scissors linkages 4 and conductor 602 may be an adjacent row of scissors linkages 4. Thus, each of conductors 601–607 may represent one of the busses 44 shown in FIG. 35. This arrangement has an advantage over traditional two-dimensional key matrix arrays in that wire column buses are not required, thus decreasing the number of connections to keyboard interface 600. This is particularly advantageous when the keyboard is collapsible because wires in a collapsing structure may interfere with the mechanics of collapsing, and the wires may also deteriorate over time due to repeated expanding and collapsing of the keyboard.

Figure 40:
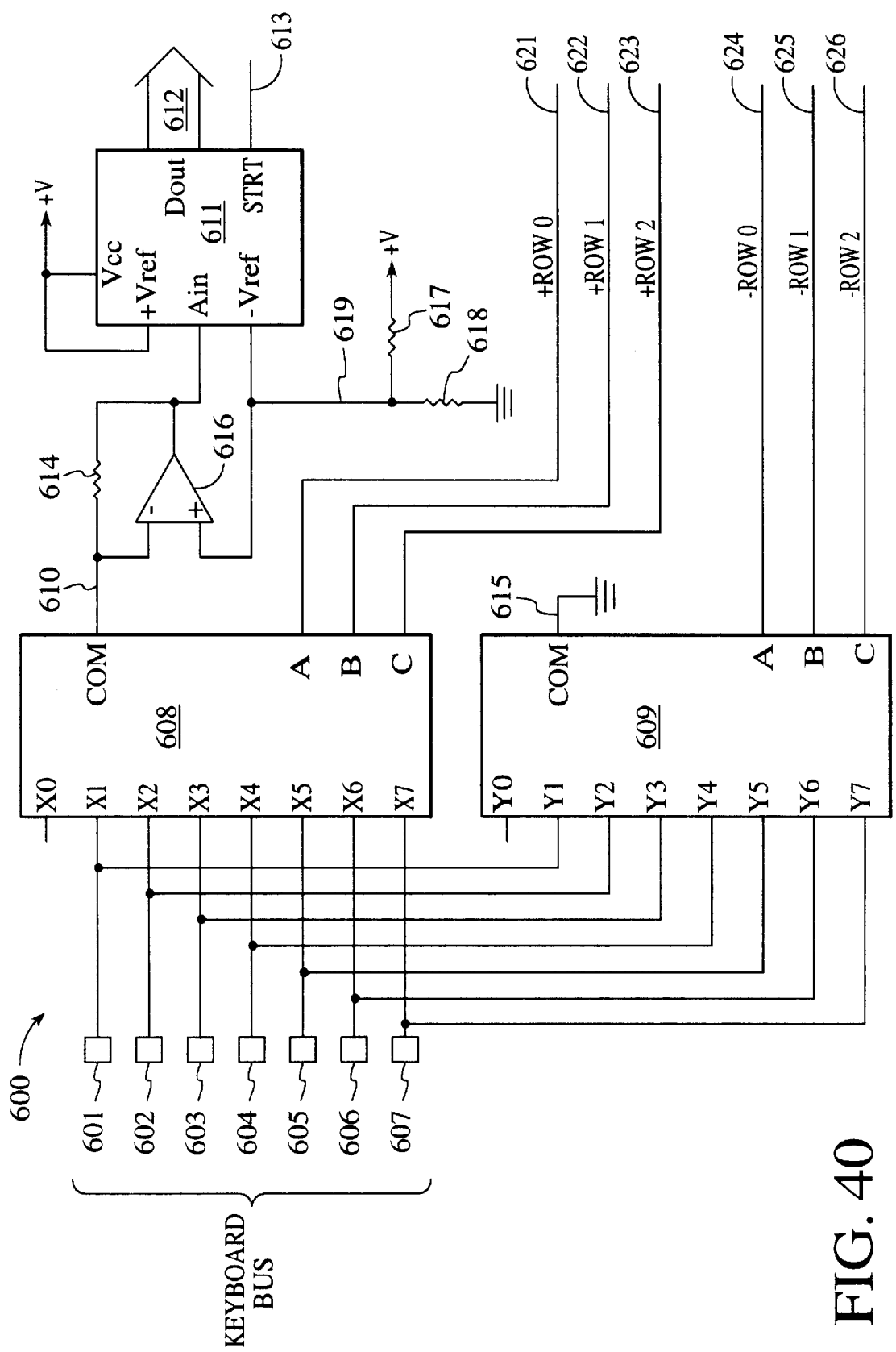
FIG. 40 is a schematic circuit diagram of a keyboard interface controller circuit in accordance with an embodiment of the invention.

FIG. 40 illustrates a keyboard interface 600 between array of keys 640 and microcontroller 650. In this embodiment, analog multiplexers 608 and 609 are used to enable one selected row of keys, in one polarity, at one time. Row address inputs 621, 622, and 623 of multiplexer 608 determine which keyboard bus is connected to positive current sense signal 610. Row address inputs 624, 625, and 626 of multiplexer 609 determine which keyboard bus is connected to ground. Resistor 614 and 618 create a voltage divider to generate a reference voltage signal 619 for analog-to-digital converter 611 and operational amplifier 616. Operational amplifier 616 outputs a voltage that is relative to the amount of current drawn at positive sense signal 610. Analog to digital converter 611 is used to digitize the amount of current drawn by the bus, by measuring the output voltage of operational amplifier 616, and makes a resulting digital value available to microcontroller 650 via bus 612. Signal 613 is provided by microcontroller 650 and is used to start a new analog-to-digital conversion when microcontroller 650 needs to measure the bus current.

In the embodiment of FIG. 40, in operation, microcontroller 650 scans the keyboard assembly, one row at a time, by sequentially addressing each row of keys using row address signals 621, 622, and 623 and 624, 625, and 626. The row addresses for multiplexers 608 and 609 differ by one, in order to connect keyboard buses in adjacent pairs (e.g., 601 and 602, 602 and 603, etc.). Keyboard buses 602, 603, 604, 605, and 606 are each shared by two rows of keys, decreasing the number of connections to the keyboard assembly. Each row is addressed twice, once in each polarity.

Figure 41:
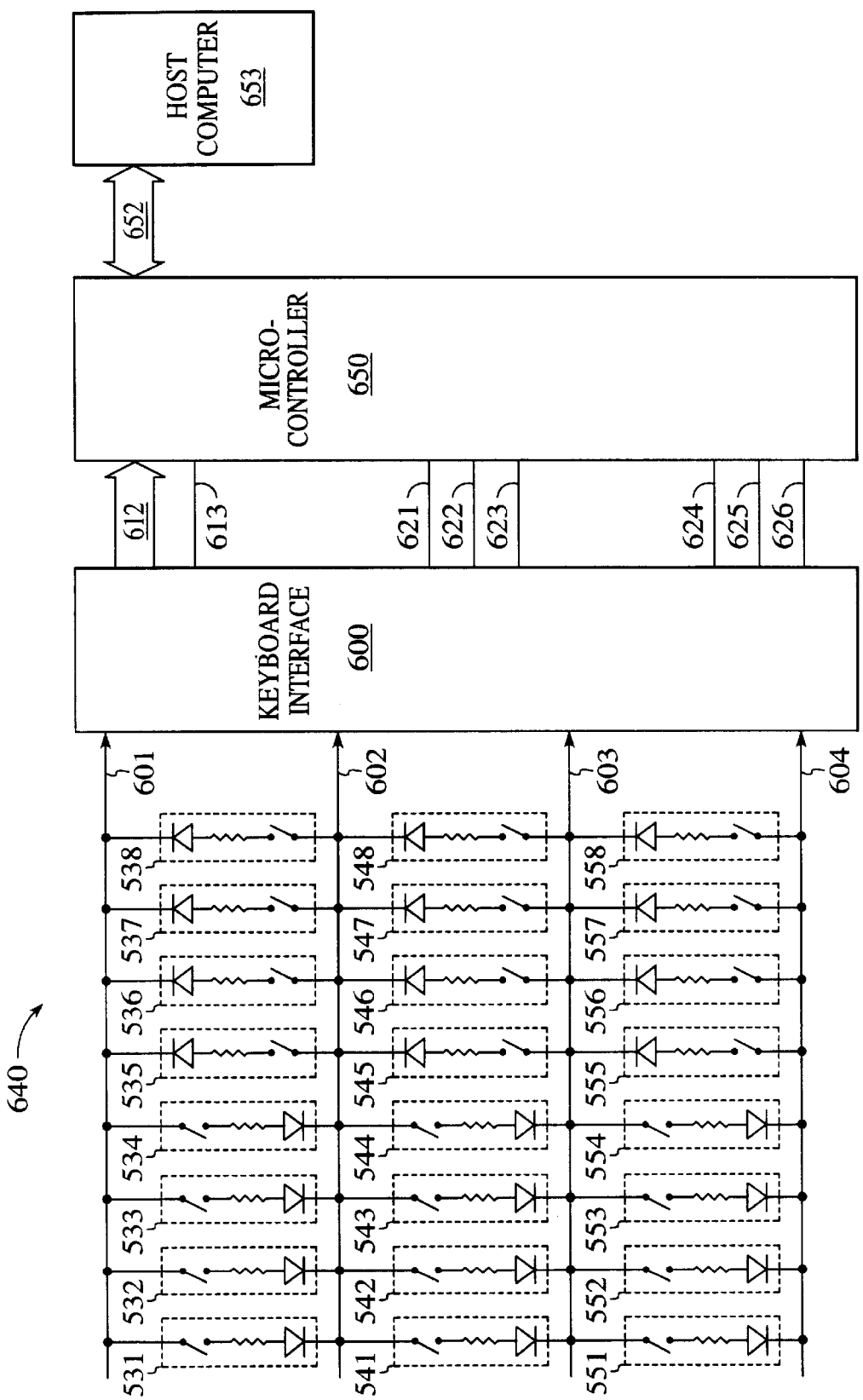
FIG. 41 is a schematic block diagram of three rows of keys coupled to a host computer in accordance with an embodiment of the invention.

FIG. 41 shows an example of keyboard 640 with three rows of eight keys each. Keyboard array 640 is coupled to keyboard interface 600 which is coupled to microcontroller 650 which is coupled to host computer 653 or another host device (e.g. a cellular phone, information appliance, personal digital assistant, etc.). On power-up initialization, microcontroller 650 sets all row addresses 621, 622, 623, 624, 625, and 626 to a low state. Microcontroller 650 begins scanning the first row of keys by setting row address signals 621, 622, and 623 to a binary value of one. This connects bus 601 to current source 610 and the input of analog-to-digital converter 611. Next, row address signals 624, 625, and 626 are set to a binary value of two, connecting bus 602 to ground. At this point, if any keys 531, 532, 533, or 534 are pressed, the individual key's diode will be forward biased, allowing current to flow through the key's resistor. At this same time, keys 535, 536, 537, and 538 have no effect on the bus since their diodes are reverse biased. Since each of the keys, 531, 532, 533, and 534 have a different resistor value, microcontroller 650 can determine which keys are pressed by analyzing the current flow as measured by the voltage drop across resistor 614. Microcontroller 650 then analyzes keys 535, 536, 537, and 538 by setting row address signals 621, 622, and 623 to a binary value of two and row address signals 624, 625, and 626 to a binary value of one. This reverses the polarity by connecting bus 602 to current source 610 and bus 601 to ground. In this state, keys 531, 532, 533, and 534 have no effect and current flow through keys 535, 536, 537, and 538 can be analyzed to determine which of the keys are pressed. This cycle completes scanning of the first row of keys and the remaining rows are scanned in a similar fashion. When microcontroller 650 finds a depressed key, it uses a table look-up method to locate the scan code for the key and sends the scan code to host computer 653 or other host device. This entire scanning process repeats indefinitely, causing the keyboard to be continuously scanned.

Each key in a polarity group has a unique resistor value and, when pressed, adds a specific resistive load to the bus. Any given combination of pressed keys along a row generates a unique and identifiable resistive load, allowing the keys pressed to be identified by the microcontroller 650. Therefore, the design allows accurate key identification even when multiple keys are pressed simultaneously along the same row.

Figure 42A:
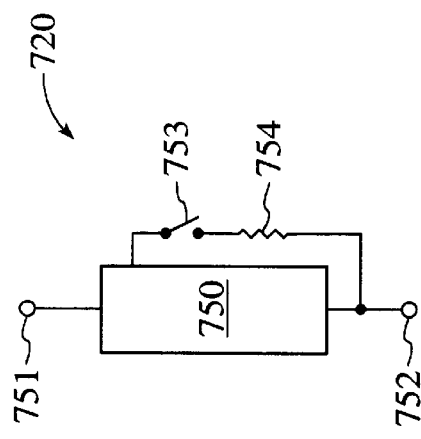
FIG. 42A is a schematic circuit diagram of an embodiment of a key circuit for a key assembly used in a keyboard assembly in accordance with the invention.

FIG. 42A shows a key encoder 720 of another embodiment of a key identification system. Key encoder 720 has a timer 750 with two terminals 751, 752. Timer 750 is coupled to a switch 753 and an electrical identifier 754, which in one embodiment, is a resistor. Timer 750 is a circuit with an output that is low when powered up and then becomes high after a predetermined time period, thereby reaching an active state. Switch 753 is closed when a corresponding key (not shown) is pressed. When switch 753 is closed and the output of timer 750 is high, electrical identifier 754 adds an identifying load. In other words, even if switch 753 is closed, the identifying signal provided by electrical identifier 754 does not become electrically visible until the output of timer 750 is high.

Figure 42B:
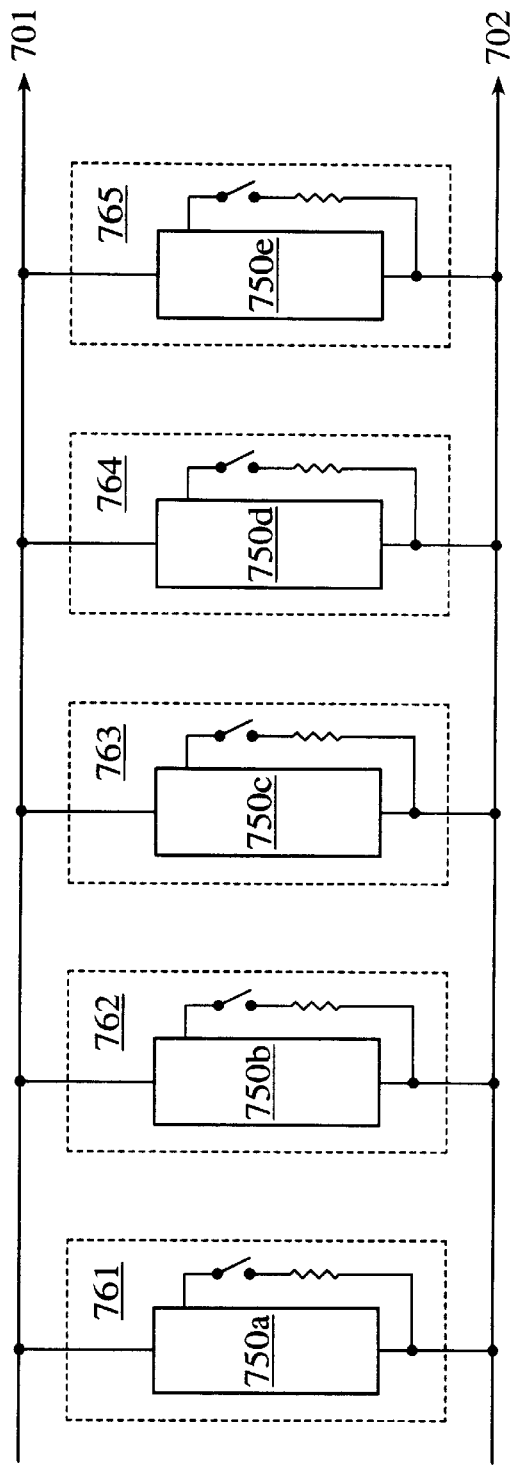
FIG. 42B is a schematic electrical block diagram of a partial row of keys of a keyboard assembly in accordance with the invention.

FIG. 42B shows a row of keys 761–765, each of which has a key encoder similar to key encoder 720 but with different timers 750a–750e. Each key 761–765 is coupled to buses 701, 702. Timers 750a–750e are preset to unique time constants such that identifying loads are not added at the same time. Although five keys are shown in a row, the present invention is not limited to any particular number of keys in a row.

Figure 43:
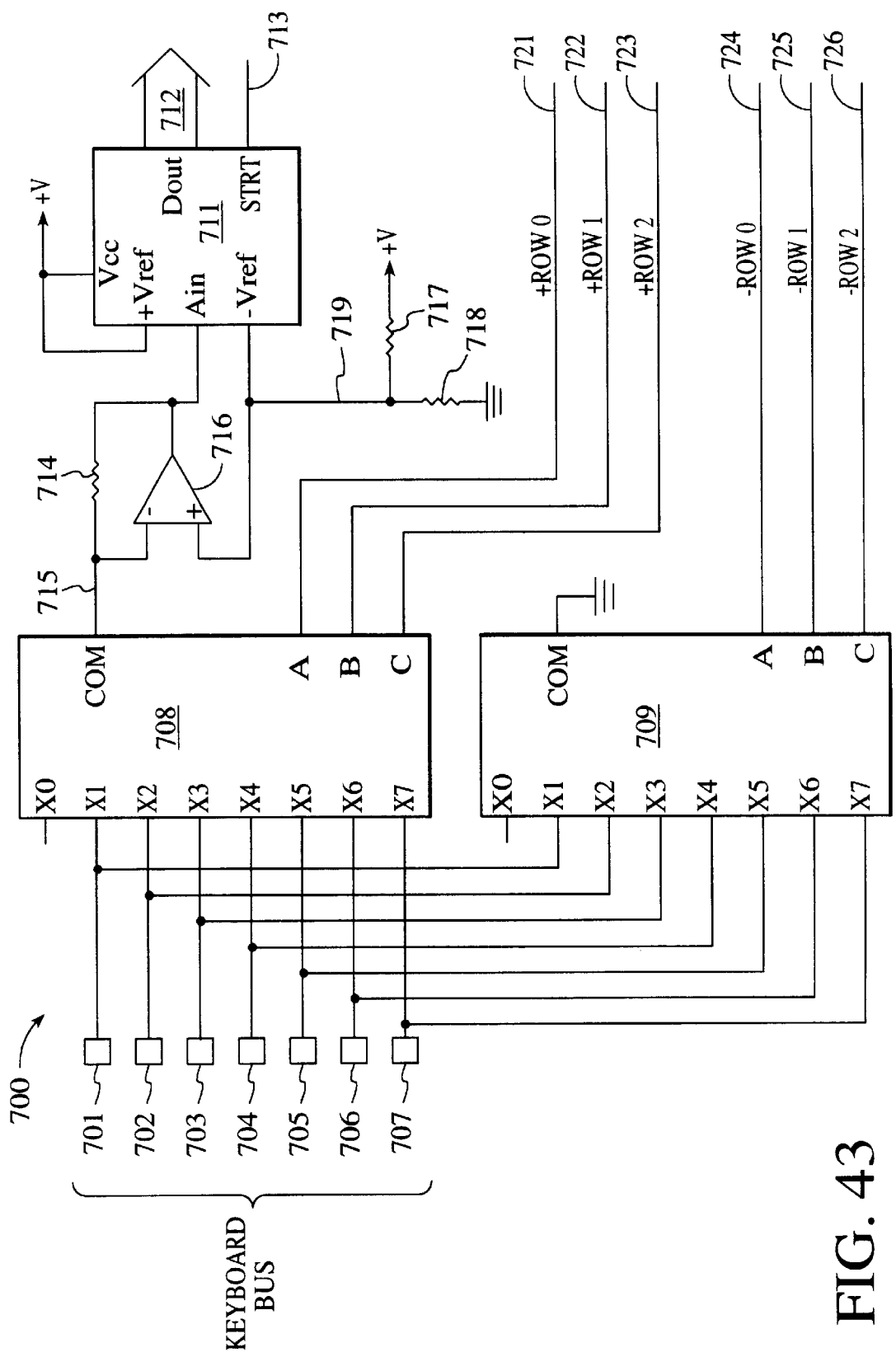
FIG. 43 is a schematic circuit diagram of a keyboard interface controller circuit used with a keyboard assembly in accordance with the invention.

FIG. 43 is a detailed illustration of a keyboard interface 700 used to couple an array of keys to a microcontroller and may be used with the key encoder shown in FIGS. 42A and 42B. Analog multiplexers 708, 709 are used to enable one selected row of keys at a time. Row address inputs 721–723 of multiplexer 708 determine which keyboard bus 701–707 is connected to a current sense signal 715. Row address inputs 724–726 of multiplexer 709 determine which keyboard bus is connected to ground. Resistors 717, 718 create a voltage divider to generate a reference voltage signal 719 for an analog-to-digital (A/D) converter 711 and an operational amplifier (op-amp) 716. Op-amp 716 outputs a voltage that is relative to the amount of current drawn at current sense signal 715. A/D converter 711 digitizes the amount of current drawn by the bus connected to current sense signal 715 by measuring and converting the output voltage of op-amp 716. The resulting digital value is sent to the microcontroller by a bus 712. The microcontroller provides an A/D sample clock signal 713 when the microcontroller needs to measure the bus current again.

Figure 44:
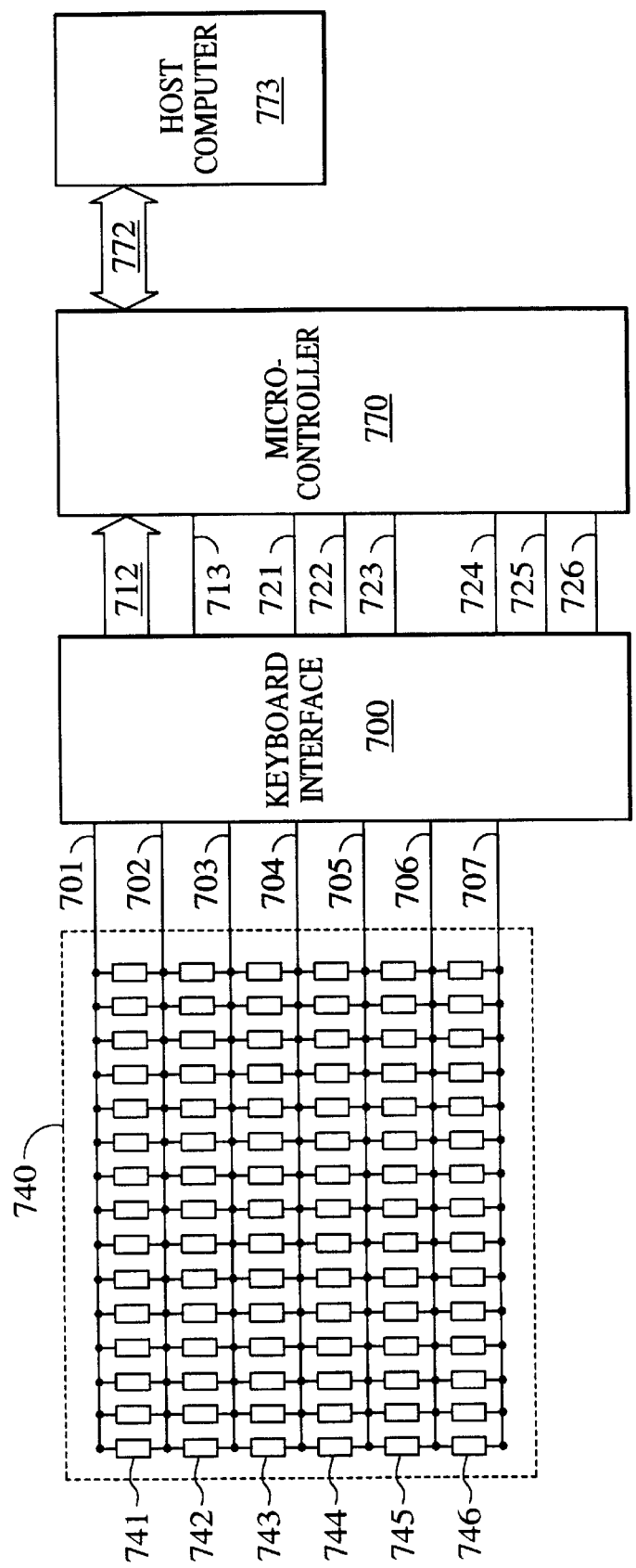
FIG. 44 is a schematic block diagram of a keyboard array coupled to a host computer through a keyboard interface and a microcontroller in accordance with the invention.

FIG. 44 shows one implementation of keyboard interface 700 with an array of keys 740 coupled through buses 701–707 to keyboard interface 700 which is coupled to a microcontroller 770 coupled to a host computer 773. The keyboard system of FIG. 44 is shown using the key encoder 720 of FIG. 42A for each of the keys. Array of keys 740 has six rows 741–746 of fifteen keys. All keys in a row are connected in parallel on a two-wire bus, with adjacent rows sharing a common bus. For example, rows 741 and 742 share bus 702. By not requiring column buses, the arrangement of buses 701–707 decreases the number of connections to keyboard interface 700 and prevents buses from crossing over one another. Microcontroller 770 scans array of keys 740, one row at a time, by sequentially addressing rows 741–746 using row address signals 721–726. In one embodiment, the row addresses for multiplexers 708, 709 differ by one such that adjacent buses are paired together (buses 701 and 702 for row 741, buses 702 and 703 for row 742, etc.).

Figure 45:
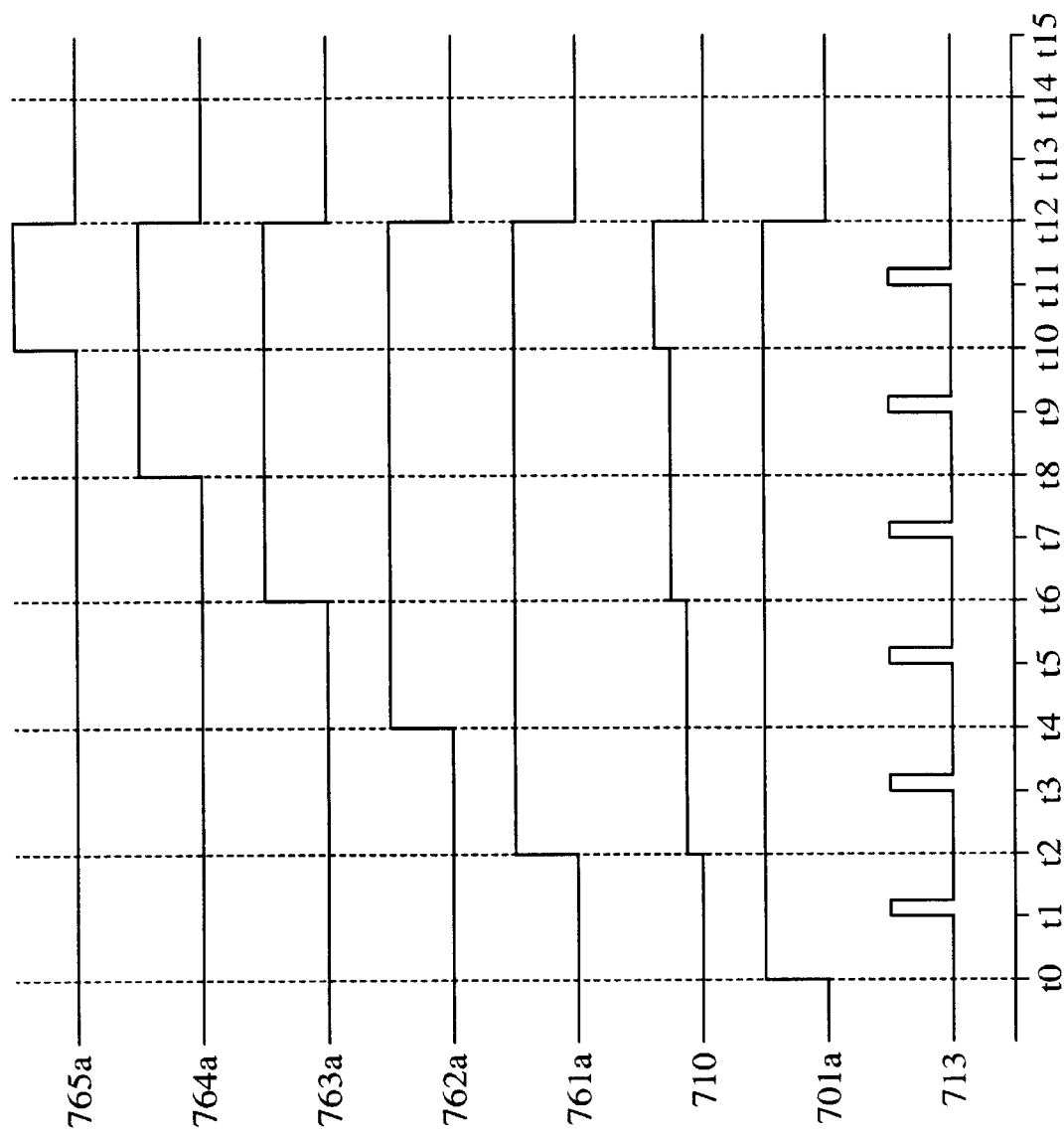
FIG. 45 is a timing diagram of key signals from a keyboard assembly in accordance with the invention.

To scan row 741, microcontroller 770 sets row address signals 721–723 to the binary equivalent of 1 and row address signals 724–726 to the binary equivalent of 2. This connects bus 701 to current sense signal 715 and bus 702 to ground. Microcontroller 770 then determines which key(s) is/are being pressed according to the relative timing of signals, an example of which is shown in FIG. 45 using the signals for keys 761–765.

Timer output signals 761a–765a for keys 761–765, respectively, go high sequentially at even time intervals. For example, timer output signal 761a goes high at t2 and timer output signal 762a goes high at t4. The relative bus current 710 drawn by bus 701 is shown with only keys 761, 763 and 765 pressed. A/D converter 711 samples relative bus current 710 when triggered by A/D sample clock signal 713 at odd time intervals. Starting with the sample taken at t3, microcontroller 770 compares each sample with the previous sample to determine if a key has been pressed. In the example shown in FIG. 45, microcontroller 770 will determine that key 761 is pressed because a current increase occurred between the samples taken at t1 and t3, and timer output signal 761a for key 761 is the only signal that goes high at t2 when its corresponding key is pressed. Microcontroller 770 will determine that key 762 is not pressed because a current increase did not occur between the samples taken at t3 and t5, and timer output signal 762a for key 762 goes high only at t4 when key 762 is pressed. Microcontroller 770 checks each key in a row in a similar manner until all keys in a row have been checked. Although the timer output signals for five keys are shown in FIG. 45, the present invention is not limited to any particular number of keys.

In another embodiment of the invention, microcontroller 770 verifies a scan by scanning a row a second time and comparing the results with the first scan. If the rescan does not match the first scan, the row is rescanned until two consecutive scans match. Once two consecutive scans match, the determination of pressed keys proceeds as described above. If microcontroller 770 finds any pressed keys, it uses a table look-up method to find the scan code(s) for the key(s) and sends the scan code(s) to a host computer 773 via bus 772. All of rows 741–746 are scanned similarly, row by row. The scanning process repeats indefinitely, causing the keyboard to be scanned continuously.

FIG. 46 shows a linear matrix coupled to a row 800 of keys according to another embodiment of a key identification system in accordance with the invention. Row 800 is separated electrically into four sections 801a–804a by the connections of the keys with section pathways 801–804. Section 801a consists of keys 801b–801e, which are coupled to section pathway 801 (which may be considered to be an electrical row in an electrical matrix). Section 802a consists of keys 802b–802e, which are coupled to section pathway 802 (which may be considered to be another electrical row in the electrical matrix). Section 803a consists of keys 803b–803e, which are coupled to section pathway 803. Section 804a consists of keys 804b–804e, which are coupled to section pathway 804. Thus, each section has its own electrical pathway and effectively each section is an electrical matrix of key switches having at least one electrical row and several electrical columns. Each section may be regarded as an electrical section of an electrical matrix. Each key in each section is also coupled to a key pathway, which is shared by corresponding keys in each section. For example, keys 801b, 802b, 803b, 804b are coupled to key pathway 805 (which may be considered a column) and keys 801c, 802c, 803c, 804c are coupled to key pathway 806 (which may be considered another column). Thus, row 800 of keys appears electrically as if it were arranged in a 4×4 matrix, but the matrix is confined to row 800 which is a mechanical row of keys (e.g. row VI of FIG. 1), thereby allowing row 800 to be independent of and electrically isolated from other rows. While FIG. 46 suggests that the keys are mechanically and physically adjacent to each other along a row, it will be appreciated that the electrical sections along a row may include, in any one electrical section, distantly spaced, non-contiguous keys along the row (or another row in the case where the row [section] lines extend to the another row). This is accomplished by wiring up the switches in each non-contiguous key to the desired row line. The linear matrix defined by section pathways 801–804 and key pathways 805–808 allows each key to be checked individually through the appropriate section and key pathways. In one embodiment, the section pathway for each section is provided by an electrode to which each key in the section is coupled, and the key pathways for each section are provided by a group of electrodes, each one of which is coupled to a key in the section. It should be noted that the sections can consist of any number of keys and are not limited to having equal numbers of keys. In an alternative embodiment, a row of keys could be separated into left and right electrical sections and each receives a wiring bus from its respective side.

In one exemplary embodiment of the invention, the section pathways and the key pathways are, at least in part, provided by flexible conductors which may be flexible wires on a flexible plastic substrate. These flexible conductors may be positioned on the key bases and under the key tops as shown in FIGS. 30A through 30C. The flexible conductors allow the keyboard to be expanded and collapsed as shown in FIGS. 30A through 30C without requiring, on one row, as many conductors as is normally required for a conventional keyboard electrical matrix (e.g. for a mechanical row of 16 keys, a conventional keyboard electrical matrix requires 17 conductors [16 column wires and 1 row wire], while the keyboard electrical matrix requires only 8 conductors). Furthermore, flexible conductors electrically arranged in a matrix as in FIG. 46 allow a row to be isolated electrically from other rows so that no "column" wires are required to interconnect between the rows. That is, all the wires for a row can run along the row and no wires (e.g. no column wires) need to run between rows in the collapsible portion of the keyboard assembly, thereby making mechanical expansion and contraction easier to implement. This isolation between rows requires a separate set of column conductors for each row but this extra set is balanced by the improved mechanical handling of the collapsible keyboard.

The flexible conductors may consist of one or more layers of flexible material. For example, a single-layer conductor may have circuits applied to one face of a flexible material. It may have a pattern of open contacts under each key. When a key is pressed, an electrically conductive puck attached to the key shorts the contacts, which completes a circuit.

In the preferred embodiment, a two-layer membrane is used. These membranes each have circuits of silk-screened silver applied to their opposing faces. The circuits are insulated by a coating such as lacquer except in the areas under each key, where they are separated by a raised deposit of material (for example, a pattern of non-conductive ink). When a key is pressed, the two layers meet and their contacts join to complete a circuit.

A three-layer membrane has an insulating layer of non-conductive material between two layers, which have circuits of silk-screened silver applied to their opposing faces. The insulating layer has a hole under each key, such that when a key is pressed, the two outer layers meet through the hole and their contacts join to complete a circuit.

Figure 47:
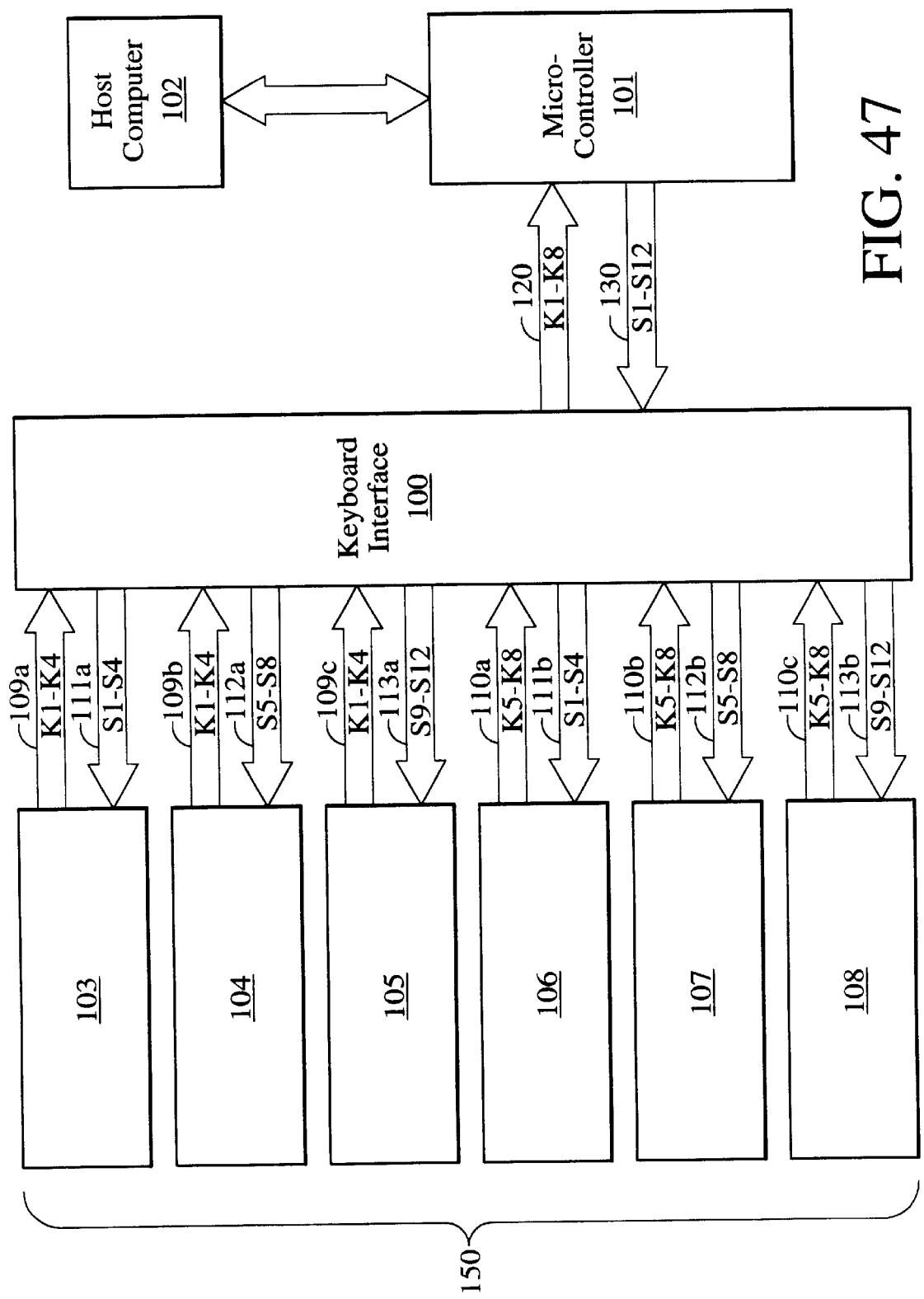
FIG. 47 is a schematic block diagram of a keyboard array coupled to a host computer through a keyboard interface and a microcontroller in accordance with the invention.

FIG. 47 is a block diagram of a keyboard array 150 with six rows 103–108 of keys, where rows 103–108 are configured similarly to row 800 of coupled to a keyboard interface 100 which is coupled to a microcontroller 101 which is coupled to a host computer 102 or other processing system. In one embodiment, keyboard interface 100 allows microcontroller 101 to access keyboard array 150 as if it were an 8×12 (key X section) matrix by logically connecting common section and key signals from rows 103–108. For example, rows 103–105 have common key signals 109a–109c, and rows 103 and 106 have common section signals 111a and 111b. In one embodiment, section signals 111a–113a and 111b–113b are each associated with four sections in a row, and key signals 109a–109c and 110a–110c are each associated with the four keys in each of the four sections. For example, section signal 111a is associated with section S1–S4, and key signal 109a is associated with keys K1–K4. All key signals and section signals communicate with microcontroller 101 via keyboard interface 100 and interface signals 120 and 130.

To begin scanning keyboard array 150, microcontroller 101 enters a mode of operation in which it activates all sections (S1–S12) through interface signal 130 to keyboard interface 100 and detects any response through interface signal 120 from keyboard interface 100 to determine if any keys are pressed. Microcontroller 101 remains in this mode and repeats the process periodically until it detects a pressed key.

Once a pressed key is detected, microcontroller 101 enters another mode of operation in which it scans keyboard array 150, one section at a time, by activating individually each section (S1–S12) through interface signal 130 to keyboard interface 100 and detecting any response through interface signal 120 from keyboard interface 100. In an alternative embodiment, one section in each of several rows may be activated concurrently to separately determine whether, in the appropriate section of each row, a key was pressed. Thus, several sections, each in an electrically separate row, may be activated concurrently. For each section, a response signal will be supplied by one or more keys depending on which keys in that section are pressed. Typically the sections are scanned in some order, such as a sequential order. If microcontroller 101 detects any response signal(s), it enters yet another mode of operation in which it uses a table look-up method to find the scan code(s) for the pressed key(s) and sends the scan code(s) to host computer 102. The entire scanning process repeats indefinitely, causing keyboard array 150 to be scanned continuously.

Figure 48A:
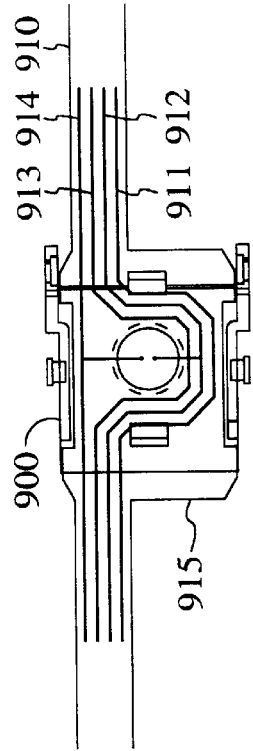
FIG. 48A is a planar top view of a flex circuit layer used in a keyboard assembly in accordance with the invention.
Figure 48B:
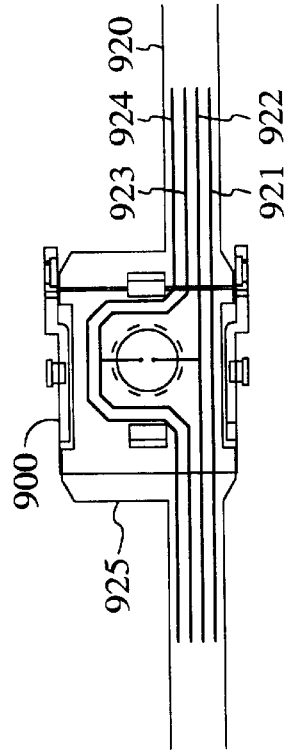
FIG. 48B is a planar top view of another flex circuit layer used in a keyboard assembly in accordance with the invention.
Figure 48C:
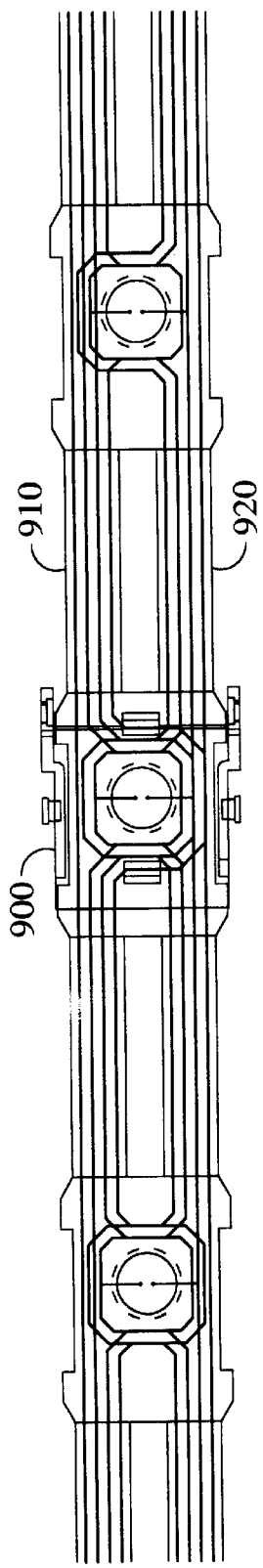
FIG. 48C is a planar top view of a flex circuit with two layers used in a keyboard assembly in accordance with the invention.
Figure 48D:
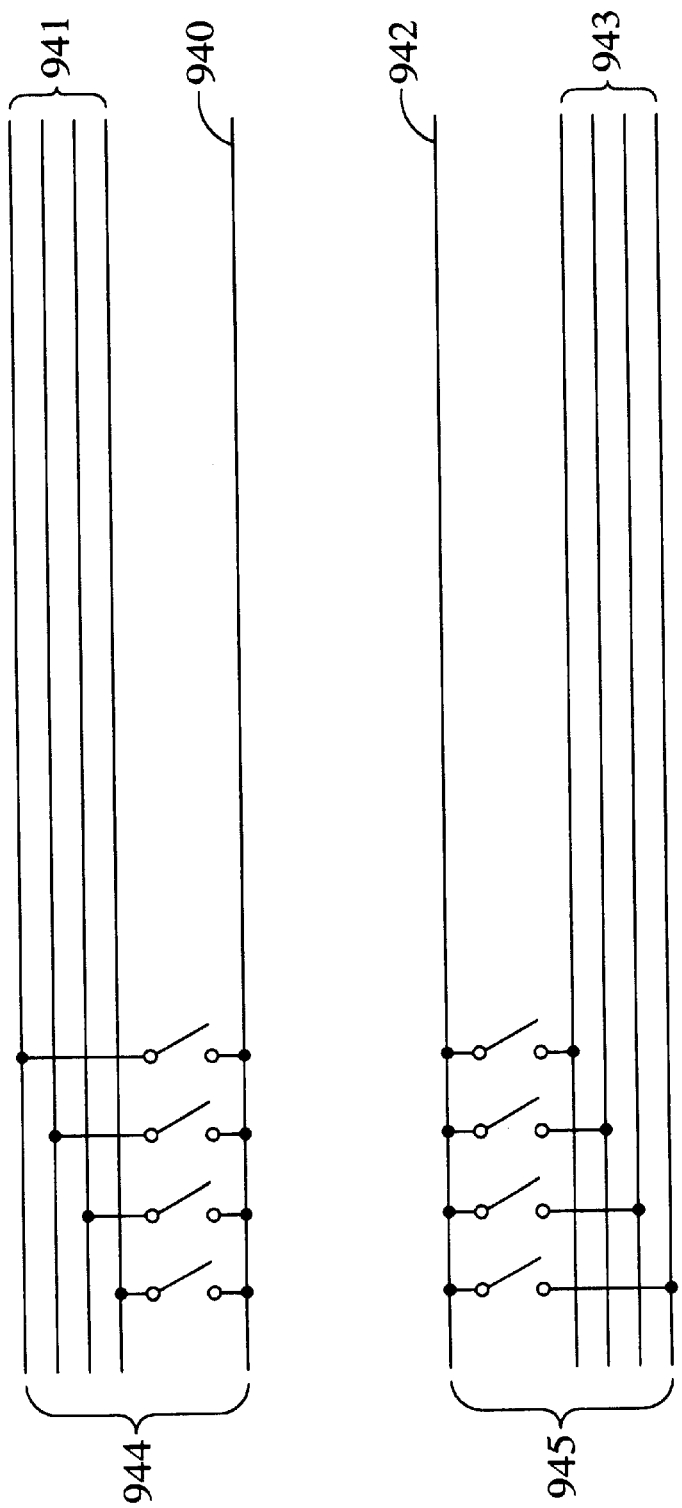
FIG. 48D is an example of another embodiment of an array of keys in accordance with the invention.
Figure 48E:
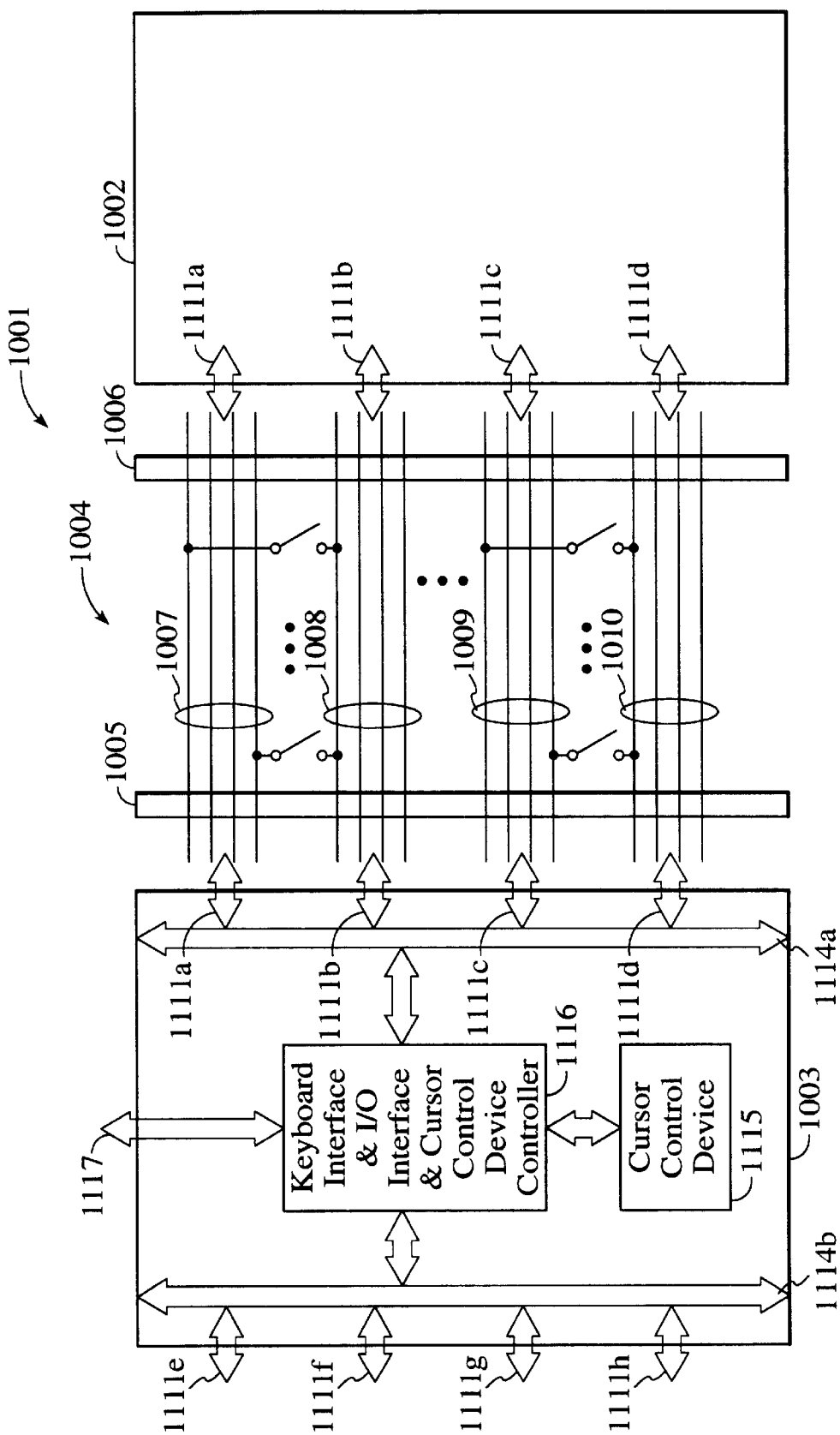
FIG. 48E is an example of a keyboard array which includes a cursor control device (e.g. a trackpad) that is selectively positionable on either side of the keyboard.

FIGS. 48A–48C show one embodiment of the key identification system shown in FIG. 46. Flexible lower layer 910 is disposed over a key base 900 such that contact region 915 of lower layer 910 rests on key base 900. Flexible upper layer 920 is disposed over lower layer 910 such that contact region 925 of upper layer 920 is located directly above contact region 915 of lower layer 910. In one embodiment, conductive traces 911–914 are section pathways and conductive traces 921–924 are key pathways, where the section and key pathways are similar to those described with reference to FIG. 46. Contact regions 915 and 925 are designed to selectively bring two conductors (one from traces 921–924 and one from traces 911–914) into electrical contact when the key top is pressed. In one embodiment, both ends of both lower layer 910 and upper layer 920 (at the end of each row) are connectable to a cursor control device and to keyboard interface circuitry thereby allowing the cursor control device to be positioned on either side of the keyboard; this is shown in FIG. 48E and is described further below. It should be noted that FIGS. 48A and 48B show lower layer 910 and upper layer 920 individually, respectively, to depict more clearly the features of lower layer 910 and upper layer 920.

In another embodiment of the invention, a keyboard assembly has multiple rows of keys where each row is coupled to a different conductive bus. Each row is also coupled to a different group of column electrodes, and each key in the row is coupled to one row electrode. In other words, each row has its own row conductor, and each key in each row has its own column conductor. FIG. 48D shows an example of such a system where a mechanical row 944 of keys has a row conductor 940 and several column conductors 941, and another mechanical row 945 of keys has an electrically separate row conductor 942 and several column conductors 943 (which may be electrically separate from column conductor 941).

Figure 49:
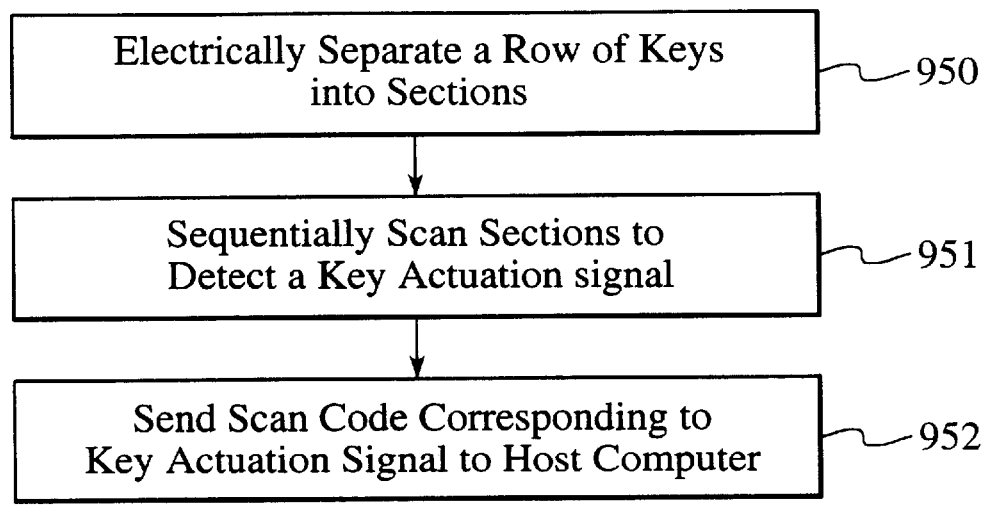
FIG. 49 is a flowchart of a method performed in accordance with the invention.

FIG. 49 shows an example of a method for detecting key actuation in accordance with the teachings of the present invention. In step 950, a row of keys is electrically separated into different sections (an example of this is shown in FIG. 46). In step 951, the different sections are scanned sequentially to detect a key actuation signal that corresponds to a pressed key. In step 952, a scan code corresponding to the key actuation signal is sent to a host computer.

Figure 50:
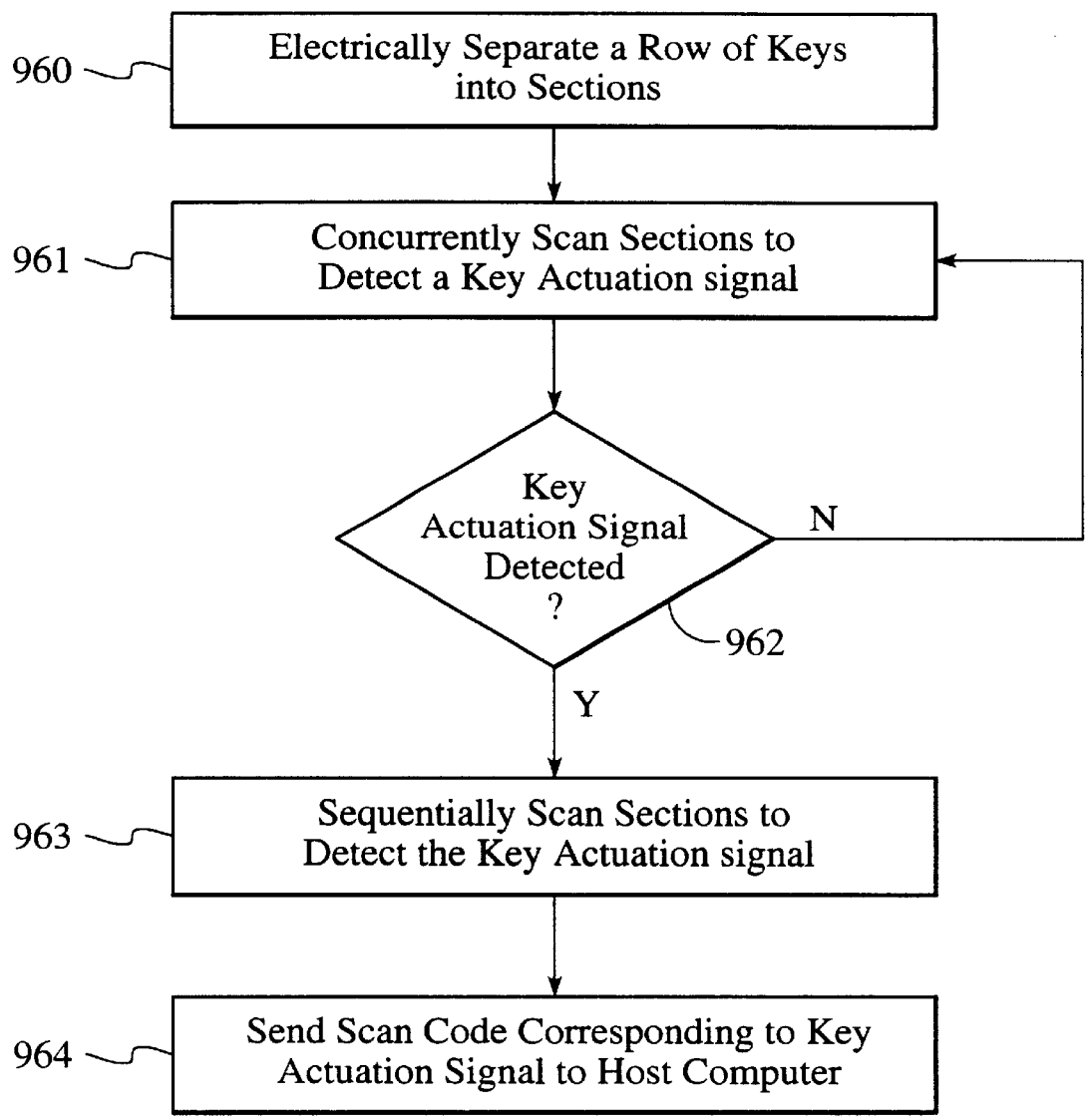
FIG. 50 is a flowchart of another method performed in accordance with the invention.

FIG. 50 shows another example of a method for detecting key actuation in accordance with the teachings of the present invention. This method is similar to the manner in which the keyboard array 150 of FIG. 47 is scanned. In step 960, a row of keys is electrically separated into different sections (for example, as in FIG. 46). In step 961, the sections are scanned concurrently to detect a key actuation signal. In step 962, if a key actuation signal is detected, then step 963 is performed. If a key actuation signal is not detected, then the step 961 is repeated. In step 963, the sections are scanned sequentially to further detect the key actuation signal. In step 964, a scan code corresponding to the key actuation signal is sent to a host computer.

Figure 51:
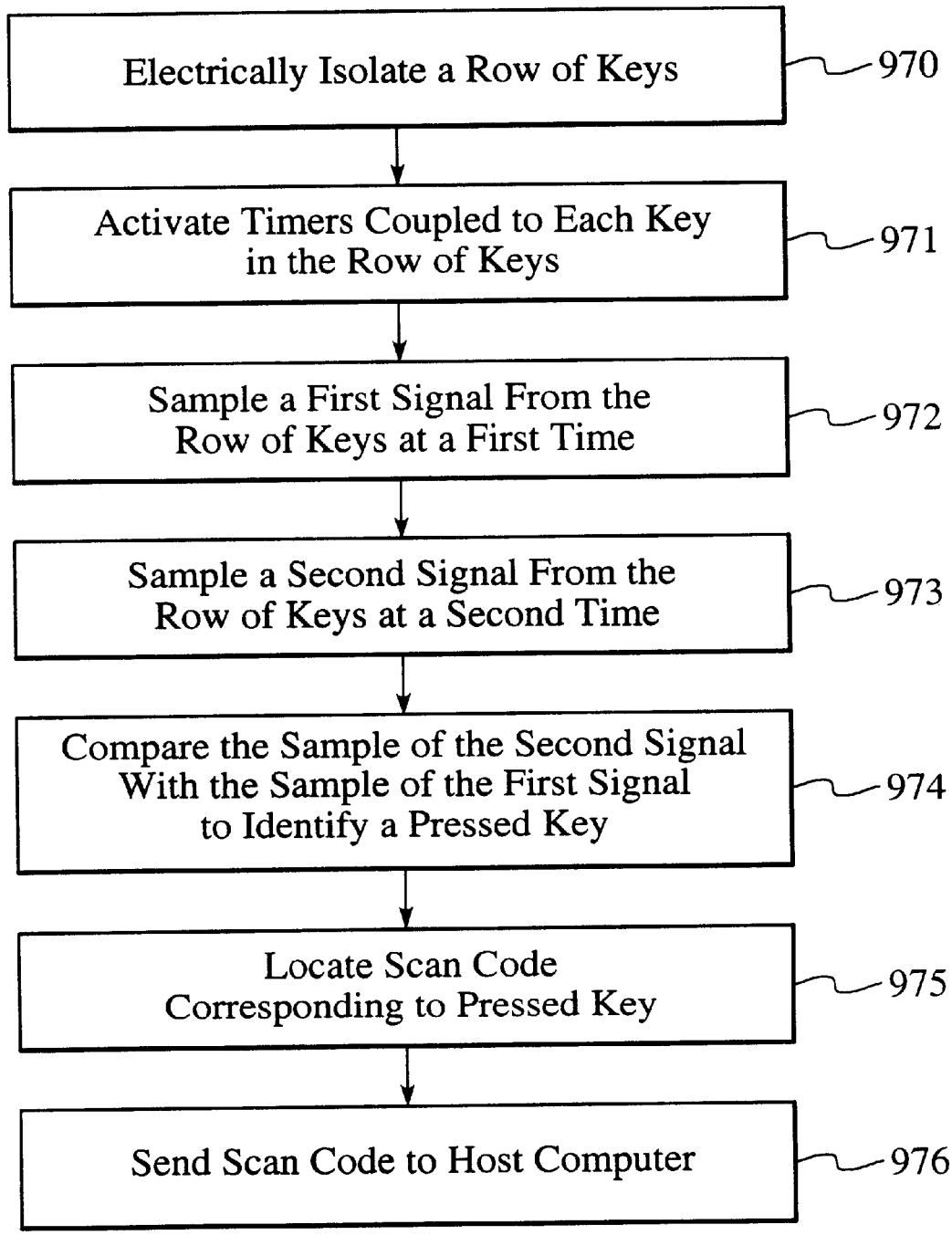
FIG. 51 is a flowchart of yet another method performed in accordance with the invention.

FIG. 51 shows yet another example of a method for detecting key actuation in accordance with the teachings of the present invention. In step 970, a row of keys is electrically isolated (for example, as in FIG. 46). In step 971, timers that are coupled to each key in the row are activated. In step 972, a first signal from the row of keys is sampled at a first time. Then in step 973, a second signal from the row of keys is sampled at a later time. In step 974, the sample of the second signal is compared with the sample of the first signal to identify any pressed keys. In step 975, scan code(s) corresponding to the pressed key(s) are located. In step 976, the scan code(s) is/are sent to a host computer. In another example, each key produces an identifying signal when its timer is in an active state and the key is pressed. In another example, the timers reach an active state at different times.

Figure 52:
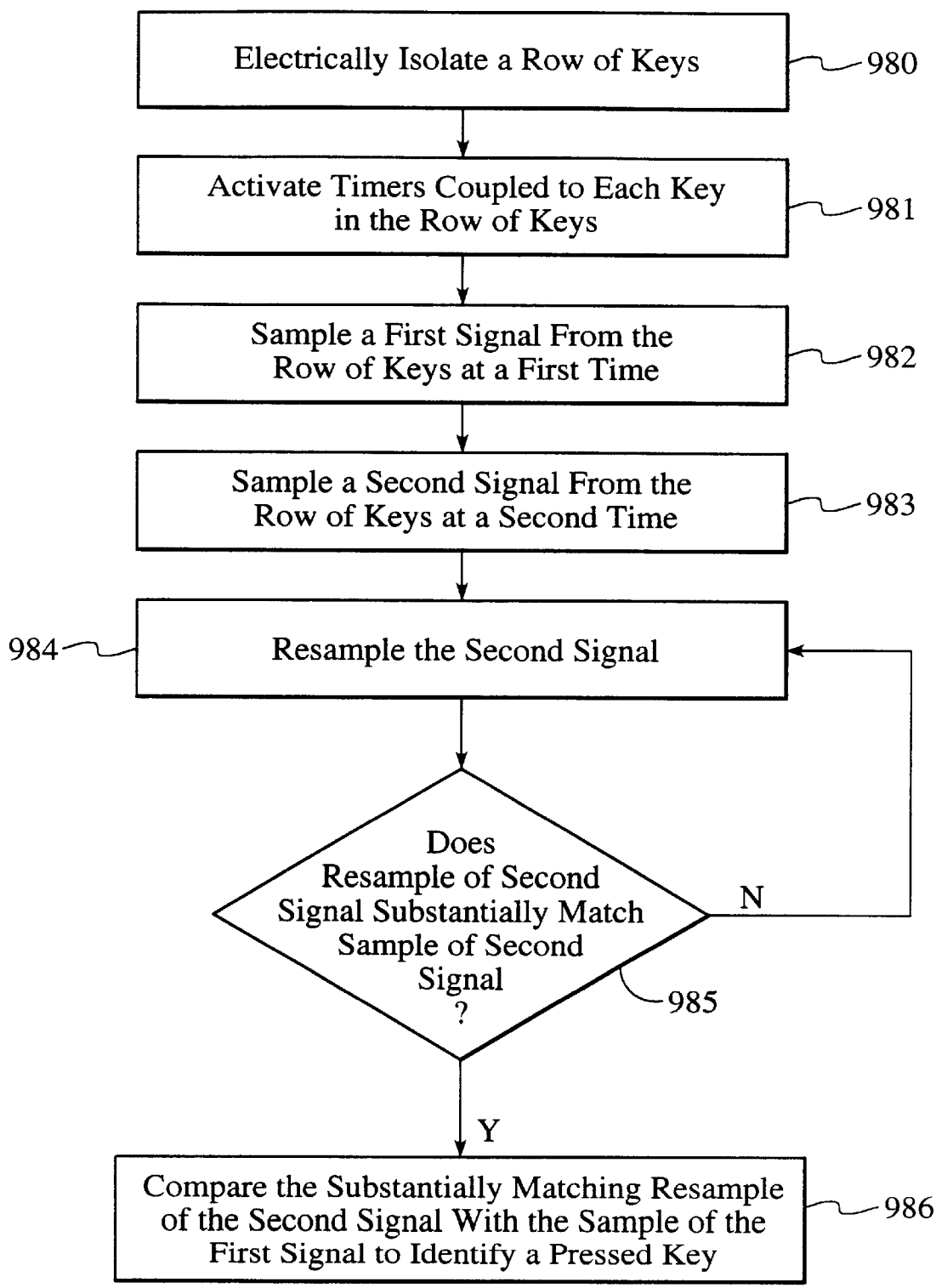
FIG. 52 is a flowchart of still another method performed in accordance with the invention.

FIG. 52 shows still another example of a method for detecting key actuation in accordance with the teachings of the present invention. In step 980, a row of keys is electrically isolated. In step 981, timers coupled to each key in the row are activated. In step 982, a first signal from the row of keys is sampled at a first time. In step 983, a second signal from the row of keys is sampled at a later time. In step 984, the second signal is resampled. In step 985, if the resample of the second signal substantially matches the first sample of the second signal, then step 986 is performed. If the resample and the first sample do not substantially match, then step 984 is performed again. In step 986, the resample of the second signal is compared with the sample of the first signal to identify any pressed keys.

In one embodiment of the invention, the surface of one of housing sides 1 and 2 may include a cursor control device such as a small trackball, a touch-sensitive trackpad, a joystick, a pressure-sensitive pointing device (e.g. IBM's TrackPoint III which is used on IBM's ThinkPad laptop computers), or other cursor control (e.g. pointing) devices. In addition, small buttons may be included on the surface of the housing; these small buttons may perform the same functions as the buttons (or button) on a mouse which is often used with a computer. In another embodiment, the cursor control device is selectively positionable on either one of housing sides 1 and 2.

FIG. 48B shows one example of an embodiment of the invention in which a cursor control device, such as a track pad, is selectively positionable on either side of a keyboard, such as a collapsible keyboard assembly according to the present invention. In this way, a user of such a keyboard may position the cursor control device on either the left side or the right side of the collapsible keyboard depending on the user's preference. In another embodiment, a cursor control device can be placed between the keys. For example, a pointing stick, such as IBM's TrackPoint (found on IBM's ThinkPad laptop computers) can be placed between the G, H, & B keys. The flexible conductors associated with adjacent rows of keys can conduct the electrical signals from the pointing stick to the keyboard controller. In addition, small button switches may be included on the surface of the first row of scissors linkages; these small switches may perform the same functions as the switches (or switch) on a mouse which is often used with a computer.

Figure 53:
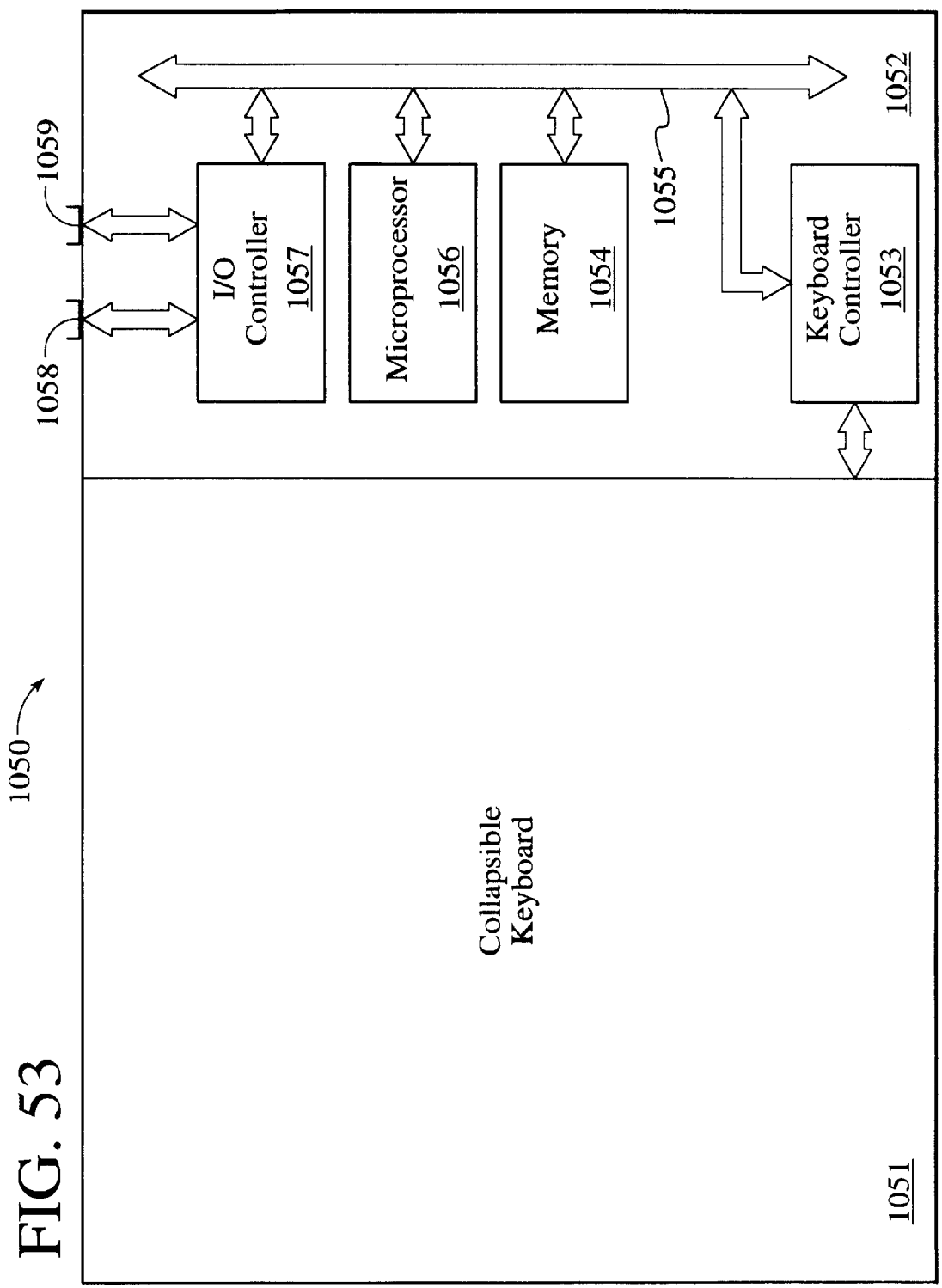
FIG. 53 is a diagram of a digital processing system, such as a personal digital assistant which is substantially contained in a collapsible keyboard assembly according to one embodiment of the invention.

In the example shown in FIG. 48E, a keyboard is assumed to communicate with a host computer or other host processing systems such as a personal digital assistant. However, the keyboard may include a complete computer system as shown in FIG. 53 and also provide the capability of selectively positioning the cursor control device on either side of the keyboard. The keyboard 1001 shown in FIG. 48E includes a key assembly 1004 having end plates 1005 and 1006. Two rows of keys are shown, but it will be understood that fewer or more rows of keys may exist. Each row of keys includes section lines and key lines, such as section lines 1007 or 1009 and key lines 1008 or 1010. The keyboard 1001 may be implemented as a collapsible keyboard by using scissors linkages or by allowing the keyboard to fold (e.g. fold in halves or thirds at hinged joints which separate foldable sections of the keyboard). It will be understood that section lines 1007 are similar to section lines 801–804 of FIG. 46 and that key lines are similar to the key lines 805–808 of FIG. 46. Each of these groups of lines includes a connector which may be mounted to the end plates and which allows the lines to couple to module 1003 which includes the cursor control device 1115. These connectors, shown as connectors 1111a, 1111b, 1111c, and 1111d are located on either side of the assembly of the keys 1004, thereby allowing the module 1003 to be coupled to either side of the assembly of keys. As shown in FIG. 48E, the module 1003 is coupled to the left side of the assembly while the module 1002 is coupled to the right side. This may be reversed by disconnecting module 1002 from the right side and disconnecting the module 1003 from the connectors on the left side and coupling it through module 1003's connectors 1111e, 1111f, 1111g, and 1111h to the corresponding connectors 1111a, 1111b, 1111c, and 1111d on the right side of the key assembly. The module 1003 includes a cursor control device 1115 which is coupled to a keyboard interface and I/O interface 1116 which also provides a cursor control device controller. This component 1116 provides conventional cursor control interface as well as I/O (input/output) interface functionality and keyboard interface functionality. For example, component 1116 may provide the functionality of the keyboard interface 100 and the microcontroller 101 shown in FIG. 47 in addition to providing the functionality of controlling the cursor control device. In addition, component 1116 provides the I/O interface to a host computer through the connection 1117. In an alternative embodiment, the connection may be a port located in the middle of the rear of the collapsible keyboard; this port is mechanically like another key except that space around the port may exist because there are no adjoining keys next to the port and thus, a keyboard may still collapse without impinging on the port. Component 1116 is coupled to the connection ports on the left side of module 1003 by bus 1114b, and it is coupled to the connection ports on the right side of the module 1003 by the bus 1114a. It will be appreciated that module 1002 may be empty or may contain electronic components which are appropriate for the device. For example, the module 1002 may include a small liquid crystal display or a storage device or both, and these components and module 1002 may be coupled through a flexible conductor bus to module 1003. In one embodiment of the invention, a complete personal digital assistant may be assembled into the collapsible keyboard by using the space within the modules 1003 and 1002. An example of such a system will now be described in conjunction with FIG. 53.

FIG. 53 shows an example of a collapsible keyboard system 1050 with a collapsible keyboard assembly 1051 and a processor module 1052. The processor module may be housed in the housing 1 or the housing 2 shown in FIG. 1 or may be housed in both housings with flexible conductors providing signals between the two housings as necessary. Module 1052 includes a keyboard controller 1053, memory 1054, a system bus 1055, a microprocessor 1056, and an input/output controller 1057. The module also includes two input/output ports 1058 and 1059. The keyboard controller 1053, the memory 1054, the microprocessor 1056, and the I/O controller 1057 are interconnected by the system bus 1055. The keyboard controller 1053 may be a controller which provides the functionality of the keyboard interface 100 and the microcontroller 101 of FIG. 47 or it may be other types of keyboard interfaces and/or microcontrollers which can provide scan codes to the system bus 1055 for use by the microprocessor 1056 and/or storage into memory 1054. The memory 1054 may be DRAM or flash memory or other types of storage devices. Furthermore it may include mass storage such as a magnetic hard disk or other types of mass storage to the extent it is possible to include such memory in a small space. The microprocessor 1056 may be any conventional microprocessor or microcontroller although it is preferable that it is a general purpose microprocessor which is controlled under control of computer program instructions which are stored in memory 1054. Alternatively, the microprocessor 1056 may be a microcontroller which, on a single semiconductor substrate, includes the memory which stores the computer program which is executed by the microcontroller. The I/O controller 1057 may be a conventional input/output controller which can perform direct memory access to the memory 1054 and which also can communicate data to and from the microprocessor 1056. The I/O controller 1057 provides input and output control for the two ports 1058 and 1059. In one example of the present invention, the input/output port 1058 may be a universal serial bus (USB) port or an infrared port or a serial port (such as an RS-232 port) or a conventional parallel port. The other input/output port may be a Firewire port, which may be considered to be a port which substantially complies with the IEEE standard known as 1394. This Firewire port may provide output to a display device such as a miniature head-mounted display which can project to a viewer's eye an image of a display. Alternatively, this port 1059 may be coupled to a standard computer monitor rather than a miniature head-mounted display. It will be appreciated that in one embodiment, no display is included into the collapsible keyboard system 1050, but rather, data for the display is separately provided through the port 1059 as described herein. Another example of a port may be a port which complies with the PCMCIA standard, such as the conventional PC Card or PC Card bus ports found on modern laptop computers.

In one example of the present invention, the input/output port may be a universal serial bus (USB) port or a serial port (such as an RS-232 port) or a "PS/2" port or an infrared port or a radio frequency port or a parallel port or a Firewire port, which may be considered to be a port which substantially complies with the IEEE standard known as 1394 or several ports providing a combination of these ports.

In another example of the present invention, a "docking station" may be provided to accommodate various devices such as Palm Computing's "PalmPilot." In this example, the docking station consists of a mechanical/electrical connector which allows the PalmPilot to mount to the rear of the keyboard and communicate with the keyboard through the PalmPilot's serial interface. In this manner, the user can comfortably enter data with the keyboard while viewing the PalmPilot's display. The keyboard may also include an additional port for a wired or wireless modem. With this configuration, the keyboard and PalmPilot could be used for sending and receiving e-mail or various Internet applications. Wireless phones and other information appliances may be docked in a similar manner. Additional flexible conductors associated with the last rows of keys can conduct the electrical signals from the docked device to the keyboard controller.

An alternative embodiment of a keyboard assembly of the present invention uses alphanumeric keys which use only two different key assemblies for a collapsible keyboard. In one embodiment of the present invention, the scissors linkage structure has pivot points which are designed to reach a pitch of approximately 19 millimeters from each other when the structure is fully expanded. The key switch assemblies attach to these pivot points, and common pivot points are shared between adjacent rows on the collapsible keyboard. However, standard keyboard layouts typically require that the keys in one row be offset from keys in the next row by a fixed dimension. In one example the offset between these rows is approximately one-quarter of a key width.

It is possible to satisfy this offset between the rows while using only two key assemblies which are designated as key assembly A and key assembly B. The relative center key position difference between key A and key B is one-quarter of a key width. Therefore, if key A assemblies were placed in one row and key B assemblies were placed in an adjacent row, the two rows would be offset each other by one-quarter of a key width. Since in one design the collapsing keyboard requires some rows to fold left and others to fold right, this is taken into account when positioning the key center of key A and key B relative to the pivot point of the scissors linkage structure. The result of this is that the key A center is ⅜ of a key width from the pivot point and key B is ⅛ of a key width from a pivot point. The combination of ¼ key offset and ⅛ to ⅜ pivot offsets creates additional combinations of offsets. Further, increments of ¼ key offsets can be combined to give ½ key offsets in various folding directions.

The foregoing description provides examples of different embodiments of the invention. Other implementations will be appreciated by those skilled in the art. For example, rather than using scissors linkages, a support element for the keys may be a telescoping set of elements which slide along each other to expand and collapse. Each key may be pivotally coupled to two such elements and rotate upon expanding or collapsing. The keys in one embodiment may use thin membrane switches without butterfly linkages or springs, and thus the key top and key base may be used to cause two conductive to come into electrical contact. Further, these membrane switches may fold rather than pivot. A membrane switch may be coupled to a telescoping or scissors linkage support member at two points and may fold as a cloth seat of a director's chair folds when this chair is collapsed. A flexible conductor assembly may be disposed on a surface of the membrane switch and may fold with the membrane switch. In certain embodiments, a keyboard assembly of the invention may include certain ergonomic features, such as a split keyboard or a palmrest which may be attached and detached from the keyboard assembly.

In other embodiments of the invention, the relative functions of the rows and columns may be reversed. For example, the columns, rather than the rows, may fold/collapse to achieve a keyboard which can decrease in depth but not width. This may be implemented by providing columns of scissors linkages rather than rows of scissors linkages. In a related way, the columns of keys may be electrically isolated in a similar fashion as the rows are electrically isolated (as in, for example, FIGS. 46 and 48D), and each column may include several electrical sections of an electrical matrix which is separate and distinct from another electrical matrix formed in another column. Other modifications and implementations will be appreciated from this disclosure.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A keyboard assembly for entering data, said keyboard assembly comprising:
   a first conductive member;
   a second conductive member; and
   a first plurality of keys electrically coupled to said first conductive member and to said second conductive member, each of said keys comprising an individual electrical identifier and a switch which provides a signal through at least one of said first conductive member and said second conductive member which identifies said each of said keys.

2. A keyboard assembly as in claim 1 wherein said first plurality of keys are electrically coupled in parallel between said first conductive member which is flexible and said second conductive member which is flexible.

3. A keyboard assembly as in claim 1 wherein said each of said keys further comprises a biasing element coupled to said electrical identifier to electrically bias said electrical identifier.

4. A keyboard assembly as in claim 3 wherein said biasing element comprises a diode.

5. A keyboard assembly as in claim 1 wherein said first conductive member and said second conductive member are mechanically coupled to said first plurality of keys to support said first plurality of keys.

6. A keyboard assembly as in claim 5 further comprising:
   a third conductive member; and
   a second plurality of keys electrically coupled to said third conductive member and said second conductive member, each of said keys of said second plurality of keys comprising another electrical identifier and another switch which provide another signal through at least one of said second conductive member and said third conductive member which identifies said each key of said second plurality of keys.

7. A keyboard assembly as in claim 6 wherein said first plurality of keys form a first row of keys and said second plurality of keys form a second row of keys, and wherein said first row of keys and said second row of keys are electrically sensed separately and sequentially.

8. A keyboard assembly as in claim 5 further comprising:
   a third conductive member;
   a fourth conductive member; and
   a second plurality of keys electrically coupled to said third and said fourth conductive members, each of said keys of said second plurality of keys comprising another electrical identifier and another switch which provide another signal through at least one of said third and said fourth conductive members.

9. A keyboard assembly as in claim 8 wherein said first plurality of keys form a first row of keys and said second plurality of keys form a second row of keys which is adjacent to said first row of keys.

10. A keyboard assembly as in claim 5 further comprising a housing which is coupled to said first conductive member and said second conductive member, and wherein said housing is part of a portable computer.

11. A keyboard assembly as in claim 10 wherein said keyboard assembly is not collapsible.

12. A keyboard assembly as in claim 5 wherein said electrical identifier comprises a resistor.

13. A keyboard assembly for entering data, said keyboard assembly comprising:
   a first conductive member;
   a second conductive member; and
   a first plurality of keys electrically each coupled in parallel between said first conductive member and said second conductive member, an actuated key of said first plurality of keys causing a signal which identifies said actuated key to be conducted through at least one of said first conductive member and said second conductive member.

14. A keyboard assembly as in claim 13 wherein each key of said first plurality of keys comprises an electrical identifier which provides said signal.

15. A keyboard assembly as in claim 14 wherein each key of said first plurality of keys comprises an electrical switch coupled to said electrical identifier.

16. A keyboard assembly as in claim 15 wherein an electrical state of said electrical switch causes said signal to be conducted through said at least one of said first conductive member and said second conductive member.

17. A keyboard assembly as in claim 16 wherein said first conductive member and said second conductive member are mechanically coupled to said first plurality of keys to support said first plurality of keys.

18. A keyboard assembly as in claim 17 further comprising:
   a third conductive member; and
   a second plurality of keys electrically coupled to said third conductive member and said second conductive member, each of said keys of said second plurality of keys comprising another electrical identifier and another switch which provide another signal through at least one of said second conductive member and said third conductive member which identifies said each key of said second plurality of keys.

19. A keyboard assembly as in claim 18 wherein said first plurality of keys form a first row of keys and said second plurality of keys form a second row of keys, and wherein said first row of keys and said second row of keys are electrically sensed separately and sequentially.

20. A keyboard assembly as in claim 17 further comprising:
   a third conductive member;
   a fourth conductive member; and
   a second plurality of keys electrically coupled to said third and said fourth conductive members, each of said keys of said second plurality of keys comprising another electrical identifier and another switch which provide another signal through at least one of said third and said fourth conductive members.

21. A keyboard assembly as in claim 20 wherein said first plurality of keys form a first row of keys and said second plurality of keys form a second row of keys which is adjacent to said first row of keys.

22. A keyboard assembly as in claim 17 further comprising a housing which is coupled to said first conductive member and said second conductive member, and wherein said housing is part of a portable computer and said keyboard assembly is not collapsible.

23. A keyboard assembly for entering data, said keyboard assembly comprising:
   a first row of keys disposed mechanically along at least a first support member;
   a first section of an electrical matrix coupled to a first portion of keys of the first row of keys; and
   a second section of said electrical matrix coupled to a second portion of keys of the said first row of keys;
   said first section and said second section being separately addressable electrically and each section having at least two keys.

24. A keyboard assembly as in claim 23 wherein said first section of an electrical matrix comprises a first electrode coupled to each key of said first portion of said first row of keys and a first plurality of electrodes, each electrode of said first plurality of electrodes coupled to one key of said first portion of said first row of keys, and further wherein said second section of an electrical matrix comprises a second electrode coupled to each key of said second portion of said first row of keys and a second plurality of electrodes, each electrode of said second plurality of electrodes coupled to one key of said second portion of said first row of keys.

25. A keyboard assembly as in claim 23 further comprising:
   a second row of keys disposed mechanically along at least a second support member, said second row of keys being electrically isolated from said first row of keys;
   a third section of another electrical matrix coupled to a first portion of said second row of keys; and
   a fourth section of said another electrical matrix coupled to a second portion of said second row of keys.

26. A keyboard assembly as in claim 23 further comprising a signal detector coupled to said first section of an electrical matrix and said second section of said electrical matrix, said signal detector being configured to scan sequentially said first section and said second section of said electrical matrix.

27. A keyboard assembly as in claim 23 wherein said first section and said second section of said electrical matrix are provided by a first conductive layer and a second conductive layer and wherein said electrical matrix comprises at least two row conductors and at least two column conductors.

28. A keyboard assembly as in claim 27 wherein each key of said first row of keys comprises a key base and a key top, said first and second conductive layers having portions disposed between said key base and said key top, said each key being configured to hold said first and second conductive layers against an edge of said key base.

29. A keyboard assembly as in claim 27 wherein each of said first and second conductive layers has a first end and a second end, each of said first and second ends being couplable to a cursor control device.

30. A keyboard assembly as in claim 27 wherein said first and second conductive layers are flexible and wherein said first plurality of electrodes and said second plurality of electrodes are the same.

* * * * *